US008829528B2

(12) United States Patent
Yamazaki et al.

(10) Patent No.: US 8,829,528 B2
(45) Date of Patent: Sep. 9, 2014

(54) SEMICONDUCTOR DEVICE INCLUDING GROOVE PORTION EXTENDING BEYOND PIXEL ELECTRODE

(71) Applicant: Semiconductor Energy Laboratory Co., Ltd., Atsugi (JP)

(72) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/683,270

(22) Filed: Nov. 21, 2012

(65) Prior Publication Data

US 2013/0134414 A1    May 30, 2013

(30) Foreign Application Priority Data

Nov. 25, 2011 (JP) .................................. 2011-258076
Nov. 25, 2011 (JP) .................................. 2011-258079

(51) Int. Cl.
| | |
|---|---|
| H01L 29/04 | (2006.01) |
| H01L 29/15 | (2006.01) |
| H01L 31/036 | (2006.01) |
| H01L 29/10 | (2006.01) |
| H01L 31/0376 | (2006.01) |
| H01L 31/20 | (2006.01) |
| H01L 29/66 | (2006.01) |
| H01L 27/12 | (2006.01) |
| H01L 29/786 | (2006.01) |

(52) U.S. Cl.
CPC ...... *H01L 29/7869* (2013.01); *H01L 29/66969* (2013.01); *H01L 27/1225* (2013.01)
USPC .. 257/72; 257/59; 257/E31.097; 257/E31.126

(58) Field of Classification Search
CPC .............. H01L 27/124; H01L 27/1244; H01L 27/3262; H01L 29/4908
USPC ........................ 257/59, 72, E31.097, E31.126
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Ida M Soward
(74) *Attorney, Agent, or Firm* — Fish & Richardson P.C.

(57) ABSTRACT

A step for forming an island-shaped semiconductor layer of a semiconductor device used in a display device is omitted in order to manufacture the semiconductor device with high productivity and low cost. The semiconductor device is manufactured through four photolithography processes: four steps for forming a gate electrode, for forming a source electrode and a drain electrode, for forming a contact hole, and for forming a pixel electrode. In the step for forming the contact hole, a groove portion in which a semiconductor layer is removed is formed, whereby formation of a parasitic transistor is prevented. An oxide semiconductor is used as a material of the semiconductor layer in which a channel is formed, and an oxide semiconductor having a higher insulating property than the semiconductor layer is provided over the semiconductor layer.

14 Claims, 22 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,495,252 B2 | 2/2009 | Ahn et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,919,396 B2 | 4/2011 | Ahn et al. |
| 7,994,500 B2 | 8/2011 | Kim et al. |
| 8,067,775 B2 | 11/2011 | Miyairi |
| 8,148,779 B2 | 4/2012 | Jeong et al. |
| 8,188,480 B2 | 5/2012 | Itai |
| 8,203,143 B2 | 6/2012 | Imai |
| 8,377,762 B2 * | 2/2013 | Eguchi et al. ................ 438/155 |
| 8,378,344 B2 * | 2/2013 | Sakakura et al. ............... 257/43 |
| 8,492,757 B2 * | 7/2013 | Sakata et al. .................... 257/43 |
| 8,502,216 B2 * | 8/2013 | Akimoto et al. ................ 257/43 |
| 8,513,054 B2 * | 8/2013 | Sasaki et al. .................. 438/104 |
| 8,518,739 B2 * | 8/2013 | Miyairi et al. ................. 438/104 |
| 8,610,120 B2 * | 12/2013 | Miyake et al. .................. 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0115983 A1 * | 6/2006 | Fujii et al. ..................... 438/640 |
| 2006/0145157 A1 | 7/2006 | Choi et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0099217 A1 * | 4/2010 | Isa et al. ....................... 438/104 |
| 2010/0105163 A1 | 4/2010 | Ito et al. |
| 2010/0109002 A1 | 5/2010 | Itagaki et al. |
| 2010/0163865 A1 * | 7/2010 | Arai ............................... 257/43 |
| 2010/0219410 A1 * | 9/2010 | Godo et al. ..................... 257/43 |
| 2010/0301329 A1 * | 12/2010 | Asano et al. .................... 257/43 |
| 2011/0084265 A1 * | 4/2011 | Arasawa et al. ................ 257/43 |
| 2011/0193083 A1 | 8/2011 | Kim et al. |
| 2012/0001953 A1 * | 1/2012 | Hirakata et al. ............... 345/690 |
| 2012/0052606 A1 | 3/2012 | Yamazaki |
| 2012/0052625 A1 | 3/2012 | Yamazaki |
| 2012/0056861 A1 * | 3/2012 | Kurokawa et al. ............ 345/207 |
| 2012/0061664 A1 | 3/2012 | Yamazaki et al. |
| 2012/0061665 A1 | 3/2012 | Miyake et al. |
| 2012/0061673 A1 * | 3/2012 | Yamazaki et al. ............... 257/59 |
| 2012/0062813 A1 * | 3/2012 | Koyama ......................... 349/43 |
| 2012/0062814 A1 | 3/2012 | Yamazaki et al. |
| 2012/0064650 A1 | 3/2012 | Yamazaki et al. |
| 2012/0083078 A1 * | 4/2012 | Toriumi et al. ................ 438/158 |
| 2012/0286267 A1 * | 11/2012 | Suzawa et al. .................. 257/43 |
| 2013/0001545 A1 * | 1/2013 | Kuwabara et al. .............. 257/43 |
| 2013/0105793 A1 * | 5/2013 | Ito et al. ......................... 257/43 |
| 2013/0120701 A1 | 5/2013 | Yamazaki et al. |
| 2013/0120702 A1 | 5/2013 | Yamazaki et al. |
| 2013/0161609 A1 | 6/2013 | Koyama |
| 2013/0260509 A1 * | 10/2013 | Kimura ......................... 438/104 |
| 2014/0017834 A1 * | 1/2014 | Yamazaki et al. .............. 438/30 |
| 2014/0073086 A1 * | 3/2014 | HOSOBA et al. ............. 438/104 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |

(56) References Cited

FOREIGN PATENT DOCUMENTS

| JP | 2003-086000 | A | 3/2003 |
|---|---|---|---|
| JP | 2003-086808 | A | 3/2003 |
| JP | 2003-179069 | A | 6/2003 |
| JP | 2004-103957 | A | 4/2004 |
| JP | 2004-273614 | A | 9/2004 |
| JP | 2004-273732 | A | 9/2004 |
| JP | 2005-077822 | A | 3/2005 |
| WO | 2004/114391 | A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.
Osada, T et al., "Development of Driver-Integrated Panel Using Amorphous In-Ga-Zn-Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium-Gallium-Zinc Oxide TFTS and Their Application for Large Size AMOLED," AM-FPD '08 Digest of Technical Papers, Jul. 2, 2008, pp. 275-278.
Park, S et al., "Challenge to Future Displays: Transparent AM-OLED Driven by Peald Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Toshio Kamiya et al.; "Carrier Transport Properties and Electronic Structures of Amorphous Oxide Semiconductors: The present status"; Kotai Butsuri (Solid State Physics); 2009; pp. 621-633; vol. 44, No. 9 with full English translation.
Masaya Nakayama et al.; "17a-TL-8 Effect of GaO Layer on IGZO-TFT Channel"; Extended Abstracts (The 57th Spring Meeting 2010); The Japan Society of Applied Physics and Related Societies; Mar. 17, 2010; p. 21-008 with full English translation.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.
Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTS) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

(56) References Cited

OTHER PUBLICATIONS

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

\* cited by examiner

FIG. 7A1
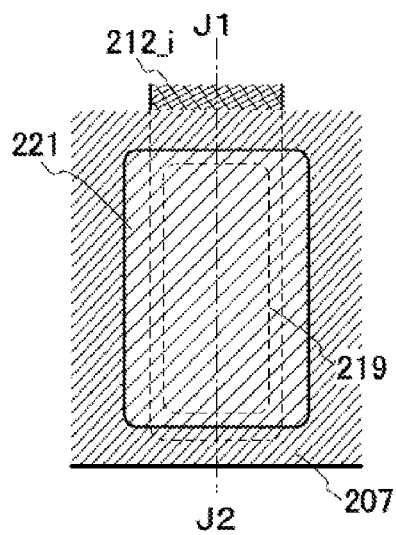
FIG. 7A2
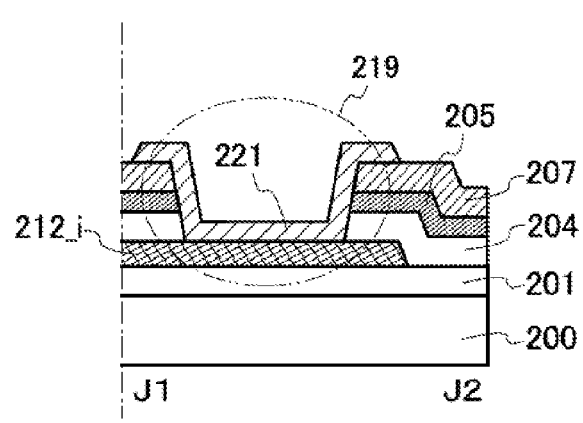
FIG. 7B1
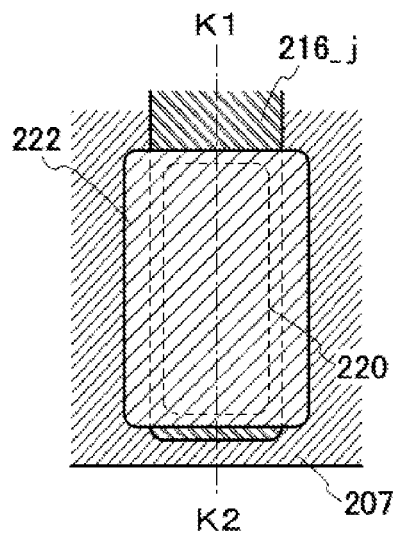
FIG. 7B2
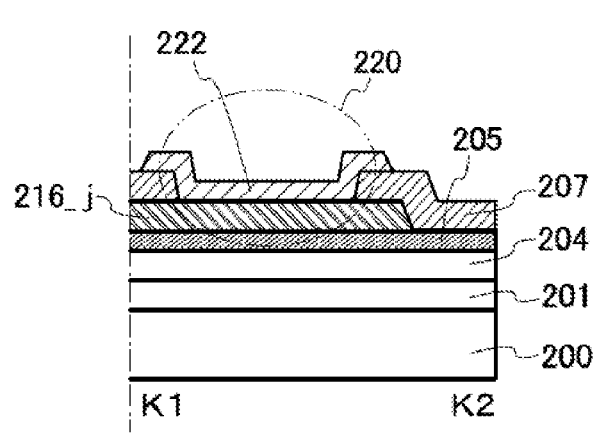

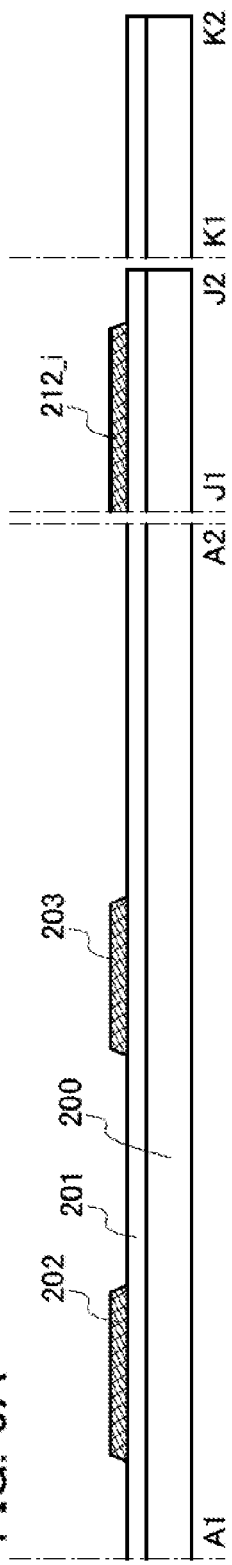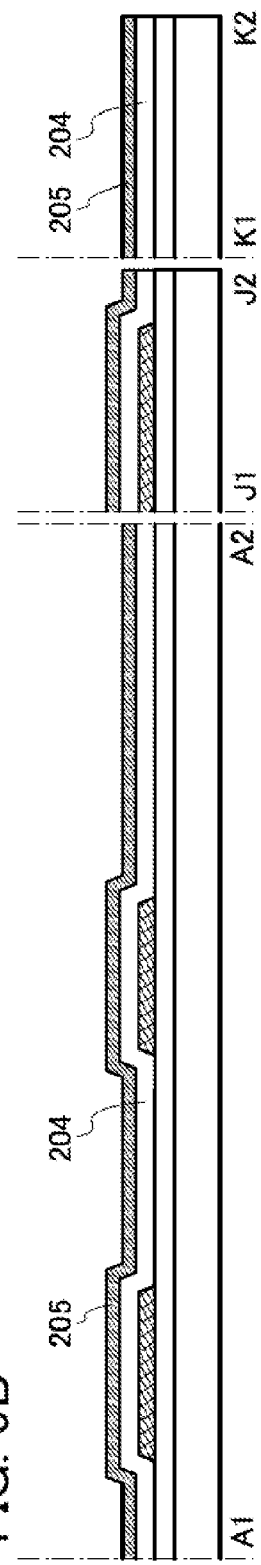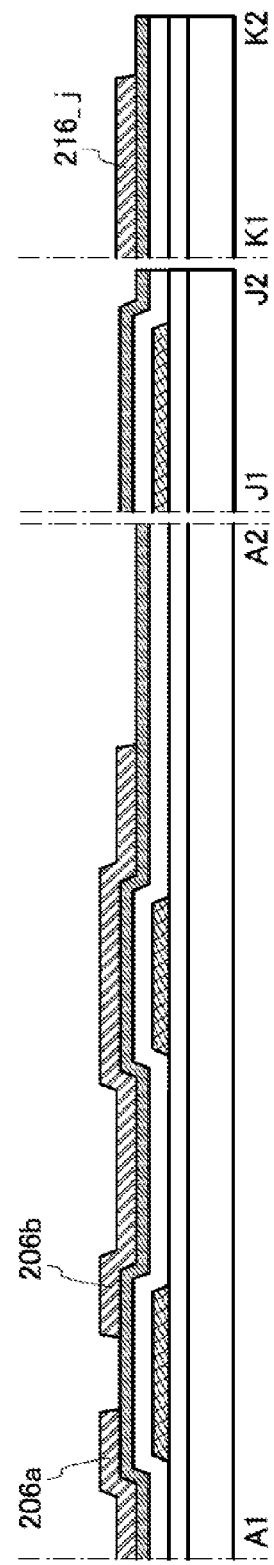

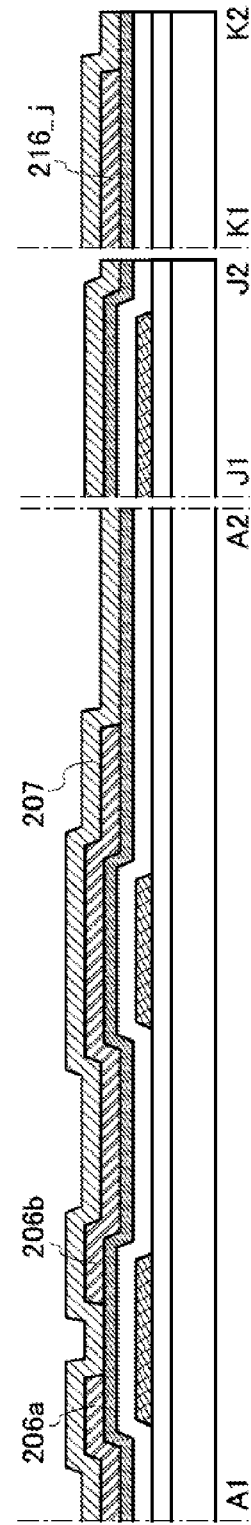
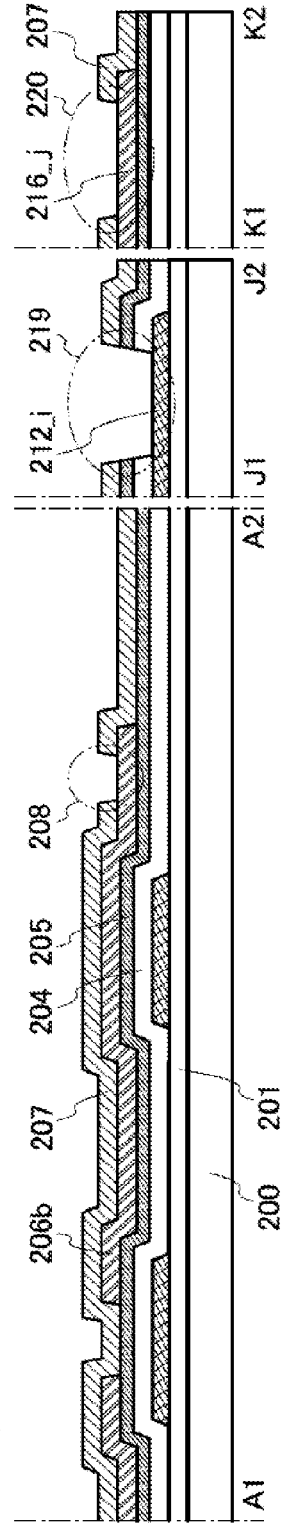
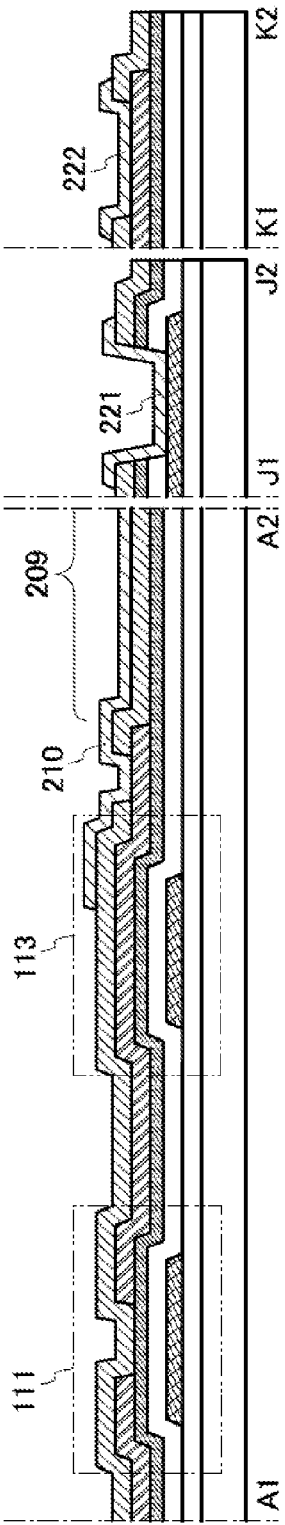
FIG. 10A
FIG. 10B
FIG. 10C

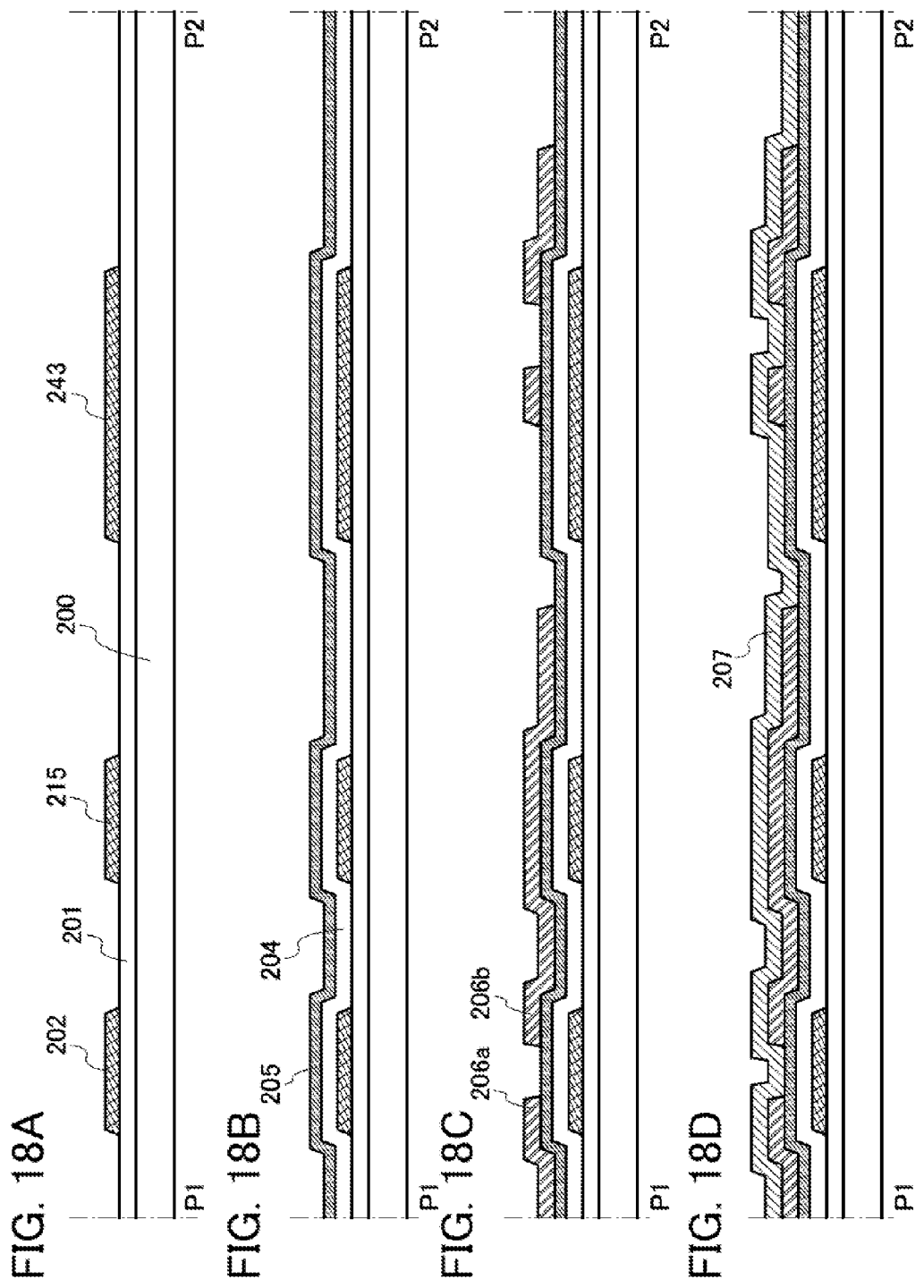

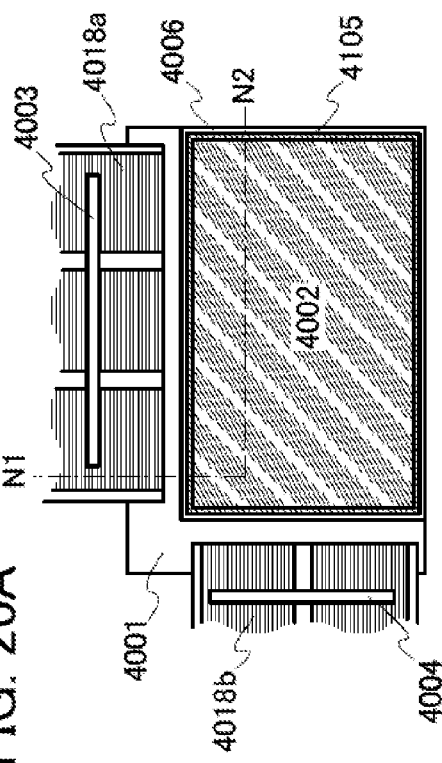
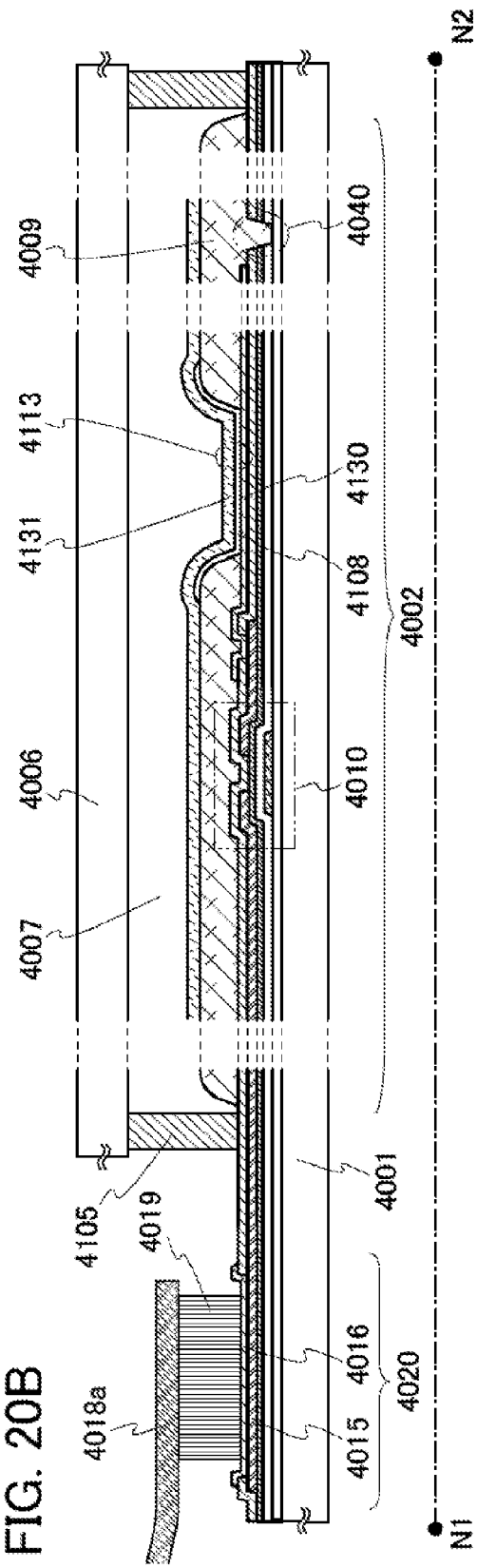
FIG. 20A
FIG. 20B

SEMICONDUCTOR DEVICE INCLUDING GROOVE PORTION EXTENDING BEYOND PIXEL ELECTRODE

BACKGROUND OF THE INVENTION

1. Field of the Invention

The present invention relates to a semiconductor device and a manufacturing method thereof.

In this specification, a semiconductor device means all types of devices that can function by utilizing semiconductor characteristics, and a transistor, a semiconductor circuit, a memory device, an imaging device, a display device, an electro-optical device, an electronic device, and the like are all semiconductor devices.

2. Description of the Related Art

In recent years, transistors that are formed using a semiconductor thin film having a thickness of several nanometers to several hundreds of nanometers over a substrate having an insulating surface such as a glass substrate have been attracting attentions. Transistors are widely used for electronic devices such as ICs (integrated circuits) and electro-optical devices. In particular, transistors are urgently developed as switching elements of image display devices typified by active matrix liquid crystal display devices, active matrix EL (electroluminescent) display devices, and the like. In an active matrix liquid crystal display device, a voltage is applied between a pixel electrode connected to a selected switching element and a counter electrode corresponding to the pixel electrode, and thus, a liquid crystal layer disposed between the pixel electrode and the counter electrode is modulated optically. The optical modulation is recognized as a display pattern by an observer. An active matrix display device here means a display device which employs a method in which a display pattern is formed on a screen by driving pixel electrodes arranged in matrix using switching elements.

The range of uses of such an active matrix display device is expanding, and demands for larger screen size, higher definition, and higher aperture ratio are increasing. In addition, it is demanded that the active matrix display device has high reliability and that a production method of the active matrix display device offers high productivity and reduces production cost. Simplification of a process is one way for increasing productivity and reducing production cost.

In active matrix display devices, transistors are mainly used as switching elements. In manufacturing transistors, reduction in the number of photolithography processes or simplification of the photolithography process is important for simplification of the whole process. For example, when one mask for photolithography process is added, the following steps are further needed: resist application, prebaking, light exposure, development, postbaking, and the like and, moreover, steps before and after the aforementioned steps, such as film formation, etching, resist removal, cleaning, drying, and the like. The number of steps is significantly increased only by adding one mask for photolithography process in the manufacturing process. Therefore, many techniques for reducing the number of photolithography processes or simplifying the photolithography process in a manufacturing process have been developed.

Transistors are broadly classified into top-gate transistors, in which a channel formation region is provided below a gate electrode, and bottom-gate transistors, in which a channel formation region is provided above a gate electrode. These transistors are generally manufactured through at least 5 photolithography processes using at least 5 photomasks.

In an active matrix EL display device, a partition layer for separating EL layers for respective pixels is necessary. Therefore, it is general to manufacture an active matrix EL display device using one more photomask, that is, through at least 6 photolithography processes.

Many conventional techniques for simplifying the photolithography process use a complicated technique such as backside light exposure, resist reflow, or a lift-off method, which requires a special apparatus in many cases. Using such complicated techniques may cause various problems, thereby leading to a reduction in yield. Moreover, the usage of such complicated techniques often cause deterioration of electrical characteristics of transistors.

As typical means for simplifying the photolithography process in a manufacturing process of a transistor, a technique using a multi-tone mask (called a half-tone mask or a graytone mask) is widely known. As a technique for reducing the number of manufacturing steps by using a multi-tone mask, Patent Document 1 can be, for example, given.

REFERENCE

Patent Document

[Patent Document 1] Japanese Published Patent Application No. 2003-179069

SUMMARY OF THE INVENTION

However, the reduction in the number of photolithography processes or the simplification of the photolithography process may cause a channel to be formed in a place where the channel is essentially unnecessary; therefore, an unintentional portion may function as a transistor.

For example, if a semiconductor layer overlapping with a pixel electrode with an insulating layer provided therebetween exists, a channel may be formed in the semiconductor layer overlapping with the pixel electrode, depending on the potential supplied to the pixel electrode. Note that such a channel formed in a place where the channel is essentially unnecessary is called a parasitic channel.

Further for example, in the case where a first pixel and a second pixel that is adjacent to the first pixel share a wiring A, if a parasitic channel is formed in a semiconductor layer overlapping with the wiring A with an insulating layer provided therebetween, a wiring B included in the first pixel and a wiring C included in the second pixel, which are provided in contact with the semiconductor layer, may be electrically connected to each other through the parasitic channel. In other words, a transistor which uses the wiring A as a gate electrode, the wiring B as one of a source electrode and a drain electrode, and the wiring C as the other of the source electrode and the drain electrode may be formed in some cases. Such a transistor obtained unintentionally is called a parasitic transistor.

In the case where the distance between adjacent wirings is short, even without a layer functioning as a gate electrode, a parasitic channel may be formed in a semiconductor layer due to electric field generated between the adjacent wirings and the adjacent wirings may be electrically connected to each other.

The parasitic channel or the parasitic transistor causes interference of signals between the wirings and thus makes it difficult to transmit signals accurately. This may lead to lower display quality or lower reliability.

Further, a semiconductor device includes a plurality of thin films complicatedly stacked, and is manufactured using a variety of materials, methods, and steps. Therefore, an employed manufacturing process may cause shape defects or a degradation of electrical characteristics of the semiconductor device.

In view of the above problems, it is an object of an embodiment of the present invention to provide a highly reliable semiconductor device.

An object of an embodiment of the present invention is to reduce the number of photolithography processes used for manufacturing a semiconductor device to less than the conventional one.

An object of an embodiment of the present invention is to reduce the number of photomasks used for manufacturing a semiconductor device to less than the conventional one.

It is another object of an embodiment of the present invention to provide a semiconductor device allowing high productivity.

It is another object of an embodiment of the present invention to provide a semiconductor device with low power consumption.

In an embodiment of the present invention, a photolithography process for forming an island-shaped semiconductor layer is omitted, and a semiconductor device used in a liquid crystal display device is manufactured through the following four photolithography processes: a step for forming a gate electrode (including a wiring formed from the same layer), a step for forming a source electrode and a drain electrode (including a wiring formed from the same layer), a step for forming a contact hole (including removal of an insulating layer or the like in a region other than the contact hole), and a step for forming a pixel electrode (including a wiring or the like formed from the same layer).

In another embodiment of the present invention, a photolithography process for forming an island-shaped semiconductor layer is omitted, and a semiconductor device used in an EL display device is manufactured through the following five photolithography processes: a step for forming a gate electrode (including a wiring formed from the same layer), a step for forming a source electrode and a drain electrode (including a wiring formed from the same layer), a step for forming a contact hole (including removal of an insulating layer or the like in a region other than the contact hole), a step for forming a pixel electrode (including a wiring or the like formed from the same layer), and a step for forming a partition layer.

In the above-described semiconductor devices, in order to avoid the influence due to formation of a parasitic channel or a parasitic transistor, a groove portion is provided so as to extend in a direction substantially orthogonal to an extending direction of a first wiring that is electrically connected to the gate electrode and to extend along a second wiring that is electrically connected to one of the source electrode and the drain electrode. For example, a groove portion is formed so as to cross at least a portion of the first wiring in a line width direction of the first wiring across both edges thereof. Further for example, a groove portion is formed between the second wiring and the pixel electrode so as to extend beyond edges of the pixel electrode along a direction in which the second wiring extends. Alternatively, a groove portion may be formed so as to overlap with the pixel electrode and extend beyond edges of the pixel electrode along a direction in which the second wiring extends. Further for example, a groove portion is formed between adjacent pixels, that is, between wirings of the adjacent pixels which are formed in contact with a semiconductor layer.

The groove portion is formed in the same step as the step for forming the contact hole. The semiconductor layer in the groove portion is removed. In other words, the semiconductor layer does not exist at least on the bottom surface of the groove portion.

The formation of the groove portion at least on the bottom surface of which the semiconductor layer does not exist can prevent formation of a parasitic channel and a parasitic transistor.

An embodiment of the present invention includes a transistor including a gate electrode, a source electrode, a drain electrode, and a semiconductor layer; a first wiring electrically connected to the gate electrode; a second wiring electrically connected to the source electrode; a pixel electrode electrically connected to the drain electrode; a capacitor wiring; and a groove portion. The semiconductor layer overlaps with the first wiring, the second wiring, the pixel electrode, and the capacitor wiring. The groove portion is formed over at least a portion of the first wiring and over at least a portion of the capacitor wiring. Further, the groove portion is formed along the second wiring so as to extend beyond edges of the pixel electrode in a direction in which the second wiring extends.

Although the size of the groove portion is not particularly limited, for surely preventing formation of a parasitic transistor, the distance of the portion where the semiconductor layer is removed in the groove portion in a direction orthogonal to the direction in which the second wiring extends is preferably 1 μm or more, further preferably 2 μm or more.

An embodiment of the present invention includes a first transistor, a second transistor, a first wiring, a second wiring, a third wiring, a pixel electrode, a first groove portion, and a second groove portion. The first transistor and the second transistor each includes a gate electrode, a source electrode, a drain electrode, and a semiconductor layer. The gate electrode of the first transistor is electrically connected to the first wiring, one of the source electrode and the drain electrode of the first transistor is electrically connected to the second wiring, and the other of the source electrode and the drain electrode of the first transistor is electrically connected to the gate electrode of the second transistor. One of the source electrode and the drain electrode of the second transistor is electrically connected to the third wiring, and the other of the source electrode and the drain electrode of the second transistor is electrically connected to the pixel electrode. The semiconductor layer overlaps with the first wiring, the second wiring, the third wiring, and the pixel electrode. The first groove portion is formed over the first wiring between the second wiring and the third wiring so as to cross the first wiring in a line width direction of the first wiring. The second groove portion is formed between the second wiring and the pixel electrode along a direction in which the second wiring extends so as to extend beyond edges of the pixel electrode.

An embodiment of the present invention includes a first pixel and a second pixel adjacent to the first pixel. The first pixel and the second pixel each include a first transistor, a second transistor, a first wiring, a second wiring, a third wiring, a pixel electrode, a first groove portion, and a second groove portion. The first transistor and the second transistor each includes a gate electrode, a source electrode, a drain electrode, and a semiconductor layer. The gate electrode of the first transistor is electrically connected to the first wiring, one of the source electrode and the drain electrode of the first transistor is electrically connected to the second wiring, and the other of the source electrode and the drain electrode of the first transistor is electrically connected to the gate electrode of the second transistor. One of the source electrode and the drain electrode of the second transistor is electrically connected to the third wiring, and the other of the source electrode and the drain electrode of the second transistor is electrically connected to the pixel electrode. The semiconductor layer overlaps with the first wiring, the second wiring, the third wiring, and the pixel electrode. The first groove portion is formed over the first wiring between the second wiring and the third wiring so as to cross the first wiring in a line width direction of the first wiring. The second groove portion is formed between the second wiring and the pixel electrode along a direction in which the second wiring extends so as to extend beyond edges of the pixel electrode. A third groove portion is formed between the first pixel and the second pixel so as to extend beyond edges of the first pixel.

The first groove portion, the second groove portion, and the third groove portion may be formed independently. Alternatively, some or all of the first to third groove portions may constitute one groove portion.

An embodiment of the present invention includes the steps of: forming a gate electrode, a first wiring electrically connected to the gate electrode, and a capacitor wiring over a substrate by a first photolithography process; forming a gate insulating layer over the gate electrode, the first wiring, and the capacitor wiring; forming a semiconductor layer over the gate insulating layer; forming a source electrode and a drain electrode over the semiconductor layer by a second photolithography process; forming a protective layer over the source electrode and the drain electrode; by a third photolithography process, forming a contact hole by selectively removing part of the protective layer overlapping with the drain electrode, and removing at least part of the semiconductor layer over the first wiring and at least part of the semiconductor layer over the capacitor wiring; and forming a pixel electrode over the protective layer by a fourth photolithography process.

An embodiment of the present invention includes the steps of: forming a gate electrode over a substrate by a first photolithography process; forming a gate insulating layer over the gate electrode; forming a semiconductor layer over the gate insulating layer; forming a source electrode and a drain electrode over the semiconductor layer by a second photolithography process; forming a protective layer over the source electrode and the drain electrode; by a third photolithography process, forming a contact hole by selectively removing part of the protective layer overlapping with the drain electrode, and forming a groove portion by removing part of the protective layer, part of the semiconductor layer, and part of the gate insulating layer; and forming a pixel electrode over the protective layer by a fourth photolithography process.

Further, an insulating layer having a function of preventing diffusion of an impurity element from the substrate may be provided between the substrate and the gate electrode.

According to one embodiment of the present invention, a first layer is formed over a substrate; a first electrode is formed over the first layer; a second layer is formed over the first electrode; a semiconductor layer is formed over the second layer; a second electrode and a third electrode are formed over the semiconductor layer; and a third layer is formed to cover the second electrode and the third electrode. Formation of a contact hole by removing part of the third layer overlapping with the second electrode or the third electrode and removal of part of the third layer, part of the semiconductor layer, and part of the second layer are performed in the same photolithography process.

The first layer functions as a base layer, the second layer functions as a gate insulating layer, and the third layer functions as a protective layer. The first electrode functions as a gate electrode, the second electrode functions as one of a source electrode and a drain electrode, and the third electrode functions as the other of the source electrode and the drain electrode.

The formation of the contact hole and the removal of the part of the third layer, the part of the semiconductor layer, and the part of the second layer can be performed by dry etching, wet etching, or a combination of dry etching and wet etching.

When the gate electrode, the source electrode, the drain electrode, or a wiring connected to such an electrode is formed using a material containing copper or aluminum, the wiring resistance can be reduced and thus signal delay can be prevented.

When an oxide semiconductor is used for the semiconductor layer, a semiconductor device with low power consumption and high reliability can be achieved.

After the source electrode and the drain electrode are formed, it is preferable to perform cleaning treatment for removing impurities attached on an exposed top surface or an exposed side surface of the semiconductor layer.

Further, an oxide insulating material containing at least one of In and Zn or an oxide semiconductor material having a higher insulating property than the semiconductor layer can be used as a material of the third layer or the protective layer, whereby variation in threshold voltage due to charge buildup of the insulating layer can be suppressed and deterioration in transistor characteristics or damage to the transistor due to static electricity can be prevented.

Further, a film of an oxide insulating material containing at least one of In and Zn or an oxide semiconductor material having a higher insulating property than the semiconductor layer may be formed under the semiconductor layer.

An embodiment of the present invention is a semiconductor device in which over an oxide semiconductor layer in which a channel is formed, a layer including an oxide insulating material containing at least one of In and Zn or an oxide semiconductor material having a higher insulating property than the oxide semiconductor layer is formed.

The layer including the oxide insulating material containing at least one of In and Zn or the oxide semiconductor material having a higher insulating property than the oxide semiconductor layer may be formed under the oxide semiconductor layer in which a channel is formed, or may be formed over and under the oxide semiconductor layer.

One embodiment of the present invention is a semiconductor device in which, over an oxide semiconductor layer in which a channel is formed, a layer including an oxide material containing In, an element M, and Zn or an oxide material containing In, an element $M_1$, an element $M_2$, and Zn (In-$M_1$-$M_2$-Zn-based oxide) is formed. The element $M_1$ is a trivalent element among elements included in Groups 3A, 3B and 4A. The element $M_2$ is a quadrivalent element among elements included in Groups 4A and 4B. Specifically, when Ga is used as the element $M_1$, one or more of the Ga, which is a trivalent element, are substituted with one or more of quadrivalent elements in the In-$M_1$-$M_2$-Zn-based oxide. Since a quadrivalent element has one more bonds than a trivalent element, the substitution of one or more of the trivalent elements with one or more of the quadrivalent elements makes bonding strength between the metal element ($M_1$ or $M_2$) included in the In-$M_1$-$M_2$-Zn-based oxide and oxygen greater. Specifically, Ti, Zr, Hf, Ge Ce and the like can be used as the element $M_2$.

As the oxide material containing In, the element M, and Zn, an In-M-Zn-based oxide represented by a chemical formula $InMZnO_X$ ($X>0$) can be used.

An element by which the In-M-Zn-based oxide is provided with a higher insulating property than the metal oxide included in the oxide semiconductor layer in which a channel is formed is used as the element M. For example, as the element M, titanium (Ti), zirconium (Zr), hafnium (Hf), germanium (Ge), or cerium (Ce), which is a quadrivalent element, or the like can be used. Since a quadrivalent element has one more bonds than a trivalent element, an In-M-Zn-based oxide including the quadrivalent element as the element M has greater bonding strength between the element M and oxygen, then the insulating property thereof can be made high.

One embodiment of the present invention is a semiconductor device including a gate electrode, a gate insulating layer, an oxide semiconductor layer, and a protective layer. The oxide semiconductor layer overlaps with the gate electrode with the gate insulating layer interposed therebetween. The protective layer overlaps with the gate insulating layer with the oxide semiconductor layer interposed therebetween. Further, the protective layer includes an oxide material containing In, the element $M_1$, the element $M_2$, and Zn.

An oxide semiconductor used for the semiconductor layer is preferably an i-type (intrinsic) or substantially i-type oxide semiconductor obtained by reducing impurities such as moisture or hydrogen and reducing oxygen vacancies in the oxide semiconductor.

Note that an oxide semiconductor which is purified (purified OS) by reduction of impurities such as moisture or hydrogen which serves as an electron donor (donor) can be made to be an i-type (intrinsic) oxide semiconductor or an oxide semiconductor extremely close to an i-type oxide semiconductor (a substantially i-type oxide semiconductor) by supplying oxygen to the oxide semiconductor to reduce oxygen vacancies in the oxide semiconductor. A transistor including the i-type or substantially i-type oxide semiconductor in a semiconductor layer in which a channel is formed has characteristics of very small off-state current. Specifically, the hydrogen concentration in the purified OS which is measured by secondary ion mass spectrometry (SIMS) is less than or equal to $5 \times 10^{19}/cm^3$, preferably less than or equal to $5 \times 10^{18}/cm^3$, and further preferably less than or equal to $5 \times 10^{17}/cm^3$.

In addition, the carrier density of the i-type or substantially i-type oxide semiconductor, which is measured by Hall effect measurement, is less than $1 \times 10^{14}/cm^3$, preferably less than $1 \times 10^{12}/cm^3$, further preferably less than $1 \times 10^{11}/cm^3$. Furthermore, the band gap of the oxide semiconductor is 2 eV or more, preferably 2.5 eV or more, further preferably 3 eV or more. With the use of the i-type or substantially i-type oxide semiconductor for a semiconductor layer in which a channel is formed, off-state current of the transistor can be reduced.

The analysis of the hydrogen concentration in the oxide semiconductor by SIMS is described here. It is known to be difficult to obtain accurate data in the proximity of a surface of a sample or in the proximity of an interface between stacked films formed of different materials by the SIMS analysis in principle. Thus, in the case where the distribution of the hydrogen concentration in the thickness direction of a film is analyzed by SIMS, the average value of the hydrogen concentration in a region of the film where almost the same value can be obtained without significant variation is employed as the hydrogen concentration. Further, in the case where the thickness of the film is small, a region where almost the same value can be obtained cannot be found in some cases due to the influence of the hydrogen concentration of an adjacent film. In this case, the maximum value or the minimum value of the hydrogen concentration in a region where the film is provided is employed as the hydrogen concentration of the film. Furthermore, in the case where a maximum value peak and a minimum value valley do not exist in the region where the film is provided, the value of the inflection point is employed as the hydrogen concentration.

With an embodiment of the present invention, the number of photolithography processes used for manufacturing a transistor can be reduced to less than the conventional one. This enables the number of photomasks used for manufacturing a semiconductor device including a transistor to be reduced to less than the conventional one. Thus, a semiconductor device can be provided with high productivity and low cost. Further, a display device using the semiconductor device can be provided with high productivity and low cost.

In an embodiment of the present invention, an oxide semiconductor is used for a semiconductor layer in which a channel is formed, whereby a semiconductor device with low power consumption and high reliability can be provided. Further, a highly reliable display device that uses the semiconductor device can be provided.

In an embodiment of the present invention, a layer formed using an oxide insulating material containing at least one of In and Zn is formed in contact with a semiconductor layer, in which case the interface between the layer and the semiconductor layer can be kept in a favorable state. Thus, favorable transistor characteristics can be obtained. Further, by using the transistor, a highly reliable semiconductor device with stable electrical characteristics can be provided.

In an embodiment of the present invention, a layer of an oxide semiconductor having a higher insulating property than the semiconductor layer is formed over or under the semiconductor layer. Thus, variation in threshold voltage due to charge buildup of the insulating layer can be suppressed and deterioration in transistor characteristics or damage to the transistor due to static electricity can be prevented. Thus, by using the transistor, a semiconductor device can be manufactured at high yield, so that productivity of the semiconductor device can be improved.

An embodiment of the present invention solves at least one of the above problems.

BRIEF DESCRIPTION OF THE DRAWINGS

In the accompanying drawings:
FIGS. 7A1, 7A2, 7B1, and 7B2 illustrate an embodiment of the present invention;
FIGS. 9A to 9C illustrate a manufacturing method;
FIGS. 10A to 10C illustrate the manufacturing method.

FIGS. 18A to 18D illustrate a manufacturing method;

FIGS. 20A and 20B illustrate an embodiment of the present invention;

DETAILED DESCRIPTION OF THE INVENTION

Figure 1:
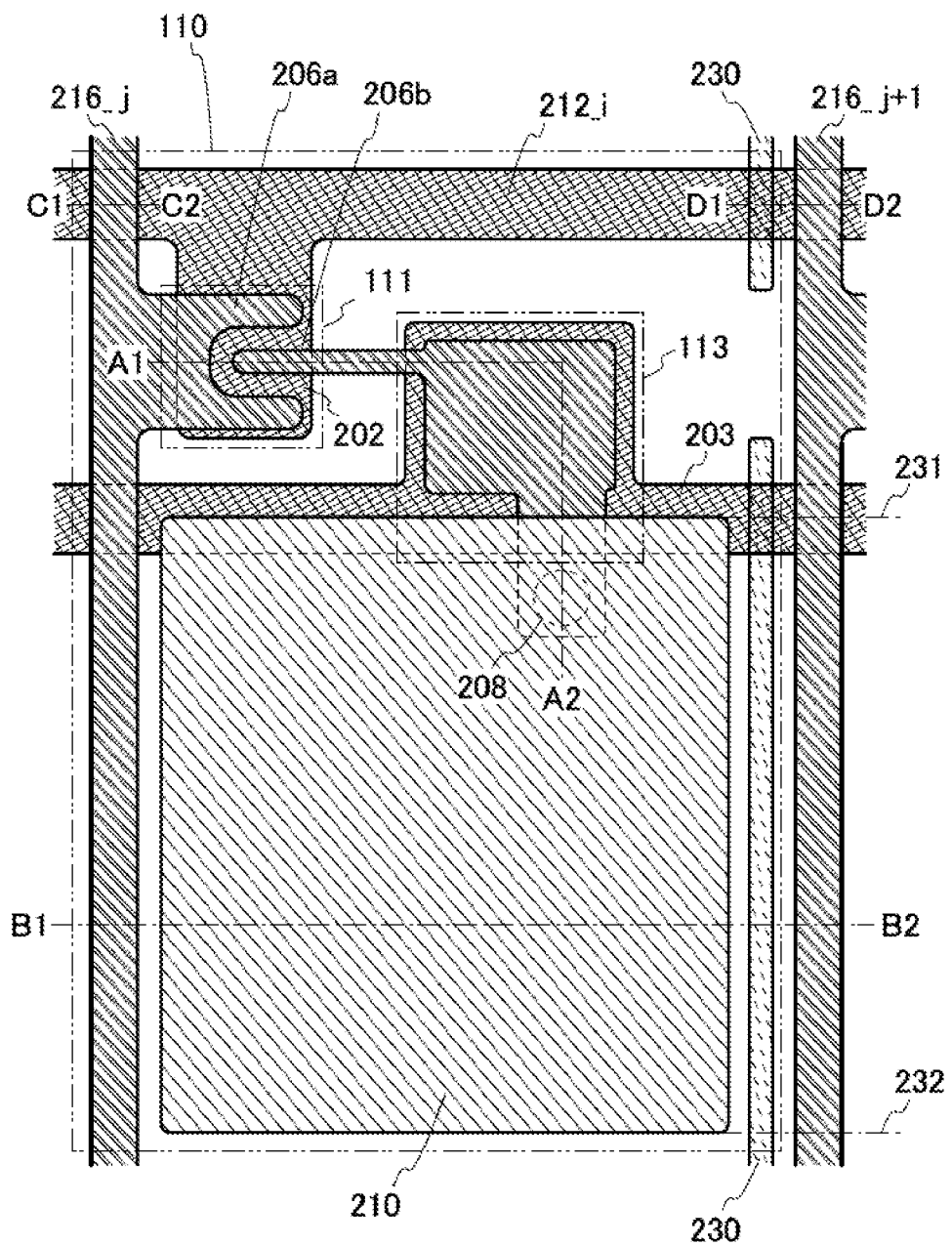
FIG. 1 illustrates an embodiment of the present invention.

Hereinafter, embodiments of the present invention will be described with reference to the drawings. Note that the present invention is not limited to the following description, and it will be readily appreciated by those skilled in the art that the mode and details can be changed in various different ways without departing from the spirit and the scope of the present invention. Therefore, the present invention should not be construed as being limited to the following description of the embodiments. Note that in the structures of the present invention which are described below, the same reference numerals are commonly used to denote the same components or components having similar functions among different drawings, and description of such components is not repeated.

In addition, in this specification and the like, ordinal numbers such as "first", "second", and "third" are used in order to avoid confusion among components, and the terms do not limit the components numerically.

In addition, the position, size, range, or the like of each structure illustrated in drawings and the like is not accurately represented in some cases for easy understanding. Therefore, the disclosed invention is not necessarily limited to the position, size, range, or the like as disclosed in the drawings and the like.

A transistor is one kind of semiconductor elements and can amplify current or voltage and perform a switching operation for controlling conduction or non-conduction, for example. A transistor in this specification includes an insulated-gate field effect transistor (IGFET) and a thin film transistor (TFT).

Functions of a "source" and a "drain" of a transistor might interchange when a transistor of opposite polarity is used or the direction of current flow is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Further, the term "electrode" or "wiring" can also mean a combination of a plurality of "electrodes" and "wirings" formed in a connected manner.

(Embodiment 1)

In this embodiment, as an example of a semiconductor device formed through a process in which the number of photomasks and the number of photolithography processes are reduced, an example of a semiconductor device that can be used in an active matrix liquid crystal display device and a manufacturing method thereof will be described with reference to FIG. 1 to FIG. 10C.

Figure 6A:
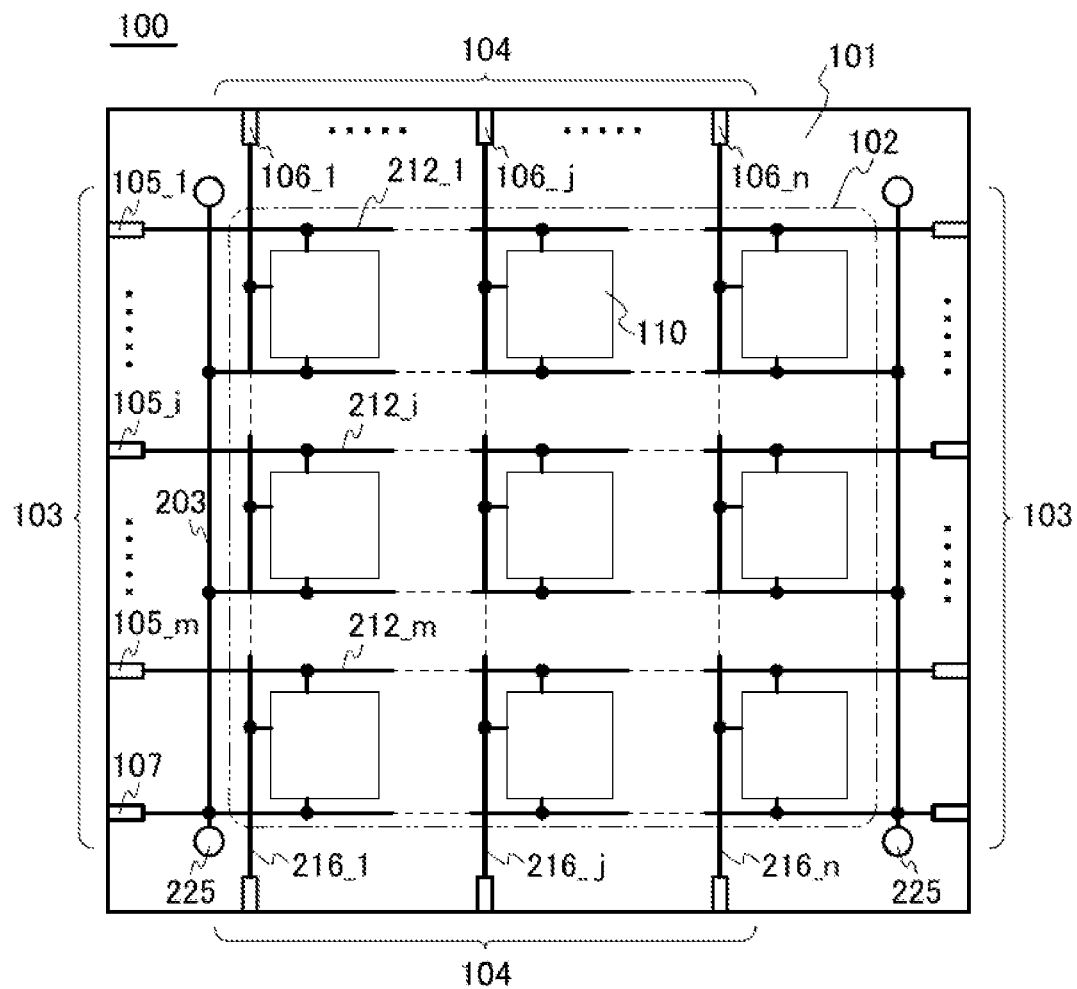
FIGS. 6A and 6B are circuit diagrams illustrating an embodiment of the present invention.

FIG. 6A illustrates an example of the configuration of a semiconductor device 100 that can be used in a liquid crystal display device. The semiconductor device 100 includes a pixel region 102, terminal portions 103 each including m terminals 105_1 to 105_$m$ (m is an integer of greater than or equal to 1) and a terminal 107, and terminal portions 104 each including n terminals 106_1 to 106_$n$ (n is an integer of greater than or equal to 1) over a substrate 101. Further, the semiconductor device 100 includes m wirings 212_1 to 212_$m$ and wirings 203 that are electrically connected to the terminal portions 103, and n wirings 216_1 to 216_$n$ that are electrically connected to the terminal portions 104. The pixel region 102 includes a plurality of pixels 110 arranged in a matrix of m rows and n columns. A pixel 110($i,j$) in the i_th row and the j_th column (i is an integer of greater than or equal to 1 and less than or equal to m, and j is an integer of greater than or equal to 1 and less than or equal to n) is electrically connected to a wiring 212_$i$ and a wiring 216_$j$. In addition, each pixel is connected to the wirings 203 serving as capacitor electrodes or capacitor wirings, and the wirings 203 are electrically connected to the terminal 107 and counter electrode connection portions 225. The wiring 212_$i$ is electrically connected to a terminal 105_$i$, and the wiring 216_$j$ is electrically connected to a terminal 106_$j$.

In the case where a liquid crystal display device including the semiconductor device 100 is configured to control its liquid crystal layer with electric field in a direction perpendicular to a surface of the substrate 101, a substrate that faces the substrate 101 (hereinafter also referred to as "counter substrate") needs to be provided with an electrode (hereinafter also referred to as "counter electrode"). The counter electrode is connected to the wirings 203 through the counter electrode connection portions 225 formed over the substrate 101, and the same potential that is supplied to the wirings 203 is supplied to the counter electrode. The counter electrode and the counter electrode connection portions 225 can be connected with a conductive paste or a conductive particle.

In the case where the liquid crystal display device including the semiconductor device 100 is configured to control the liquid crystal layer with electric field in a direction parallel to the surface of the substrate 101, it is unnecessary to provide a counter electrode for the counter substrate, in which case formation of the counter electrode connection portions 225 can be omitted.

The terminal portions 103 and the terminal portions 104 are external input terminals and are connected to external control circuits with flexible printed circuits (FPCs) or the like. Signals supplied from the external control circuits are input to the semiconductor device 100 through the terminal portions 103 and the terminal portions 104. In FIG. 6A, such terminal portions 103 are provided on the right and left of the pixel region 102, so that signals are input from two directions. Further in FIG. 6A, such terminal portions 104 are provided above and below the pixel region 102, so that signals are input from two directions. By inputting signals from two directions, signal supply capability is increased and high-speed operation of the semiconductor device 100 is facilitated. In addition, influences of signal delay due to an increase in size of the semiconductor device 100 or an increase in wiring resistance that accompanies an increase in definition can be reduced. Moreover, the semiconductor device 100 can have redundancy, so that reliability of the semiconductor device 100 can be improved. Although two terminal portions 103 and two terminal portions 104 are provided in FIG. 6A, a structure in which one terminal portion 103 and one terminal portion 104 are provided may also be employed.

Figure 6B:
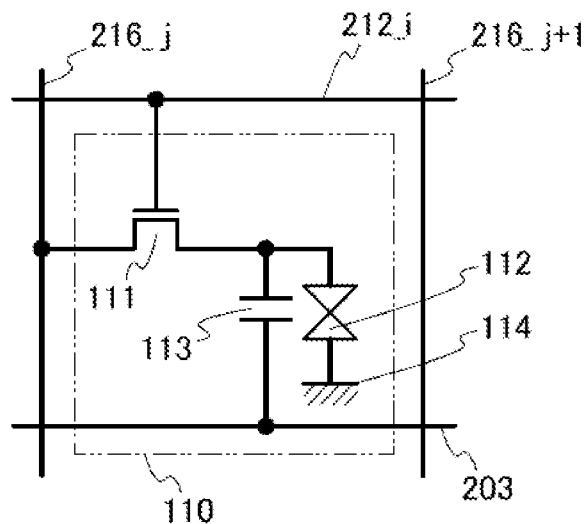

FIG. 6B illustrates a circuit configuration of the pixel 110. The pixel 110 includes a transistor 111, a liquid crystal element 112, and a capacitor 113. A gate electrode of the transistor 111 is electrically connected to the wiring 212_$i$, and one of a source electrode and a drain electrode of the transistor 111 is electrically connected to the wiring 216_$j$. The other of the source electrode and the drain electrode of the transistor 111 is electrically connected to one electrode of the liquid crystal element 112 and one electrode of the capacitor 113. The other electrode of the liquid crystal element 112 is electrically connected to an electrode 114. The potential of the electrode 114 is preferably GND, a common potential, or an arbitrary fixed potential. However, it is also possible to change the potential of the electrode 114 as needed. The other electrode of the capacitor 113 is electrically connected to the wiring 203. Note that it is preferable that the potential of the wiring 203 be the same level as the potential of the electrode 114.

The transistor 111 has a function of selecting whether an image signal supplied from the wiring 216_j is input to the liquid crystal element 112. After a signal that turns on the transistor 111 is supplied to the wiring 212_i, an image signal is supplied to the liquid crystal element 112 from the wiring 216_j through the transistor 111. The transmittance of light is controlled in accordance with the image signal (potential) supplied to the liquid crystal element 112. The capacitor 113 has a function as a storage capacitor (also referred to as a Cs capacitor) for holding a potential supplied to the liquid crystal element 112. The capacitor 113 need not necessarily be provided; however, in the case of providing the capacitor 113, variation in the potential applied to the liquid crystal element 112, which is caused by a current flowing between a source electrode and a drain electrode in an off state of the transistor 111 (off-state current), can be suppressed.

For a semiconductor layer in which a channel is formed in the transistor 111, a single crystal semiconductor, a polycrystalline semiconductor, a microcrystalline semiconductor, an amorphous semiconductor, or the like can be used. Examples of a semiconductor material are silicon, germanium, silicon germanium, silicon carbide, and gallium arsenide. The display device described in this embodiment has a structure in which the semiconductor layer remains in the pixel region; thus, in the case where the display device including the semiconductor is used as a transmissive display device, it is preferable to increase transmittance of visible light by, for example, thinning the semiconductor layer as much as possible.

Further, it is favorable to use an oxide semiconductor for the semiconductor layer in which a channel is formed in the transistor 111. An oxide semiconductor has an energy gap that is as wide as greater than or equal to 3.0 eV, and thus has high transmittance with respect to visible light. In a transistor obtained by processing an oxide semiconductor under appropriate conditions, the off-state current at ambient temperature (e.g., 25° C.) can be less than or equal to 100 zA ($1\times10^{-19}$ A), less than or equal to 10 zA ($1\times10^{-20}$ A), and further less than or equal to 1 zA ($1\times10^{-21}$ A). Therefore, the potential applied to the liquid crystal element 112 can be held without provision of the capacitor 113. Since the potential applied to the liquid crystal element 112 can be held without provision of the capacitor 113, the aperture ratio of the pixel can be increased; accordingly, a liquid crystal display device with high display quality can be provided. The increase in the aperture ratio of the pixel makes it possible to use light from a light source such as a backlight efficiently, so that power consumption of the liquid crystal display device can be reduced.

Description of this embodiment will be given on the assumption that the transistor 111 is an n-channel transistor; however, the transistor 111 may be a p-channel transistor as well.

Next, an example of the configuration of the pixel 110 illustrated in FIGS. 6A and 6B will be described with reference to FIG. 1 and FIGS. 2A to 2D. FIG. 1 is a plan view illustrating a plan structure of the pixel 110, and FIGS. 2A to 2D are cross-sectional views illustrating a stacked structure of the pixel 110. Note that chain lines A1-A2, B1-B2, C1-C2, and D1-D2 in FIG. 1 correspond to cross sections A1-A2, B1-B2, C1-C2, and D1-D2 in FIGS. 2A to 2D, respectively. For easy viewing, some components are omitted in FIG. 1.

In the transistor 111 in this embodiment, a drain electrode 206b is surrounded by a source electrode 206a that is U-shaped (or C-shaped, square-bracket-like shaped, or horseshoe-shaped). With such a shape, an enough channel width can be ensured even when the area of the transistor is small, and accordingly, the amount of current flowing at the time of conduction of the transistor (also referred to as on-state current) can be increased. The increased on-state current of the transistor 111 enables faster writing of signals.

If parasitic capacitance generated between a gate electrode 202 and the drain electrode 206b electrically connected to a pixel electrode 210 is large, the transistor is easily influenced by feedthrough, which may cause degradation in display quality because the potential supplied to the liquid crystal element 112 cannot be held accurately. With the structure in which the source electrode 206a is U-shaped and surrounds the drain electrode 206b as described in this embodiment, an enough channel width can be ensured and parasitic capacitance generated between the drain electrode 206b and the gate electrode 202 can be reduced. Therefore, the display quality of a liquid crystal display device can be improved.

The wiring 203 functions as a capacitor electrode or a capacitor wiring. In this embodiment, the capacitor 113 is formed using the overlapping wiring 203 and drain electrode 206b.

In the semiconductor device described in this embodiment, a semiconductor layer 205 remains in the entire pixel region because a photolithography process for forming an island-shaped semiconductor layer is not performed in order to simplify the manufacturing process. Consequently, there is a possibility of forming a first parasitic transistor in which the wiring 212_i functions as a gate electrode, the wiring 216_j functions as one of a source electrode and a drain electrode, and the wiring 216_j+1 of the adjacent pixel functions as the other of the source electrode and the drain electrode.

Furthermore, there is a possibility of forming a second parasitic transistor in which the wiring 203 functions as a gate electrode, the wiring 216_j functions as one of a source electrode and a drain electrode, and the wiring 216_j+1 of the adjacent pixel functions as the other of the source electrode and the drain electrode.

Furthermore, there is a possibility of forming a third parasitic transistor in which the pixel electrode 210 functions as a gate electrode, a layer 207 functions as a gate insulating layer, the wiring 216_j functions as one of a source electrode and a drain electrode, and the wiring 216_j+1 of the adjacent pixel functions as the other of the source electrode and the drain electrode.

When such a potential as to turn on the transistor 111 is supplied to the wiring 212_i, the first parasitic transistor is also turned on, and the wiring 216_j and the wiring 216_j+1 of the adjacent pixel are electrically connected to each other. The electrical connection between the wiring 216_j and the wiring 216_j+1 by the first parasitic transistor causes interference of image signals therebetween; accordingly, it becomes difficult to supply accurate image signals to the liquid crystal element 112.

In the case where the second parasitic transistor functions as an n-channel transistor, when the potential of the wiring 216_j or the wiring 216_j+1 of the adjacent pixel is lower than that supplied to the wiring 203 and the absolute value of the potential difference is larger than the threshold voltage of the second parasitic transistor, a parasitic channel is formed in the semiconductor layer 205 that overlaps with the wiring 203 and the second parasitic transistor is turned on.

When the second parasitic transistor is on, the wiring 216_j and the wiring 216_j+1 of the adjacent pixel are electrically connected to each other. The electrical connection between the wiring 216_j and the wiring 216_j+1 by the second parasitic transistor causes interference of image signals therebetween; accordingly, it becomes difficult to supply accurate image signals to the liquid crystal element 112.

In the case where the third parasitic transistor functions as an n-channel transistor, when the potential of the wiring 216_j or the wiring 216_j+1 of the adjacent pixel is lower than the potential supplied to the pixel electrode 210 or the potential held at the pixel electrode 210 and the absolute value of the potential difference is larger than the threshold voltage of the third parasitic transistor, a parasitic channel is formed in the semiconductor layer 205 that overlaps with the pixel electrode 210 and the third parasitic transistor is turned on.

When the third parasitic transistor is on, the wiring 216_j and the wiring 216_j+1 of the adjacent pixel are electrically connected to each other. The electrical connection between the wiring 216_j and the wiring 216_j+1 by the third parasitic transistor causes interference of image signals therebetween; accordingly, it becomes difficult to supply accurate image signals to the liquid crystal element 112. When the pixel electrode 210 is formed close to the wiring 216_j or the wiring 216_j+1 for the purpose of increasing the aperture ratio of the pixel for example, the influence of the third parasitic transistor is increased.

In view of this, in this embodiment, a groove portion 230 in which the semiconductor layer 205 is removed is provided in the pixel 110 so as not to form the above-described parasitic transistors. The groove portion 230 is provided so as to cross the wiring 212_i in the line width direction of the wiring 212_i across both edges thereof; in this way, formation of the first parasitic transistor can be prevented. In addition, the groove portion 230 is provided so as to cross the wiring 203 in the line width direction of the wiring 203 across both edges thereof; in this way, formation of the second parasitic transistor can be prevented. Note that a plurality of groove portions 230 may be provided over the wiring 212_i, and a plurality of groove portions 230 may be provided over the wiring 203.

Furthermore, the groove portion 230 is formed at least between the pixel electrode 210 and the wiring 216_j or between the pixel electrode 210 and the wiring 216_j+1 of the adjacent pixel, along a direction in which the wiring 216_j or the wiring 216_j+1 extends, so as to extend beyond an edge 231 and an edge 232 of the pixel electrode 210. In this way, formation of the third parasitic transistor can be prevented. The groove portion 230 provided along the direction in which the wiring 216_j or the wiring 216_j+1 extends is not necessarily provided in parallel to the direction in which the wiring 216_j or the wiring 216_j+1 extends and may have a flection portion or a bending portion.

In FIG. 1, the groove portions 230 are separated in a region between the wiring 212_i and the wiring 203. However, the groove portion 230 provided to cross the wiring 212_i in the line width direction of the wiring 212_i across the both edges thereof may be extended and connected to the groove portion 230 provided to cross the wiring 203 in the line width direction of the wiring 203 across the both edges thereof.

It is also possible to prevent formation of the second parasitic transistor without providing the groove portion 230 over the wiring 203 by setting the potential of the wiring 203 to be lower than the potential supplied to the wiring 216_j or the wiring 216_j+1. However in such a case, a power supply for supplying the above-described potential to the wiring 203 needs to be provided additionally.

Although the size of the groove portion 230 in which the semiconductor layer 205 is removed is not particularly limited, for surely preventing formation of a parasitic transistor, the distance of the portion where the semiconductor layer is removed in the groove portion 230 in a direction perpendicular to the direction in which the wiring 216_j or the wiring 216_j+1 extends is preferably 1 μm or more, further preferably 2 μm or more.

The cross section A1-A2 shows the stacked structure of the transistor 111 and the stacked structure of the capacitor 113. The transistor 111 has one kind of bottom-gate structure called a channel-etched type. The cross section B1-B2 shows the stacked structure from the wiring 216_j to the wiring 216_j+1, including the pixel electrode 210 and the groove portion 230. Further, the cross section C1-C2 shows the stacked structure of an intersection of the wiring 216_j and the wiring 212_i. The cross section D1-D2 shows the stacked structure of an intersection of the wiring 216_j+1 and the wiring 212_i and the stacked structure of the groove portion 230.

Figure 2A:
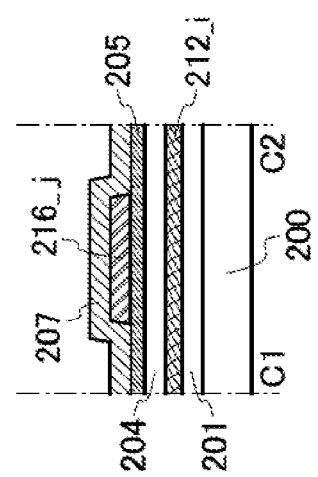
FIGS. 2A to 2D illustrate the embodiment of the present invention.

In the cross section A1-A2 in FIG. 2A, a base layer 201 is formed over a substrate 200, and the gate electrode 202 and the wiring 203 are formed over the base layer 201. Over the gate electrode 202 and the wiring 203, a gate insulating layer 204 and a semiconductor layer 205 are formed. Over the semiconductor layer 205, the source electrode 206a and the drain electrode 206b are formed. Further, the layer 207 is formed over the source electrode 206a and the drain electrode 206b so as to be in contact with part of the semiconductor layer 205. The pixel electrode 210 is formed over the layer 207 and is electrically connected to the drain electrode 206b through a contact hole 208 formed in the layer 207.

A portion in which the wiring 203 and the drain electrode 206b overlap with each other with the gate insulating layer 204 and the semiconductor layer 205 interposed therebetween functions as the capacitor 113. The gate insulating layer 204 and the semiconductor layer 205 function as a dielectric layer. In the case where a multi-layer dielectric layer is formed between the wiring 203 and the drain electrode 206b, even when a pinhole is generated in one dielectric layer, the pinhole is covered with another dielectric layer; accordingly, the capacitor 113 can operate normally. The relative permittivity of an oxide semiconductor is as high as 14 to 16. When such an oxide semiconductor is used for the semiconductor layer 205, the capacitance of the capacitor 113 can be increased.

Figure 2C:
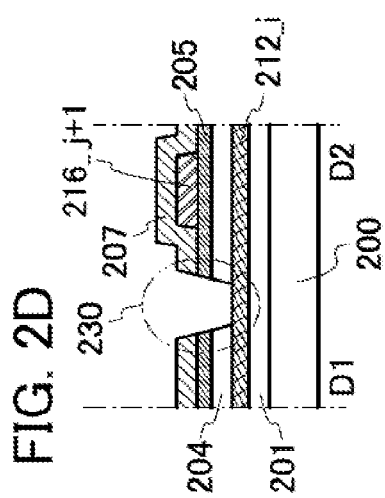
Figure 2B:
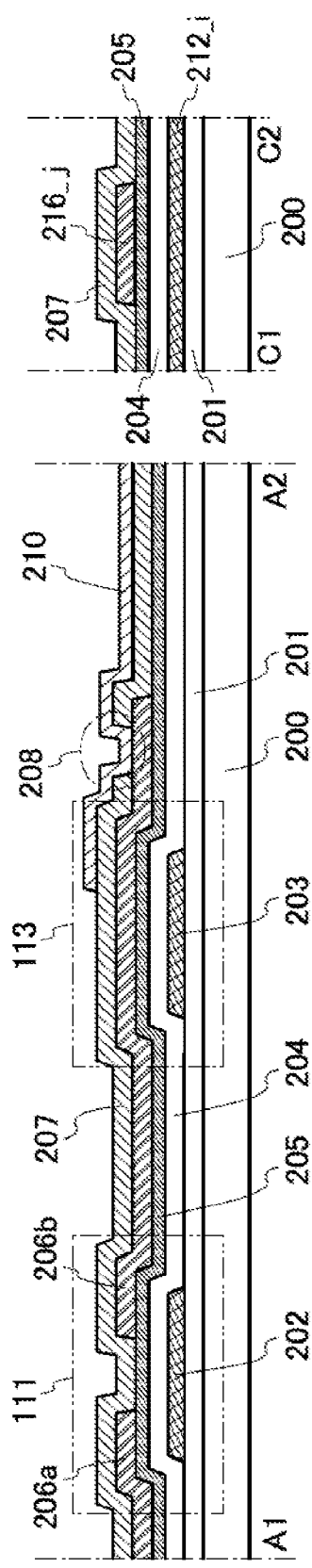

In the cross section B1-B2 illustrated in FIG. 2B, the base layer 201 is formed over the substrate 200, the gate insulating layer 204 is formed over the base layer 201, and the semiconductor layer 205 is formed over the gate insulating layer 204. The wiring 216_j and the wiring 216_j+1 are formed over the semiconductor layer 205, and the layer 207 is formed over the semiconductor layer 205, the wiring 216_j, and the wiring 216_j+1. The pixel electrode 210 is formed over the layer 207.

The groove portion 230 is formed between the wiring 216_j+1 and the pixel electrode 210 by removing part of the gate insulating layer 204, part of the semiconductor layer 205, and part of the layer 207. The groove portion 230 does not include a semiconductor layer at least on its bottom surface.

In the cross section C1-C2 illustrated in FIG. 2C, the base layer 201 is formed over the substrate 200, and the wiring 212_i is formed over the base layer 201. Over the wiring 212_i, the gate insulating layer 204 and the semiconductor layer 205 are formed. The wiring 216_j is formed over the semiconductor layer 205, and the layer 207 is formed over the wiring 216_j.

Figure 2D:
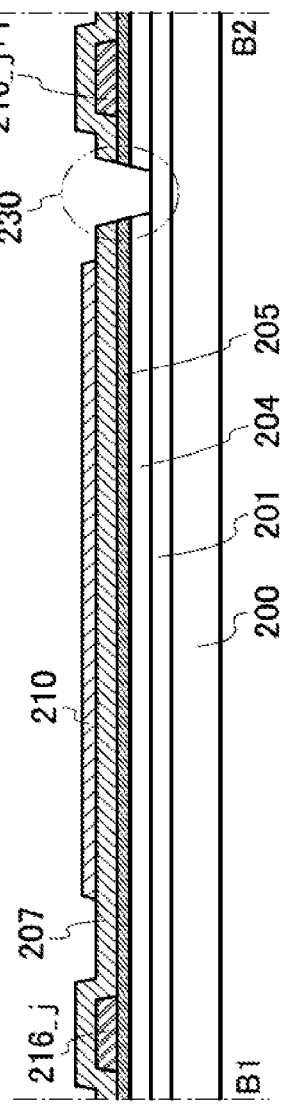

In the cross section D1-D2 illustrated in FIG. 2D, the base layer 201 is formed over the substrate 200, and the wiring 212_i is formed over the base layer 201. Further, the gate insulating layer 204 and the semiconductor layer 205 are formed over the wiring 212_i. The wiring 216_j+1 is formed over the semiconductor layer 205, and the layer 207 is formed over the wiring 216_j+1. In addition, the groove portion 230 is formed by removing part of the gate insulating layer 204, part of the semiconductor layer 205, and part of the layer 207.

Figure 3:
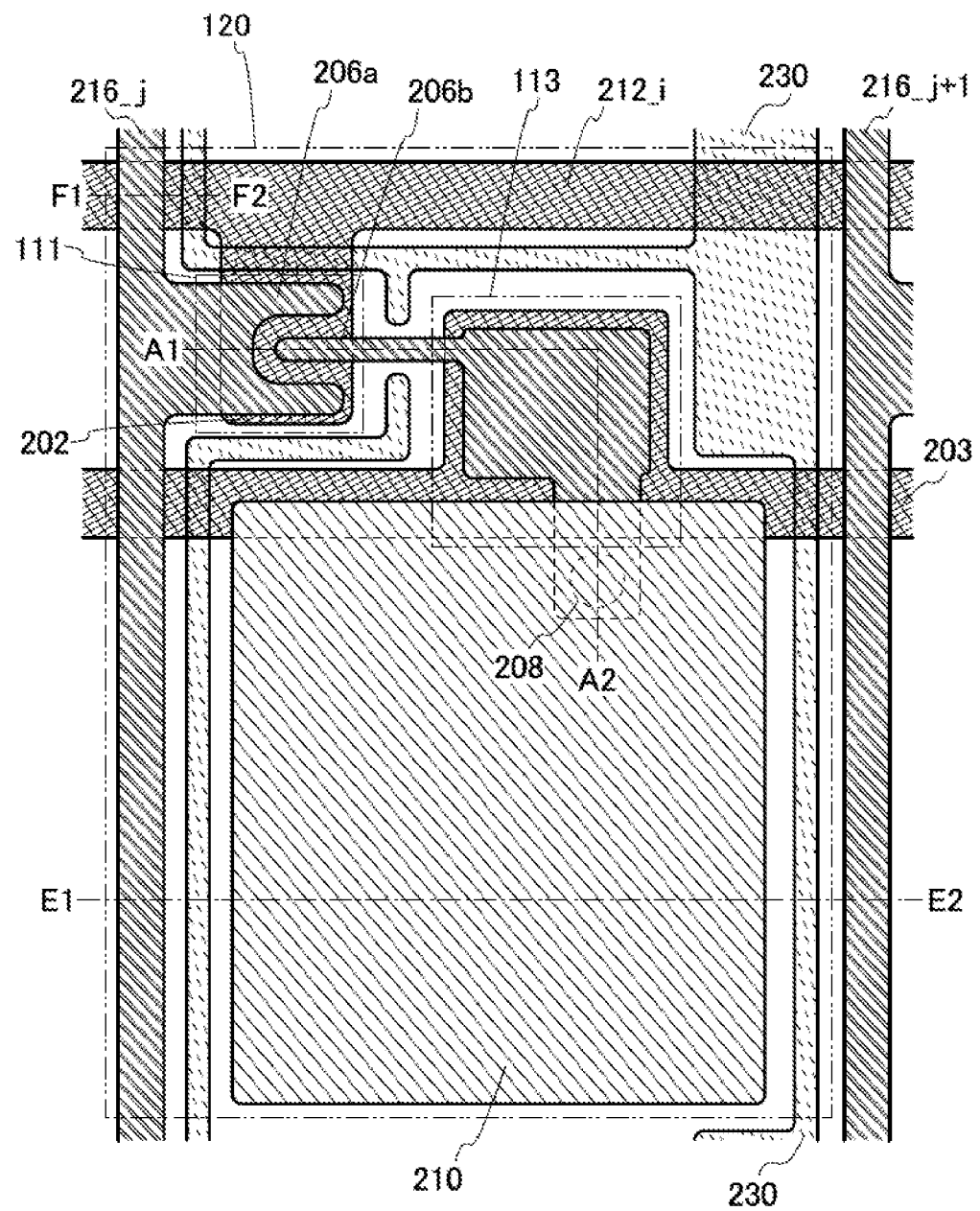
FIG. 3 illustrates an embodiment of the present invention.
Figure 4C:
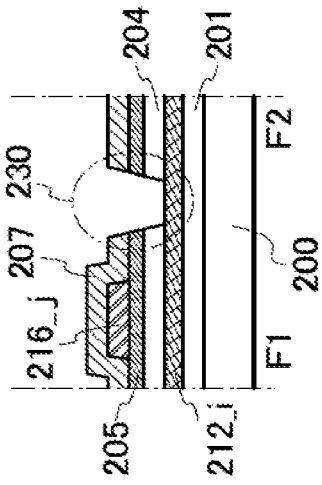
FIGS. 4A to 4C illustrate an embodiment of the present invention.
Figure 4A:
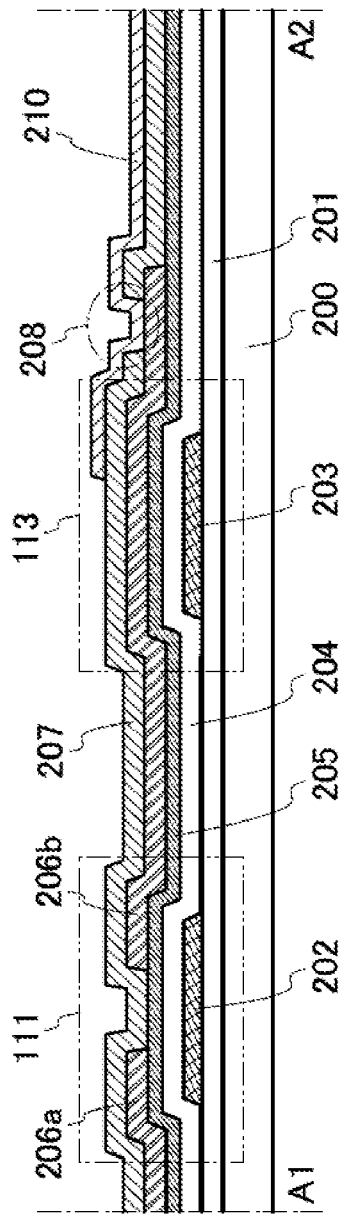
Figure 4B:
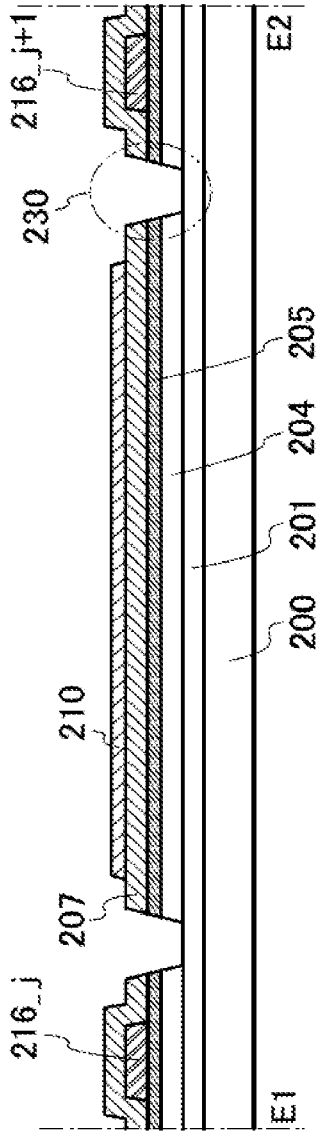

Next, an example of the pixel configuration, which is different from that illustrated in FIG. 1 will be described with reference to FIG. 3 and FIGS. 4A to 4C. FIG. 3 is a top view illustrating a plan structure of a pixel 120. Cross sections A1-A2, E1-E2, and F1-F2 in FIGS. 4A to 4C correspond to cross sections of portions indicated by chain lines A1-A2, E1-E2, and F1-F2 in FIG. 3. The pixel 120 illustrated in FIG. 3 is different from the pixel 110 illustrated in FIG. 1 in the top-surface shape of the groove portion 230. Note that the structure of the portion indicated by the chain line A1-A2 in FIG. 3 is the same as that in FIG. 1 and FIG. 2A.

The pixel 120 has a structure in which the groove portion 230 is provided between the pixel electrode 210 and the wiring 216_j and between the pixel electrode 210 and the wiring 216_j+1 of the adjacent pixel. The groove portion 230 is provided to not only cross the wiring 212_i and the wiring 203 in the line width direction of the wiring 212_i and the wiring 203 across the both edges thereof but also to exist in the region between the wiring 212_i and the wiring 203. By making the area of the groove portion 230 larger, formation of parasitic transistors can be prevented more surely.

Figure 5A:
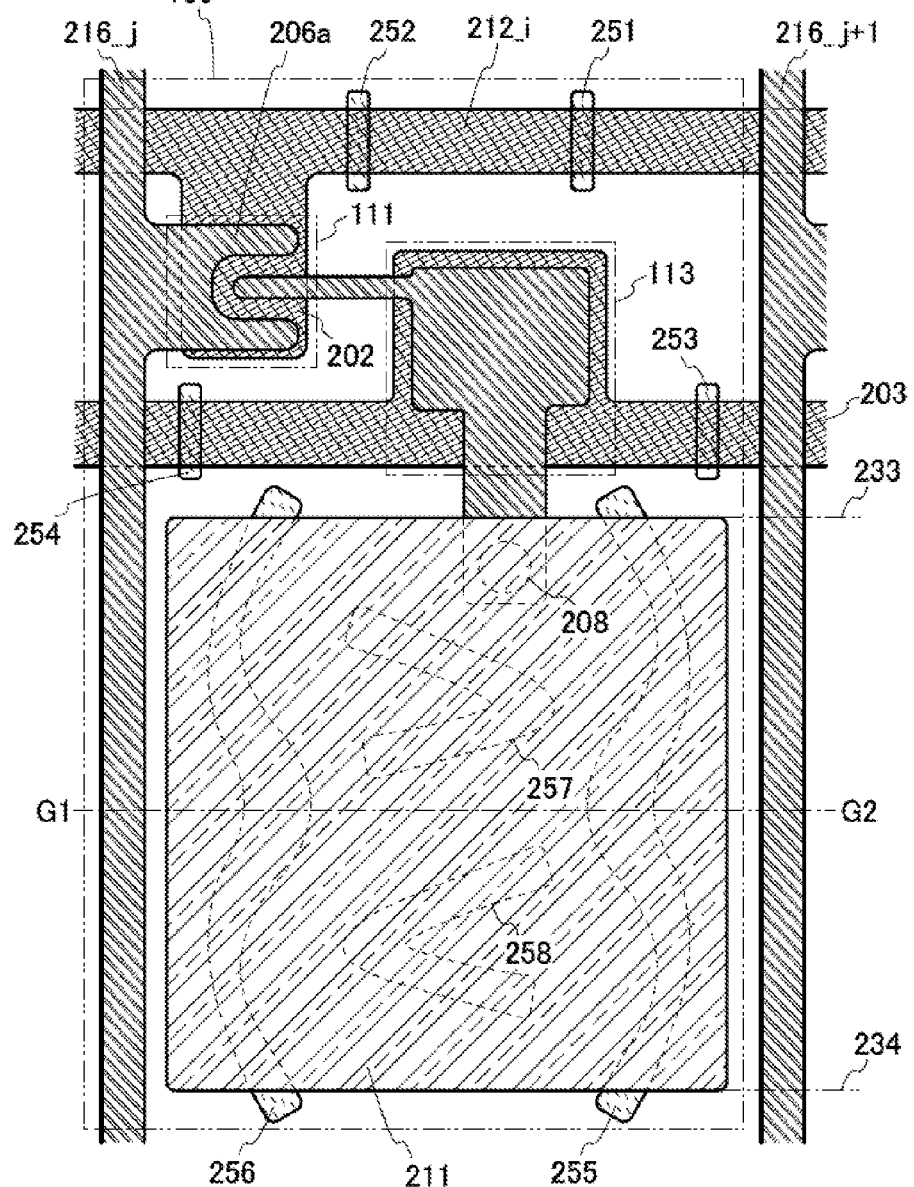
FIGS. 5A and 5B illustrate an embodiment of the present invention.
Figure 5B:
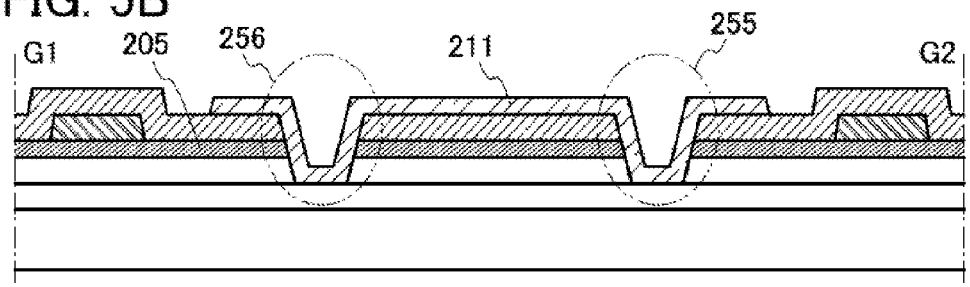

Next, an example of the pixel configuration, which is different from those in FIG. 1, FIGS. 2A to 2D, FIG. 3, and FIGS. 4A to 4C, will be described with reference to FIGS. 5A and 5B. FIG. 5A is a top view illustrating a plan structure of a pixel 130. A cross section G1-G2 in FIG. 5B corresponds to a cross section of a portion indicated by a chain line G1-G2 in FIG. 5A. FIGS. 5A and 5B illustrate an example of the pixel configuration, in which the pixel 130 has a configuration which can be applied to a reflective liquid crystal display device by using a conductive layer with high light reflectance for the pixel electrode 211.

In the pixel 130, a groove portion 251 and a groove portion 252 in which the semiconductor layer 205 is removed are provided so as to cross the wiring 212_i in the line width direction of the wiring 212_i across the both edges thereof. When a plurality of groove portions which cross the wiring 212_i in the line width direction of the wiring 212_i across the both edges thereof is provided, the influence of a parasitic channel formed by the overlap with the wiring 212_i can be reduced more surely.

In the pixel 130, a groove portion 253 and a groove portion 254 in which the semiconductor layer 205 is removed are provided so as to cross the wiring 203 in the line width direction of the wiring 203 across the both edges thereof. When a plurality of groove portions which cross the wiring 203 in the line width direction of the wiring 203 across the both edges thereof is provided, the influence of a parasitic channel formed by the overlap with the wiring 203 can be reduced more surely.

Further in the pixel 130, a groove portion 255 and a groove portion 256 in which the semiconductor layer 205 is removed are provided along a direction in which the wiring 216_j or the wiring 216_j+1 of the adjacent pixel extends, so as to extend beyond an edge 233 and an edge 234 of the pixel electrode 211. When a plurality of groove portions is provided along the direction in which the wiring 216_j or the wiring 216_j+1 extends so as to extend beyond the edge 233 and the edge 234 of the pixel electrode 211, the influence of a parasitic channel formed by the overlap with the pixel electrode 211 can be reduced more surely. The groove portion 255 and the groove portion 256 provided along the direction in which the wiring 216_j or the wiring 216_j+1 extends are not necessarily provided in parallel to the direction in which the wiring 216_j or the wiring 216_j+1 extends and may have a flection portion or a bending portion.

The groove portion 255 and the groove portion 256 in the pixel 130 each have a bending portion, and part of the groove portion 255 and part of the groove portion 256 overlap with the pixel electrode 211. Further, the pixel 130 includes a groove portion 257 and a groove portion 258 formed to overlap with the pixel electrode 211. By providing the groove portions 255 to 258 in this manner so as to overlap with the pixel electrode 211, a surface of the pixel electrode 211 can be uneven. By the uneven surface of the pixel electrode 211, incident light from the external is reflected diffusely, whereby more favorable display can be performed. As a result, visibility of display is improved.

It is preferable that the groove portions 255 to 258 formed to overlap with the pixel electrode 211 have a tapered side surface because coverage with the pixel electrode 211 is increased.

Next, examples of the structures of the terminals 105_1 to 105_m and the terminals 106_1 to 106_n will be described with reference to FIGS. 7A1, 7A2, 7B1, and 7B2. FIGS. 7A1 and 7A2 are a top view and a cross-sectional view, respectively, of each of the terminals 105_1 to 105_m. A dashed-dotted line J1-J2 in FIG. 7A1 corresponds to a cross section J1-J2 in FIG. 7A2. FIGS. 7B1 and 7B2 are a top view and a cross-sectional view, respectively, of each of the terminals 106_1 to 106_n. A dashed-dotted line K1-K2 in FIG. 7B1 corresponds to a cross section K1-K2 in FIG. 7B2. In the cross sections J1-J2 and K1-K2, J2 and K2 correspond to end portions of the substrate.

In the cross section J1-J2, the base layer 201 is formed over the substrate 200, and the wiring 212_i is formed over the baser layer 201. The gate insulating layer 204, the semiconductor layer 205, and the layer 207 are formed over the wiring 212_i. An electrode 221 is formed over the layer 207, and the electrode 221 is electrically connected to the wiring 212_i through a contact hole 219 formed in the gate insulating layer 204, the semiconductor layer 205, and the layer 207.

In the cross section K1-K2, the base layer 201, the gate insulating layer 204, and the semiconductor layer 205 are formed over the substrate 200. The wiring 216_j is formed over the semiconductor layer 205, and the layer 207 is formed over the wiring 216_j. An electrode 222 is formed over the layer 207, and the electrode 222 is electrically connected to the wiring 216_j through a contact hole 220 formed in the layer 207.

Note that the terminal 107 can have a structure similar to that of the terminals 105_1 to 105_m or the terminals 106_1 to 106_n.

The pixel region 102 and the terminal portion 104 are connected by n wirings 216_1 to 216_n. In the case where the wirings 216_1 to 216_n extending from the pixel region 102 to the terminals 106_1 to 106_n in the terminal portion 104 are located close to each other, a parasitic channel may be formed in a portion of the semiconductor layer 205, which is between the adjacent wirings 216_1 to 216_n, due to the potential difference between the adjacent wirings 216_1 to 216_*n*, and therefore the adjacent wirings 216_1 to 216_*n* may be electrically connected to each other unintentionally.

This phenomenon can be prevented by providing a conductive layer over the entire region from the pixel region 102 to the terminal portion 104 or between the adjacent wirings 216_1 to 216_*n* with an insulating layer provided between the conductive layer and the semiconductor layer 205 and by setting the potential of the conductive layer to such a potential as not to form a parasitic channel in the semiconductor layer 205.

For example, since most of oxide semiconductors tend to be n-type semiconductors, in the case of using an oxide semiconductor for the semiconductor layer 205, the potential of the conductive layer is set to a potential that is lower than the potential supplied to the wirings 216_1 to 216_*n*.

Further, it is also possible to prevent unintentional electrical connection between the adjacent wirings 216_1 to 216_*n*. by removing the semiconductor layer 205 between the adjacent wirings 216_1 to 216_*n*. in a step for forming a contact hole that is to be described later.

Figure 8A:
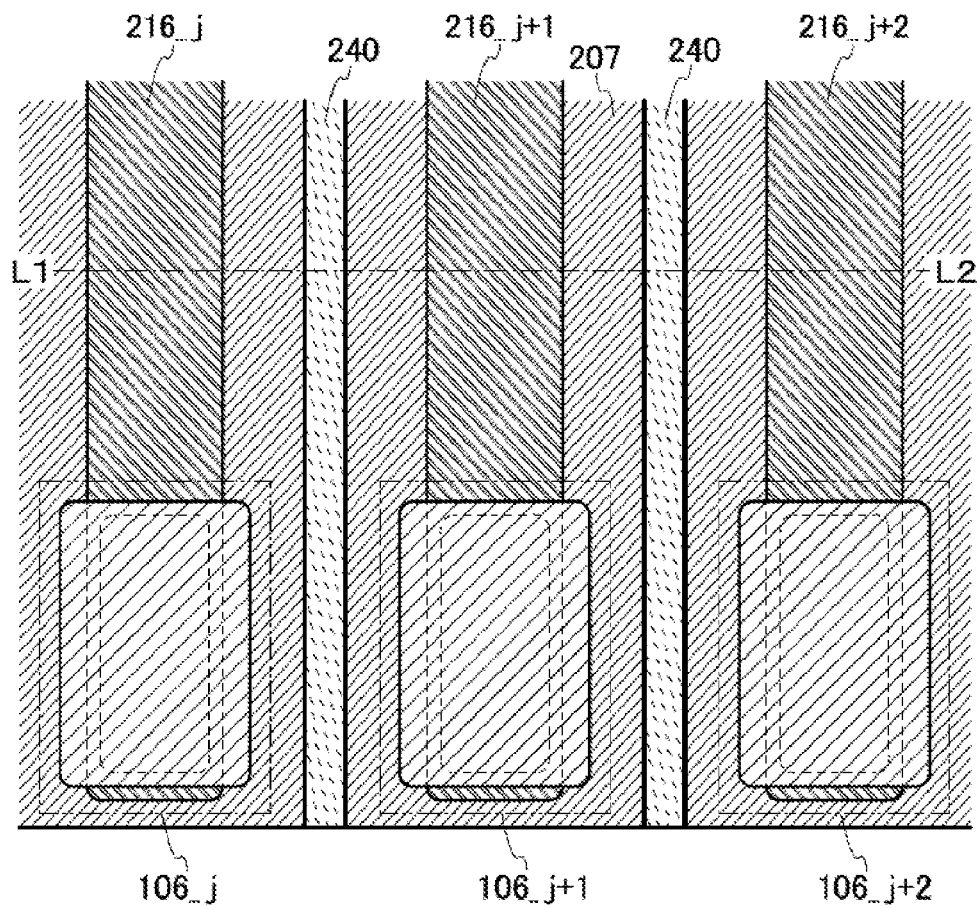
FIGS. 8A and 8B illustrate an embodiment of the present invention.
Figure 8B:
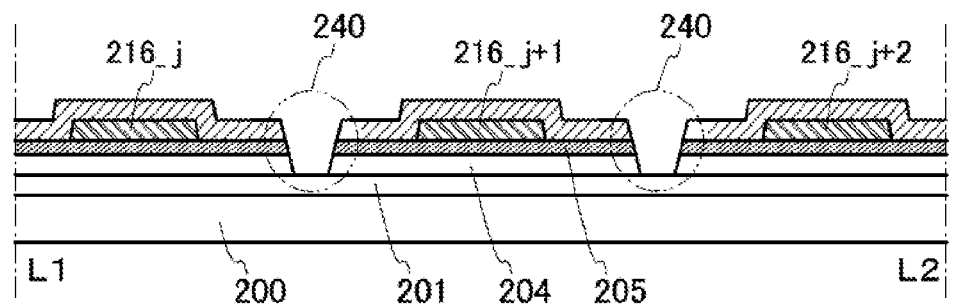

FIGS. 8A and 8B illustrate a structure in which the semiconductor layer 205 is removed by formation of groove portions 240 between the adjacent wirings 216_*j*, 216_*j*+1 and 216_*j*+2. FIG. 8A is a top view illustrating a plan structure of the wirings 216_*j*, 216_*j*+1 and 216_*j*+2 which are connected to the terminals 106_*j*, 106_*j*+1 and 106_*j*+2, respectively. A cross section L1-L2 illustrated in FIG. 8B corresponds to a cross section in a portion indicated by a dashed-dotted line L1-L2 in FIG. 8A. In FIG. 8A, the wiring 216_*j* is connected to the terminal 106_*j*, the wiring 216_*j*+1 is connected to the terminal 106_*j*+1, and the wiring 216_*j*+2 is connected to the terminal 106_*j*+2. For easy viewing, the substrate 200, the base layer 201, the gate insulating layer 204, and the semiconductor layer 205 are omitted in FIG. 8A.

In the cross section L1-L2 illustrated in FIG. 8B, the base layer 201, the gate insulating layer 204, and the semiconductor layer 205 are formed over the substrate 200. The wiring 216_*j*, the wiring 216_*j*+1, and the wiring 216_*j*+2 are formed over the semiconductor layer 205. The layer 207 is formed over the wiring 216_*j*, the wiring 216_*j*+1, and the wiring 216_*j*+2.

The groove portion 240 in which the semiconductor layer 205 is removed is formed between the adjacent wirings 216_*j* and 216_*j*+1. Further, the groove portion 240 in which the semiconductor layer 205 is removed is formed between the adjacent wirings 216_*j*+1 and 216_*j*+2 (see FIGS. 8A and 8B). By providing the groove portions 240 in which the semiconductor layer 205 is removed between the adjacent wirings 216_1 to 216_*n*, unintentional electrical connection between the adjacent wirings 216_1 to 216_*n* can be prevented. Note that the groove portions 240 can be formed in the step for forming the groove portions 230.

Although the size of the groove portion 240 in which the semiconductor layer 205 is removed is not particularly limited, for surely preventing formation of a parasitic channel, the distance of the portion where the semiconductor layer is removed in the groove portion 240 in a direction perpendicular to the direction in which the wiring 216_*j* and the wiring 216_*j*+1 extend is preferably 1 μm or more, further preferably 2 μm or more.

Next, a manufacturing method of a semiconductor device that can be used in the liquid crystal display device described with reference to FIG. 1, FIGS. 2A to 2D, FIGS. 7A1, 7A2, 7B1, and 7B2, and FIGS. 8A and 8B will be described with reference to FIGS. 9A to 9C and FIGS. 10A to 10C. Note that cross sections A1-A2, J1-J2, and K1-K2 in FIGS. 9A to 9C and FIGS. 10A to 10C are cross-sectional views of the portions taken along the dashed-dotted lines A1-A2, J1-J2, and K1-K2 in FIG. 1 and FIGS. 7A1, 7A2, 7B1, and 7B2.

First, an insulating layer to be the base layer 201 is formed with a thickness of greater than or equal to 50 nm and less than or equal to 300 nm, preferably greater than or equal to 100 nm and less than or equal to 200 nm over the substrate 200. As the substrate 200, as well as a glass substrate or a ceramic substrate, a plastic substrate or the like having heat resistance to withstand a process temperature in this manufacturing process can be used. In the case where a substrate does not need a light-transmitting property, a metal substrate such as a stainless alloy substrate with a surface provided with an insulating layer may be used. As the glass substrate, for example, an alkali-free glass substrate of barium borosilicate glass, aluminoborosilicate glass, aluminosilicate glass, or the like may be used. In addition, a quartz substrate, a sapphire substrate, or the like can be used. Further, as the substrate 200, a glass substrate with any of the following sizes can be used: the 3rd generation (550 mm×650 mm), the 3.5th generation (600 mm×720 mm or 620 mm×750 mm), the 4th generation (680× 880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm) In this embodiment, a substrate of aluminoborosilicate glass is used as the substrate 200.

The base layer 201 can be formed with a single-layer structure or a stacked structure using one or more of the following insulating layers: an aluminum nitride layer, an aluminum oxynitride layer, a silicon nitride layer, a silicon oxide layer, a silicon nitride oxide layer, a silicon oxynitride layer, and an aluminum oxide layer. The base layer 201 has a function of preventing diffusion of impurity elements from the substrate 200. Note that in this specification, silicon nitride oxide contains more nitrogen than oxygen and, in the case where measurements are performed using Rutherford backscattering spectrometry (RBS) and hydrogen forward scattering spectrometry (HFS), contains oxygen, nitrogen, silicon, and hydrogen at concentrations of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. The base layer 201 can be formed by a sputtering method, a CVD method, a coating method, a printing method, or the like as appropriate.

When a halogen element such as chlorine or fluorine is contained in the base layer 201, a function of preventing or reducing diffusion of impurity elements from the substrate 200 can be further improved. The peak of the concentration of a halogen element contained in the base layer 201 may be higher than or equal to $1\times10^{15}/cm^3$ and lower than or equal to $1\times10^{20}/cm^3$ when measured by secondary ion mass spectrometry (SIMS).

In this embodiment, as the base layer 201 over the substrate 200, a silicon oxynitride film with a thickness of 200 nm is formed by a plasma CVD method. The temperature at the time of forming the base layer 201 is preferably as high as possible among temperatures that the substrate 200 can withstand. For example, the base layer 201 is formed with the substrate 200 heated at a temperature higher than or equal to 350° C. and lower than or equal to 450° C. Note that the temperature at the time of forming the base layer 201 is preferably constant. For example, the base layer 201 is formed with the substrate heated at 350° C.

After the formation of the base layer 201, heat treatment may be performed in reduced pressure, a nitrogen atmosphere, a rare gas atmosphere, or an ultra-dry atmosphere. The heat treatment can reduce the concentration of hydrogen, moisture, hydride, hydroxide, or the like in the base layer 201. It is preferable that the temperature of the heat treatment be as high as possible among temperatures that the substrate 200 can withstand. Specifically, it is preferable that the heat treatment be performed at a temperature higher than or equal to the film formation temperature of the base layer 201 and lower than or equal to the strain point of the substrate 200.

Note that the hydrogen concentration in the base layer 201 is preferably lower than $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$, and further more preferably lower than or equal to $1 \times 10^{16}$ atoms/cm$^3$.

After the formation of the base layer 201, oxygen (including at least any one of oxygen radicals, oxygen atoms, and oxygen ions) may be introduced into the base layer 201 so that the base layer 201 is in an oxygen excess state. For the introduction of oxygen, an ion implantation method, an ion doping method, a plasma immersion ion implantation method, plasma treatment performed under an oxygen atmosphere, or the like can be employed.

By the introduction of oxygen, a bond between a constituent element of the base layer 201 and hydrogen or a bond between the element and a hydroxyl group is cut, and the hydrogen or the hydroxyl group is reacted with oxygen to produce water; this enables the hydrogen or the hydroxyl group that is an impurity to be easily eliminated as water by heat treatment performed after the introduction of oxygen. Therefore, the heat treatment may be performed after oxygen is introduced into the base layer 201. Then, oxygen may be further introduced into the base layer 201 to make the base layer 201 in an oxygen excess state. The introduction of oxygen and the heat treatment may be performed alternately a plurality of times. The introduction of oxygen and the heat treatment may be performed at the same time.

Next, over the base layer 201, a conductive layer is formed with a thickness of greater than or equal to 100 nm and less than or equal to 500 nm, preferably greater than or equal to 200 nm and less than or equal to 300 nm by a sputtering method, a vacuum evaporation method, or a plating method, a resist mask is formed by a first photolithography process, and the conductive layer is selectively removed by etching, whereby the gate electrode 202, the wiring 203, and the wiring 212_i are formed.

The conductive layer for forming the gate electrode 202, the wiring 203, and the wiring 212_i can be formed to have a single-layer structure or a stacked structure using a metal material such as molybdenum (Mo), titanium (Ti), tungsten (W), tantalum (Ta), aluminum (Al), copper (Cu), chromium (Cr), neodymium (Nd), or scandium (Sc), or an alloy material containing any of these elements as its main component.

The conductive layer may have a single-layer structure or a stacked structure of two or more layers. For example, a single-layer structure of aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which Cu is stacked over a Cu—Mg—Al alloy, a three-layer structure in which titanium nitride, copper, and tungsten are stacked in this order, and the like can be given.

For the conductive layer, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. Alternatively, a stacked structure of the above light-transmitting conductive material and a material containing the above metal element may be employed.

As a material of the conductive layer, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (InN, SnN, or the like) can be used.

These materials each have a work function higher than or equal to 5 eV (electron volts); thus, when these materials are used for the gate electrode, the threshold voltage, which is one electrical characteristic of the transistor, can be positive. Accordingly, a so-called normally-off n-type transistor can be achieved.

Since the conductive layer is formed into a wiring, it is preferable to use Al or Cu which is a low-resistance material as a material of the conductive layer. When Al or Cu is used, signal delay is reduced, so that higher image quality can be realized. Al has low heat resistance; therefore, defects due to a hillock, a whisker, or migration tend to be caused. In order to prevent migration of Al, a stacked structure including Al and a metal material having a higher melting point than Al such as Mo, Ti, or W is preferably used.

Also when Cu is used for the conductive layer, in order to prevent a defect due to migration and diffusion of Cu elements, a stacked structure including Cu and a metal material having a higher melting point than Cu, such as Mo, Ti, or W, is preferably used.

A dry etching method or a wet etching method can be used for the etching of the conductive layer. The conductive layer may be etched by both a dry etching method and a wet etching method in combination. A resist mask formed over the conductive layer can be formed using a photolithography method, a printing method, an ink-jet method, or the like as appropriate. Formation of the resist mask by an ink-jet method needs no photomask; thus, manufacturing cost can be reduced.

In the case of etching the conductive layer by a dry etching method, a gas including a halogen element can be used as an etching gas. As an example of the gas including a halogen element, a chlorine-based gas such as chlorine ($Cl_2$), boron trichloride ($BCl_3$), silicon tetrachloride ($SiCl_4$), or carbon tetrachloride ($CCl_4$); a fluorine-based gas such as carbon tetrafluoride ($CF_4$), sulfur hexafluoride ($SF_6$), nitrogen trifluoride ($NF_3$), or trifluoromethane ($CHF_3$); hydrogen bromide (HBr), or oxygen can be used as appropriate. Further, an inert gas may be added to the etching gas. As the dry etching method, a parallel plate RIE (reactive ion etching) method or an ICP (inductively coupled plasma) etching method can be used. In order to etch the layer into a desired shape, etching conditions (the amount of electric power applied to a coil-shaped electrode, the amount of electric power applied to an electrode on a substrate side, the temperature of the electrode on the substrate side, or the like) are adjusted as appropriate.

In this embodiment, as the conductive layer, a tungsten layer with a thickness of 100 nm is formed over the base layer 201 by a sputtering method. Then, the conductive layer is selectively removed by etching through the first photolithography process, whereby the gate electrode 202, the wiring 203, and the wiring 212_i are formed (see FIG. 9A). The formed gate electrode 202, wiring 203, and wiring 212_i preferably have tapered edges because coverage with an insulating layer or a conductive layer that is later to be stacked thereover can be improved.

Specifically, the end portions of the gate electrode 202, the wiring 203, and the wiring 212_i are processed into a tapered shape so that the cross-sectional shapes of the gate electrode 202, the wiring 203, and the wiring 212_i are trapezoidal or triangular. Here, the end portions of the gate electrode 202, the wiring 203, and the wiring 212_i each have a taper angle θ of 60° or less, preferably 45° or less, further preferably 30° or less. Note that the taper angle θ refers to an inclination angle formed by a side surface and a bottom surface of a layer with a tapered shape when the layer is observed from the direction perpendicular to the cross section of the layer (i.e., the plane perpendicular to the surface of the substrate). The tapered shape with a taper angle of smaller than 90° is referred to as a forward tapered shape, and the tapered shape with a taper angle of greater than or equal to 90° is referred to as an inversely tapered shape. By making the end portion of each layer to have a forward tapered shape, a phenomenon in that a layer formed over the end portion is separated (disconnection) can be prevented; thus, the coverage can be improved.

Further, the gate electrode 202, the wiring 203, and the wiring 212_i can each have a stacked structure including a plurality of layers, whereby the end portions of the gate electrode 202, the wiring 203, and the wiring 212_i can each have a step shape, so that disconnection of a layer formed over the end portions can be prevented, leading to an improvement in coverage.

Note that, unless otherwise specified, a photolithography process in this specification includes a step of forming a resist mask, a step of etching a conductive layer or an insulating layer, and a step of removing the resist mask.

Then, the gate insulating layer 204 is formed over the gate electrode 202, the wiring 203, and the wiring 212_i. The gate insulating layer 204 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, lanthanum oxide, hafnium oxide, hafnium silicate, hafnium silicate to which nitrogen is added, hafnium aluminate to which nitrogen is added, or the like by a plasma CVD method, a sputtering method, or the like. The gate insulating layer 204 is not limited to a single layer, and a stack of different layers may be used. For example, the gate insulating layer 204 may be formed in the following manner: a silicon nitride layer is formed by a plasma CVD method as a gate insulating layer A and a silicon oxide layer is stacked over the gate insulating layer A as a gate insulating layer B.

Generally, a capacitor has such a structure that a dielectric is sandwiched between two electrodes that face to each other, and as the thickness of the dielectric is smaller (as the distance between the two facing electrodes is shorter) or as the dielectric constant of the dielectric is higher, the capacitance becomes higher. However, when the thickness of the dielectric is reduced in order to increase the capacitance of the capacitor, leakage current flowing between the two electrodes tends to be increased and the withstand voltage of the capacitor tends to be lowered.

A portion where a gate electrode, a gate insulating layer, and a semiconductor layer of a transistor overlap with each other functions as the above-described capacitor (hereinafter also referred to as "gate capacitor"). A channel is formed in a region in the semiconductor layer, which overlaps with the gate electrode with the gate insulating layer provided therebetween. In other words, the gate electrode and the channel formation region function as two electrodes of the capacitor, and the gate insulating layer functions as a dielectric of the capacitor. Although it is preferable that the capacitance of the gate capacitor be high, a reduction in the thickness of the gate insulating layer for the purpose of increasing the capacitance may cause an increase in the leakage current or a reduction in the withstand voltage.

In the case where a high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide is used for the gate insulating layer 204, even when the thickness of the gate insulating layer 204 is made thick, an enough capacitance between the gate electrode 202 and the semiconductor layer 205 can be ensured.

For example, in the case where a high-k material with a high dielectric constant is used for the gate insulating layer 204, even when the gate insulating layer 204 is made thick, a capacitance similar to that in the case of using silicon oxide for the gate insulating layer 204 can be obtained. This enables a reduction in leakage current between the gate electrode 202 and the semiconductor layer 205. Further, leakage current between a wiring formed from the same layer as the gate electrode 202 and another wiring that overlaps with the wiring can be reduced. Further, a stacked structure may be used in which a high-k material and one or more of silicon oxide, silicon oxynitride, silicon nitride, silicon nitride oxide, aluminum oxide, aluminum oxynitride, and gallium oxide are stacked. The thickness of the gate insulating layer 204 may be greater than or equal to 10 nm and less than or equal to 300 nm, preferably greater than or equal to 50 nm and less than or equal to 200 nm. For example, the gate insulating layer 204 may have a stacked structure in which a silicon nitride layer with a thickness of greater than or equal to 10 nm and less than or equal to 50 nm and a silicon oxynitride layer with a thickness of greater than or equal to 100 nm and less than or equal to 300 nm are stacked.

Further, the temperature in the formation of the gate insulating layer 204 is preferably as high as possible among temperatures that the substrate 200 and the gate electrode 202 (including a wiring formed from the same layer) can withstand. For example, for the gate insulating layer 204, a 100-nm-thick silicon oxynitride film is formed by a high-density plasma CVD method while the substrate 200 is heated to a temperature higher than or equal to 350° C. and lower than or equal to 450° C. The temperature in the formation of the gate insulating layer 204 is preferably constant. For example, the gate insulating layer 204 is formed while the substrate 200 is heated at 350° C.

Further, after the gate insulating layer 204 is formed, heat treatment may be performed under reduced pressure, a nitrogen atmosphere, a rare gas atmosphere, or an ultra-dry air atmosphere. By the heat treatment, the concentration of hydrogen, moisture, hydride, hydroxide, or the like contained in the gate insulating layer 204 can be reduced. The temperature of the heat treatment is preferably as high as possible among temperatures that the substrate 200 can withstand. Specifically, the heat treatment is preferably performed at a temperature higher than or equal to the film formation temperature of the gate insulating layer 204 and lower than or equal to the strain point of the substrate 200.

Note that the hydrogen concentration in the gate insulating layer 204 is preferably lower than $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$, further more preferably lower than or equal to $1 \times 10^{16}$ atoms/$cm^3$.

Further, in the case of using an oxide semiconductor for the semiconductor layer 205, it is preferable that the gate insulating layer 204 include oxygen in a portion which is in contact with the semiconductor layer 205. In particular, it is preferable that the gate insulating layer 204 include a large amount of oxygen that exceeds at least the stoichiometric composition in the layer (the bulk). For example, in the case where silicon oxide is used as the gate insulating layer 204, the composition formula is $SiO_{2+\alpha}$, ($\alpha>0$).

The gate insulating layer 204 can be formed by a sputtering method, an MBE method, a CVD method, a pulse laser deposition method, an ALD method, or the like as appropriate. Alternatively, a high-density plasma CVD method using microwaves (e.g., a frequency of 2.45 GHz) can be applied. The gate insulating layer 204 may be formed using a sputtering apparatus which performs film formation with surfaces of a plurality of substrates set substantially perpendicular to a surface of a sputtering target.

After the formation of the gate insulating layer 204, oxygen (including at least any one of oxygen radicals, oxygen atoms, and oxygen ions) may be introduced into the gate insulating layer 204 so that the gate insulating layer 204 is in an oxygen-excess state. For the introduction of oxygen, an ion implantation method, an ion doping method, a plasma immersion ion implantation method, plasma treatment performed under an oxygen atmosphere, or the like can be employed.

By introduction of oxygen, a bond between hydrogen and a constituent element of the gate insulating layer 204 or a bond between the constituent element and a hydroxyl group is cut, and the hydrogen or the hydroxyl group reacts with the oxygen, so that water is produced. Accordingly, heat treatment performed after introduction of oxygen facilitates elimination of hydrogen or the hydroxyl group which is an impurity as water. Therefore, heat treatment may be performed after introduction of oxygen into the gate insulating layer 204. After that, oxygen may be further introduced into the gate insulating layer 204 so that the gate insulating layer 204 is in an oxygen-excess state. The introduction of oxygen and the heat treatment may be performed alternately a plurality of times. The introduction of oxygen and the heat treatment may be performed at the same time.

In the case of using an oxide semiconductor in the semiconductor layer 205, the gate insulating layer 204 including a large (excessive) amount of oxygen, which serves as an oxygen supply source, is provided so as to be in contact with the semiconductor layer 205, so that oxygen can be supplied from the gate insulating layer 204 to the semiconductor layer 205. Heat treatment may be performed in the state where the semiconductor layer 205 and the gate insulating layer 204 are at least partly in contact with each other in order to supply oxygen to the semiconductor layer 205. By supply of oxygen to the semiconductor layer 205, oxygen vacancies in the semiconductor layer 205 can be reduced.

In this embodiment, silicon oxynitride is used for the gate insulating layer 204. Specifically, a layer of silicon oxynitride with a thickness of 100 nm is formed over the gate electrode 202.

Next, a semiconductor layer to be the semiconductor layer 205 is formed over the gate insulating layer 204. In this embodiment, an oxide semiconductor is used for the semiconductor layer 205. Note that planarization treatment may be performed on a region of the gate insulating layer 204 which the semiconductor layer 205 is to be formed in contact with, before the formation of the oxide semiconductor layer. As the planarization treatment, polishing treatment (e.g., chemical mechanical polishing (CMP) method), dry etching treatment, or plasma treatment can be used, though there is no particular limitation on the planarization treatment.

As plasma treatment, reverse sputtering in which an argon gas is introduced and plasma is generated can be performed. The reverse sputtering is a method in which voltage is applied to a substrate side with use of an RF power source under an argon atmosphere and plasma is generated near the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the gate insulating layer 204.

Further, as the planarization treatment, polishing treatment, dry etching treatment, or plasma treatment may be performed a plurality of times, or these treatments may be performed in combination. In the case where the treatments are performed in combination, there is no particular limitation on the order of steps and the order can be set as appropriate depending on the roughness of the surface of the gate insulating layer 204.

The oxide semiconductor can be deposited by a sputtering method, an evaporation method, a PCVD method, a PLD method, an ALD method, an MBE method, or the like. Note that the oxide semiconductor layer is preferably deposited under a condition such that a large amount of oxygen is contained (for example, by a sputtering method in an atmosphere where the proportion of oxygen is 100%) so as to be a film containing a large amount of oxygen (preferably including a region which contains an excessive amount of oxygen as compared to the stoichiometric composition of the oxide semiconductor in a crystalline state).

As a target for depositing the oxide semiconductor by a sputtering method, a target that contains a metal oxide containing In, Ga, and Zn at a composition of $In_2O_3:Ga_2O_3:ZnO=1:1:1$ [molar ratio] can be used, for example. Alternatively, a target having a composition where $In_2O_3:Ga_2O_3:ZnO=1:1:2$ [molar ratio], a target having a composition where $In_2O_3:Ga_2O_3:ZnO=1:1:4$ [molar ratio], or a target having a composition where $In_2O_3:Ga_2O_3:ZnO=2:1:8$ [molar ratio] can be used.

Furthermore, the relative density of a metal oxide target is greater than or equal to 90% and less than or equal to 100%, preferably greater than or equal to 95% and less than or equal to 99.9%. With the use of a metal oxide target having a high relative density, a dense oxide semiconductor film can be formed.

The oxide semiconductor film is formed with the substrate held in a film formation chamber kept under reduced pressure and with the substrate temperature set to a temperature higher than or equal to 100° C. and lower than or equal to 600° C., preferably higher than or equal to 300° C. and lower than or equal to 500° C.

By heating the substrate during the film formation, the concentration of impurities such as hydrogen, moisture, hydride, or hydroxide in the oxide semiconductor can be reduced. In addition, damage by sputtering can be reduced. Then, a sputtering gas from which hydrogen and moisture are removed is introduced into the deposition chamber while moisture remaining therein is removed, and the oxide semiconductor is formed with the use of the above target.

One example of the film formation condition is as follows: the distance between the substrate and the target is 100 mm, the pressure is 0.6 Pa, the power of the direct-current (DC) power source is 0.5 kW, and the atmosphere is an oxygen atmosphere (the proportion of the oxygen flow is 100%). Note that a pulsed direct-current power source is preferably used, in which case powder substances (also referred to as particles or dusts) that are generated in film formation can be reduced and the film thickness can be uniform.

Note that even when the sputtering apparatus is used, the oxide semiconductor may contain more than a little nitrogen in some cases. For example, the oxide semiconductor may contain nitrogen with a concentration of lower than $5 \times 10^{18}$ atoms/cm$^3$ in some cases.

The sputtering apparatus used for depositing the oxide semiconductor is described in detail below.

The leakage rate of a treatment chamber used for depositing an oxide semiconductor is preferably lower than or equal to $1 \times 10^{-10}$ Pa·m$^3$/second. Thus, entry of an impurity into a film to be formed by a sputtering method can be decreased.

In order to decrease the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1 \times 10^{-10}$ Pa·m$^3$/second.

In order to decrease external leakage, an open/close portion of the treatment chamber is preferably sealed with a metal gasket. For the metal gasket, a metal material covered with iron fluoride, aluminum oxide, or chromium oxide is preferably used. The metal gasket achieves higher adhesion than an O-ring, and can reduce the external leakage. Further, by using a metal material covered with iron fluoride, aluminum oxide, chromium oxide, or the like which is in the passive state, released gas containing hydrogen generated from the metal gasket is suppressed, so that the internal leakage can also be reduced.

As a member forming an inner wall of the treatment chamber, aluminum, chromium, titanium, zirconium, nickel, or vanadium, from which the amount of a released gas containing hydrogen is smaller, is used. An alloy material containing iron, chromium, nickel, and the like covered with the above-mentioned material may be used. The alloy material containing iron, chromium, nickel, and the like is rigid, resistant to heat, and suitable for processing. Here, surface unevenness of the member is decreased by polishing or the like to reduce the surface area, so that the released gas can be reduced. Alternatively, the above-mentioned member of the deposition apparatus may be covered with iron fluoride, aluminum oxide, chromium oxide, or the like which is in the passive state.

Furthermore, it is preferable to provide a gas refiner for a sputtering gas just in front of the treatment chamber into which a sputtering gas is introduced. The length of a pipe between the gas refiner and the treatment chamber is less than or equal to 5 m, preferably less than or equal to 1 m. When the length of the pipe is less than or equal to 5 m or less than or equal to 1 m, an influence of the released gas from the pipe can be reduced accordingly.

Evacuation of the treatment chamber is preferably performed with a roughing vacuum pump, such as a dry pump, and a high vacuum pump, such as a sputter ion pump, a turbo molecular pump, or a cryopump, in appropriate combination. In order to remove moisture remaining in the treatment chamber, an entrapment vacuum pump such as a cryopump, an ion pump, or a titanium sublimation pump is preferably used. The turbo molecular pump has an outstanding capability in evacuating a large-sized molecule, whereas it has a low capability in evacuating hydrogen or water. Further, combination with a cryopump having a high capability in evacuating water or a sputter ion pump having a high capability in evacuating hydrogen is effective. The evacuation unit may be a turbo molecular pump provided with a cold trap. In the treatment chamber which is evacuated with an entrapment vacuum pump such as a cryopump, a hydrogen atom, a compound containing a hydrogen atom such as water ($H_2O$) (further preferably, also a compound containing a carbon atom), and the like are removed, whereby the impurity concentration in the oxide semiconductor formed in the treatment chamber can be reduced.

An adsorbate present at the inner wall of the treatment chamber does not affect the pressure in the treatment chamber because it is adsorbed on the inner wall, but the adsorbate leads to release of gas at the time of the evacuation of the treatment chamber. Therefore, although the leakage rate and the evacuation rate do not have a correlation, it is important that the adsorbate present in the treatment chamber be desorbed as much as possible and evacuation be performed in advance with the use of a pump having high evacuation capability. Note that the treatment chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, removing the adsorbate while an inert gas is introduced makes it possible to further increase the rate of desorption of water or the like, which is difficult to desorb only by evacuation.

In a sputtering method, an RF power supply device, an AC power supply device, a DC power supply device, or the like can be used as a power supply device for generating plasma as appropriate. Note that a pulsed DC power source is preferably used because powder substances (also referred to as particles or dust) that are generated in deposition can be reduced and the film thickness can be uniform.

The thickness of the semiconductor layer 205 is greater than or equal to 1 nm and less than or equal to 100 nm, preferably greater than or equal to 5 nm and less than or equal to 50 nm. In this embodiment, as the semiconductor layer 205, a 35-nm-thick In—Ga—Zn-based oxide (IGZO) film is formed by a sputtering method using a sputtering apparatus including an AC power supply device (see FIG. 9B). Further, as the target, an In—Ga—Zn-based oxide target in an atomic ratio of In:Ga:Zn=1:1:1 (=1/3:1/3:1/3) is used. The deposition conditions are as follows: the atmosphere is oxygen and argon (the flow rate of oxygen is 50%), the pressure is 0.6 Pa, the electric power is 5 kW, and the substrate temperature is 170° C. The deposition rate under the deposition conditions is 16 nm/min.

The concentrations of alkali metals such as sodium (Na), lithium (Li), and potassium (K) in the oxide semiconductor are as follows. The concentration of Na is lower than or equal to $5 \times 10^{16}$ cm$^{-3}$, preferably lower than or equal to $1 \times 10^{16}$ cm$^{-3}$, further preferably lower than or equal to $1 \times 10^{15}$ cm$^{-3}$. The concentration of Li is lower than or equal to $5 \times 10^{15}$ cm$^{-3}$, preferably lower than or equal to $1 \times 10^{15}$ cm$^{-3}$. The concentration of K is lower than or equal to $5 \times 10^{15}$ cm$^{-3}$, preferably lower than or equal to $1 \times 10^{15}$ cm$^{-3}$.

Note that it has been pointed out that, because an oxide semiconductor is insensitive to impurities and thus there is no problem when a considerable amount of metal impurities is contained in the oxide semiconductor, soda-lime glass which contains a large amount of an alkali metal such as sodium and is inexpensive can also be used (Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633). However, such consideration is not appropriate. An alkali metal is not a constituent element of an oxide semiconductor, and therefore, is an impurity. Also, an alkaline earth metal is an impurity in the case where the alkaline earth metal is not a constituent element of an oxide semiconductor. When an insulating layer in contact with the oxide semiconductor layer is an oxide, an alkali metal, in particular, Na diffuses into the insulating layer and Na becomes Na$^+$. Further, in the oxide semiconductor layer, Na cuts or enters a bond between metal and oxygen which are included in an oxide semiconductor. As a result, for example, deterioration of characteristics of the transistor, such as a normally-on state of the transistor due to a shift of the threshold voltage in the negative direction, or a reduction in mobility, occurs. In addition, variation in characteristics also occurs. Such deterioration of transistor characteristics and variation in characteristics due to an impurity remarkably appear when the hydrogen concentration in the oxide semiconductor layer is very low. Therefore, the concentration of an alkali metal in the oxide semiconductor is strongly required to set at the above value in the case where the concentration of hydrogen in the oxide semiconductor is lower than or equal to $5\times10^{19}$ cm$^{-3}$, particularly lower than or equal to $5\times10^{18}$ cm$^3$.

An oxide semiconductor used for the semiconductor layer 205 preferably contains at least indium (In) or zinc (Zn). In particular, both In and Zn are preferably contained. As a stabilizer for reducing variation in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one kind or a plurality of kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, an In—Zn-based oxide, an In—Mg-based oxide, an In—Ga-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

As the oxide semiconductor, a material including an element J represented by a chemical formula $InJO_3(ZnO)_m$ (m>0) can be used. Here, J represents one or more metal elements selected from Zn, Ga, Al, Fe, Mn, and Co. As the oxide semiconductor, a material represented by $In_2SnO_5(ZnO)_n$ (n>0) may also be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3) or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition of the oxide semiconductor including indium is not limited to those described above, and a material having an appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a: b: c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor used for the semiconductor layer 205 is in a single crystal state, a polycrystalline (also referred to as polycrystal) state, an amorphous state, or the like.

The oxide semiconductor used for the semiconductor layer 205 is preferably a c-axis aligned crystalline oxide semiconductor (CAAC-OS).

The CAAC-OS is not completely single crystal nor completely amorphous. The CAAC-OS is an oxide semiconductor with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS is not clear. Further, with the TEM, a grain boundary in the CAAC-OS is not found. Thus, in the CAAC-OS, a reduction in electron mobility, due to the grain boundary, is suppressed.

In each of the crystal parts included in the CAAC-OS, a c-axis is aligned in a direction perpendicular to a surface on which the CAAC-OS is formed or a surface of the CAAC-OS, triangular or hexagonal atomic arrangement is formed when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°.

In the CAAC-OS, distribution of crystal parts is not necessarily uniform. For example, in the formation process of the CAAC-OS, in the case where crystal growth occurs from a surface side of the oxide semiconductor film, the proportion of crystal parts in the vicinity of the surface of the oxide semiconductor film is higher than that in the vicinity of the surface on which the oxide semiconductor film is formed in some cases. Further, when an impurity is added to the CAAC-OS, the crystal part in a region to which the impurity is added becomes amorphous in some cases.

Since the c-axes of the crystal parts included in the CAAC-OS are aligned in the direction perpendicular to the surface on which the CAAC-OS film is formed or a surface of the CAAC-OS film, the directions of the c-axes may be different from each other depending on the shape of the CAAC-OS film (the cross-sectional shape of the surface on which the CAAC-OS film is formed or the cross-sectional shape of the surface of the CAAC-OS film). Note that, when the CAAC-OS is formed, the direction of the c-axis of the crystal part is the direction perpendicular to the surface on which the CAAC-OS is formed or the surface of the CAAC-OS. The crystal part is formed by film formation or by performing treatment for crystallization such as heat treatment after film formation.

With the use of the CAAC-OS in a transistor, change in electrical characteristics of the transistor due to irradiation with visible light or ultraviolet light is small. Thus, the transistor has high reliability.

Note that part of oxygen included in the oxide semiconductor film may be substituted with nitrogen.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness (Ra) of less than or equal to 1 nm, preferably less than or equal to 0.3 nm, further preferably less than or equal to 0.1 nm. Ra can be measured using an atomic force microscope (AFM).

Note that since the transistor 111 in this embodiment is bottom-gate type, the gate electrode 202 exists under the gate insulating layer 204. Therefore, after the gate insulating layer 204 is formed over the gate electrode 202, planarization treatment such as CMP treatment may be performed on at least a surface of the gate insulating layer 204 overlapping with the gate electrode 202 in order to obtain a flat surface.

In the case of forming the semiconductor layer 205 using an In—Ga—Zn-based oxide material by a sputtering method, preferably, it is possible to use an In—Ga—Zn-based oxide target having an atomic ratio of In:Ga:Zn=1:1:1, 4:2:3, 3:1:2, 1:1:2, 2:1:3, or 3:1:4. When the semiconductor layer 205 is formed using an In—Ga—Zn-based oxide target having the aforementioned atomic ratio, a polycrystalline oxide semiconductor or a CAAC-OS is likely to be formed.

Further, before an oxide semiconductor to form the semiconductor layer 205 is deposited, heat treatment may be performed in a reduced pressure, a nitrogen atmosphere, a rare gas atmosphere, or an ultra-dry atmosphere. For example, the heat treatment may be performed in a nitrogen atmosphere at a temperature of higher than or equal to 350° C. and lower than or equal to 450° C. For example, the heat treatment is performed at 350° C. for 1 hour. By the heat treatment, impurities such as hydrogen, moisture, or hydrocarbon attached on the surface of the gate insulating layer 204 can be reduced. It is preferable to successively form the oxide semiconductor layer after the heat treatment without exposing the substrate 101 to the air.

It is preferable that the steps from formation of the gate insulating layer 204 to formation of the semiconductor layer 205 be performed successively without exposure to the air between the steps. Successive formation of the gate insulating layer 204 and the oxide semiconductor layer without exposure to the air between the steps can prevent impurities such as hydrogen, moisture, or hydrocarbon from adsorbing onto the surface of the gate insulating layer 204. In other words, the interface between the gate insulating layer 204 and the oxide semiconductor layer can be in a clean state, whereby the semiconductor device can have improved reliability.

Further, heat treatment may be performed on the semiconductor layer 205 in order to remove excess hydrogen (including water and a hydroxyl group) (to perform dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, a rare gas atmosphere, or the like.

In this embodiment, the substrate is introduced into an electric furnace which is one kind of heat treatment apparatuses, and the semiconductor layer 205 is subjected to heat treatment at a temperature higher than or equal to 350° C. and lower than or equal to 450° C. in a nitrogen atmosphere for 1 hour and then heat treatment at a temperature higher than or equal to 350° C. and lower than or equal to 450° C. in an atmosphere including nitrogen and oxygen for 1 hour. For example, the heat treatment is performed at 350° C. for 1 hour.

Note that the heat treatment apparatus used is not limited to an electric furnace, and a device for heating a processing object by heat conduction or heat radiation from a heating element such as a resistance heating element may alternatively be used. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating a processing object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with a processing object by the heat treatment, such as nitrogen or a rare gas like argon, is used.

For example, as the heat treatment, GRTA may be conducted as follows. The substrate is put in an inert gas heated to high temperature of 650° C. to 700° C., is heated for several minutes, and is taken out of the inert gas.

Note that in the heat treatment, it is preferable that moisture, hydrogen, and the like be not contained in the atmosphere of nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

The heat treatment for dehydration or dehydrogenation may cause elimination of oxygen which is a main component of an oxide semiconductor and a reduction of oxygen in the oxide semiconductor. An oxygen vacancy exists in a portion where oxygen is eliminated in the oxide semiconductor film, and a donor level which leads to a change in the electrical characteristics of a transistor is formed owing to the oxygen vacancy.

After the semiconductor layer 205 is heated by the heat treatment, a high-purity oxygen gas, a high-purity dinitrogen monoxide gas, or ultra-dry air (air with a moisture amount of less than or equal to 20 ppm (−55° C. by conversion into a dew point), preferably less than or equal to 1 ppm, or further preferably less than or equal to 10 ppb, in the case where measurement is performed with use of a dew point meter of a cavity ring down laser spectroscopy (CRDS) system) may be introduced into the same furnace. It is preferable that water, hydrogen, and the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). By the effect of the oxygen gas or the dinitrogen monoxide gas, oxygen which is a main component of the oxide semiconductor and which has been reduced at the same time as the step of removing impurities by the dehydration or dehydrogenation treatment is supplied, so that the semiconductor layer 205 can be a high-purity and i-type (intrinsic) semiconductor layer.

Further or alternatively, oxygen (which includes at least one of an oxygen radical, an oxygen atom, and an oxygen ion) may be introduced into the semiconductor layer 205 after the semiconductor layer 205 is subjected to the dehydration or dehydrogenation treatment to supply oxygen to the semiconductor layer 205.

For the introduction of oxygen, an ion implantation method, an ion doping method, a plasma immersion ion implantation method, plasma treatment performed under an atmosphere containing oxygen, or the like can be employed.

By introducing oxygen, a bond between a constituent element of the oxide semiconductor and hydrogen or a bond between the constituent element and a hydroxyl group is cut, and the hydrogen or the hydroxyl group is reacted with oxygen to produce water; this leads to easy elimination of hydrogen or a hydroxyl group that is an impurity, as water by the heat treatment performed later. Therefore, the heat treatment may be performed after the introduction of oxygen into the semiconductor layer 205, and then oxygen may be introduced into the semiconductor layer 205 to make the semiconductor layer 205 in an oxygen excess state. The introduction of oxygen and the heat treatment may be performed alternately a plurality of times. The introduction of oxygen and the heat treatment may be performed at the same time.

Introduction (supply) of oxygen into the dehydrated or dehydrogenated semiconductor layer 205 can make the semiconductor layer 205 be i-type (intrinsic). A transistor including the i-type (intrinsic) semiconductor layer 205 has a suppressed variation in electrical characteristics and is therefore electrically stable.

Note that the hydrogen concentration in the semiconductor layer 205 is preferably lower than $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$, and further more preferably lower than or equal to $1 \times 10^{16}$ atoms/cm$^3$.

The carrier density of the oxide semiconductor, in which hydrogen is reduced to a sufficiently low concentration so that the oxide semiconductor is purified and in which defect states in an energy gap due to oxygen deficiency are reduced by enough supply of oxygen, is lower than $1 \times 10^{12}$/cm$^3$, preferably lower than $1 \times 10^{11}$/cm$^3$, and further preferably lower than $1.45 \times 10^{10}$/cm$^3$. For example, the off-state current (per unit channel width (1 μm) here) at room temperature (25° C.) is 100 zA (1 zA (zeptoampere) is $1 \times 10^{-21}$ A) or less, preferably 10 zA or less. The off-state current at 85° C. is 100 zA ($1 \times 10^{-19}$ A) or less, preferably 10 zA ($1 \times 10^{-20}$ A) or less. The transistor with very excellent off-state current characteristics can be obtained with the use of such an i-type (intrinsic) or substantially i-type oxide semiconductor.

The electrical characteristics, such as the threshold voltage and the on-state current, of a transistor including the i-type (intrinsic) or substantially i-type semiconductor have almost no temperature dependence. Further, the transistor characteristics hardly change due to light deterioration.

As described above, variation in electrical characteristics of a transistor including a purified and i-type (intrinsic) oxide semiconductor obtained by reducing oxygen vacancies is suppressed and thus, the transistor is electrically stable. Accordingly, a liquid crystal display device which has high reliability and stable electrical characteristics can be provided.

Next, a conductive layer to be processed into the source electrode 206a, the drain electrode 206b, and the wiring 216_j is formed over the semiconductor layer 205. The conductive layer for forming the source electrode 206a, the drain electrode 206b, and the wiring 216_j can be formed using a material and a method similar to those of the gate electrode 202. The conductive layer for forming the source electrode 206a, the drain electrode 206b, and the wiring 216_j may be formed using a conductive metal oxide. As the conductive metal oxide, indium oxide, tin oxide, zinc oxide, indium tin oxide (abbreviated to ITO), indium zinc oxide, or any of these metal oxide materials in which silicon oxide is contained can be used.

In this embodiment, the conductive layer is formed by a sputtering method by stacking a titanium layer with a thickness of 100 nm, an aluminum layer with a thickness of 400 nm, and a titanium layer with a thickness of 100 nm. Then, the source electrode 206a, the drain electrode 206b, and the wiring 216_j are formed by a second photolithography process (see FIG. 9C).

Note that the conductive layer can be etched by a method similar to that for forming the gate electrode 202. In this embodiment, two layers of the upper titanium film and the aluminum film are etched under first etching conditions and then the lower titanium film is etched under second etching conditions. The first etching conditions are as follows: an etching gas ($BCl_3$: $Cl_2$=750 sccm: 150 sccm) is used, the bias power is 1500 W, the ICP power is 0 W, and the pressure is 2.0 Pa. The second etching conditions are as follows: an etching gas ($BCl_3$: $Cl_2$=700 sccm: 100 sccm) is used, the bias power is 750 W, the ICP power is 0 W, and the pressure is 2.0 Pa.

At this time, a constituent element in the conductive layer, an element in the treatment chamber, and a constituent element of an etching gas or etchant used for the etching may be attached as impurities to the surfaces of the semiconductor layer 205 which are exposed due to the formation of the source electrode 206a, the drain electrode 206b, and the wiring 216_j in some cases.

Such attachment of the impurities tends to bring about an increase in off-state current of the transistor or the deteriority of the electrical characteristics of the transistor. Further, a parasitic channel tends to be formed in the semiconductor layer 205, which leads to electrical connection of electrodes or wirings, which need be electrically isolated from each other, through the semiconductor layer 205.

Further, depending on the impurities, the impurities may enter a vicinity of the surface or the side surface of the semiconductor layer 205 to extract oxygen from the semiconductor layer 205, so that oxygen vacancies may be generated in the vicinity of the surface or the side surface of the semiconductor layer 205. For example, chlorine or boron contained in the above-described etching gas or aluminum which is a component material in the treatment chamber may cause a reduction in resistance of the semiconductor layer 205 (lead to make the semiconductor layer 205 n-type).

Thus, in one embodiment of the present invention, cleaning treatment for removing impurities (treatment for removing impurities) which are attached to the surfaces or the side surfaces of the oxide semiconductor layer 205 is performed after the etching for forming the source electrode 206a and the drain electrode 206b is performed.

As the treatment for removing impurities, plasma treatment or treatment using a solution can be used. As the plasma treatment, oxygen plasma treatment, dinitrogen monoxide plasma treatment, or the like can be used. Further, a rare gas (a typical example thereof is argon) can be used for the plasma treatment.

Further, for the cleaning treatment using a solution, an alkaline solution such as a TMAH solution, water, or an acidic solution such as diluted hydrofluoric acid can be used. For example, when diluted hydrofluoric acid is used, 50 wt % hydrofluoric acid is diluted with water to approximately $1/10^2$ to $1/10^5$, preferably approximately $1/10^3$ to $1/10^5$. That is, diluted hydrofluoric acid having a concentration of 0.5 wt % to $5 \times 10^{-4}$ wt %, preferably $5 \times 10^{-2}$ wt % to $5 \times 10^{-4}$ wt %, is used for the cleaning treatment. By the cleaning treatment, the above-described impurities attached to the surface of the semiconductor layer 205 can be removed.

Further, with the treatment for removing impurities using a diluted hydrofluoric acid solution, the surfaces of the semiconductor layer 205 can be etched. That is, impurities attached to the surfaces of the semiconductor layer 205 or impurities entering the vicinity of the surfaces of the semiconductor layer 205 can be removed together with part of the semiconductor layer 205. Accordingly, regions of the semiconductor layer 205 which overlap with the source electrode 206a, the drain electrode 206b, or the wiring 216_j may be thicker than the other region of the semiconductor layer 205 which does not overlap with any of the source electrode 206a, the drain electrode 206b, and the wiring 216_j. For example, an IGZO film is processed with $1/10^3$ diluted hydrofluoric acid (0.05 wt % hydrofluoric acid), so that the thickness of the IGZO film is reduced by 1 to 3 nm per second. In the case of processing an IGZO film with $2/10^5$ diluted hydrofluoric acid (0.0025 wt % hydrofluoric acid), the thickness of the IGZO film is reduced by approximately 0.1 nm per second.

By performing the treatment for removing impurities, the peak chlorine concentration at the surfaces of the semiconductor layer by SIMS can be reduced to be lower than or equal to $1 \times 10^{19}/cm^3$ (preferably lower than or equal to $5 \times 10^{18}/cm^3$, further preferably lower than or equal to $1 \times 10^{18}/cm^3$). The boron concentration at the surfaces of the semiconductor layer can be reduced to be lower than or equal to $1 \times 10^{19}/cm^3$ (preferably lower than or equal to $5 \times 10^{18}/cm^3$, further preferably lower than or equal to $1 \times 10^{18}/cm^3$). The aluminum concentration at the surfaces of the semiconductor layer can be reduced to be lower than or equal to $1 \times 10^{19}/cm^3$ (preferably lower than or equal to $5 \times 10^{18}/cm^3$, further preferably lower than or equal to $1 \times 10^{18}/cm^3$).

The treatment for removing impurities enables a highly reliable transistor having stable electric characteristics.

Next, the layer 207 is formed over the source electrode 206a, the drain electrode 206b, and the wiring 216_j (see FIG. 10A). The layer 207 functions as a protective layer and can be formed using a material and a method similar to those of the gate insulating layer 204 or the base layer 201. In the case of using an oxide semiconductor for the semiconductor layer 205, it is preferable that the layer 207 include oxygen in a portion that is in contact with the semiconductor layer 205. In particular, it is preferable that the layer 207 include a large amount of oxygen that exceeds at least the stoichiometric composition in the film (the bulk).

Further, before the formation of the layer 207, moisture or an organic substance which is attached to surfaces is preferably removed by performing oxygen plasma treatment, dinitrogen monoxide plasma treatment, or the like. The layer 207 is preferably formed successively without exposure to the air after oxygen plasma treatment, dinitrogen monoxide plasma treatment, or the like is performed.

As a material of the layer 207, an oxide insulating material containing at least one of In and Zn or an oxide semiconductor material having a higher insulating property than the semiconductor layer 205 can be used.

For example, an In-M-Zn-based oxide which contains the element M and is represented by the chemical formula $InMZnO_X$ (X>0) can be used for the layer 207. At this time, an element by which the layer 207 is provided with a higher insulating property than the semiconductor layer 205 is used as the element M. For example, as the element M, a metal element to produce a quadrivalent ion, such as titanium (Ti), zirconium (Zr), or hafnium (Hf), which is a Group 4A element; cerium, which is a Group 3A element; or germanium (Ge), which is a Group 4B element, can be used.

A quadrivalent metal element has one more bonds than a trivalent metal element (e.g., Ga), and has greater bonding strength to oxygen than the trivalent metal element; thus, the In-M-Zn-based oxide can have an improved insulating property. For example, an In—Zr—Zn-based oxide which contains Zr as the element M has a greater energy gap than an In—Ga—Zn-based oxide which has an energy gap of approximately 3.2 eV, and thus has a higher insulating property than the In—Ga—Zn-based oxide.

Note that a Group 3A element can also be used as long as it is an element that can improve an insulating property. As an example of such an element, yttrium (Y) can be given. Yttrium has lower electronegativity than Ga, and can bond more strongly to oxygen in the oxide semiconductor.

Note that in this specification, the term "energy gap" has the same meaning as a "band gap" or a "forbidden band". The value obtained by measuring a film consisting of a material with an ellipsometer is used as the value of the band gap.

In the In-M-Zn-based oxide, the content of the element M is greater than or equal to 0.3 times and smaller than 1.3 times that of In. Further, in the In-M-Zn-based oxide, the content of the element M is greater than or equal to 0.3 times and smaller than 1.3 times that of Zn. As the number of In or Zn is relatively reduced as compared to that of the element M, an insulating property can be improved.

Specifically, when a metal oxide material containing the element M is formed by a sputtering method, a metal oxide target containing In, M, and Zn in an atomic ratio of 1:1:1, 3:1:3, 3:2:4, 2:1:3, 4:5:4, or 4:2:3 is used.

Further, an In-$M_1$-$M_2$-Zn-based oxide can be used for the layer 207. Specifically, in the material, the element $M_1$ is a metal element to produce a trivalent ion, and one or more of the metal elements are substituted with one or more of metal elements to produce a quadrivalent ion. Since a quadrivalent metal element has one more bonds than a trivalent metal element, the substitution with the element $M_2$ makes bonding strength to oxygen stronger and suppresses generation of oxygen vacancies. That is, by increasing the proportion of the element $M_2$ to the element $M_1$, the insulating property of the material can be improved.

As the element $M_1$, gallium (Ga), which is a Group 3B element, can be used for example. As the element $M_2$, titanium (Ti), zirconium (Zr), or hafnium (Hf), which is a Group 4A element; cerium, which is a Group 3A element; germanium (Ge), which is a Group 4B element; or the like can be used. Note that the above material is non-single crystal.

A trivalent metal element can also be used as the element $M_2$ as long as it is an element which enables an insulating property to be improved. As an example of such an element, yttrium (Y), which is a Group 3A element, can be given. Since yttrium has lower electronegativity than Ga, yttrium can strongly bond to oxygen in the oxide semiconductor, which improves the insulating property.

Further, in the above material, the amount of a heavy-metal impurity other than the constituent elements is little, and the purity of the above material is greater than or equal to 3N, preferably greater than or equal to 4N.

In this embodiment, an In-$M_1$-$M_2$-Zn-based oxide is formed as the layer 207 using a target containing In, Zr, Ga, and Zn in an atomic ratio of 3:0.05:0.95:2 by a sputtering method.

The In-M-Zn-based oxide or the In-$M_1$-$M_2$-Zn-based oxide enables the condition of the interface with the semiconductor layer 205 to be good, which leads to good characteristics of the transistor. Further, such an oxide semiconductor having a higher insulating property than the semiconductor layer 205 is used for the layer 207, so that a parasitic channel is not formed and thus, variation in threshold voltage due to charge buildup of the insulating layer is suppressed. As the oxide semiconductor having a higher insulating property than the semiconductor layer 205, any material represented by the above chemical formula can be used.

In the case of forming a layer of an oxide semiconductor having a higher insulating property than the semiconductor layer 205 over or under the semiconductor layer 205, variation in threshold voltage due to charge buildup of the insulating layer can be suppressed without forming a parasitic channel. Thus, deterioration in transistor characteristics or damage to the transistor owing to static electricity or the like can be prevented. Accordingly, a semiconductor device can be manufactured at high yield, so that productivity of the semiconductor device can be improved. Further, reliability of the semiconductor device can be improved. As the oxide semiconductor having a higher insulating property than the semiconductor layer 205, any of the materials represented by the above chemical formulae can be used.

Further for example, the gate insulating layer 204 can have a stacked structure including a gate insulating layer 204a and a gate insulating layer 204b (not shown). One of the gate insulating layer 204a and the gate insulating layer 204b may be formed using a material and a method similar to those of the base layer 201 or the gate insulating layer 204, and the other of the gate insulating layer 204a and the gate insulating layer 204b may be formed using the In-M-Zn-based oxide or the In-$M_1$-$M_2$-Zn-based oxide.

In the case of forming a layer using the In-M-Zn-based oxide or the In-$M_1$-$M_2$-Zn-based oxide over and under the semiconductor layer 205, reliability of the semiconductor device can be further improved.

After the formation of the layer 207, oxygen (including at least any one of oxygen radicals, oxygen atoms, and oxygen ions) may be introduced and supplied to the layer 207. Oxygen may be directly introduced into the layer 207 or introduced into the layer 207 through another layer. When oxygen is introduced into the layer 207 through another layer, an ion implantation method, an ion doping method, a plasma immersion ion implantation method, or the like may be used. On the other hand, when oxygen is directly introduced into the layer 207, in addition to the above methods, plasma treatment performed under an oxygen atmosphere, or the like can alternatively be employed.

By the introduction of oxygen, a bond between a constituent element of the layer 207 and hydrogen or a bond between the constituent element and a hydroxyl group is cut, and the hydrogen or the hydroxyl group reacts with oxygen to produce water; this leads to easy elimination of hydrogen or a hydroxyl group that is an impurity, in the form of water by heat treatment performed after the introduction of oxygen. In other words, the concentration of impurities in the layer 207 can be further reduced. Therefore, heat treatment may be performed after the introduction of oxygen into the layer 207, and then oxygen may be further introduced into the layer 207 to make the layer 207 in an oxygen excess state. The introduction of oxygen and the heat treatment may be performed alternately a plurality of times. The introduction of oxygen and the heat treatment may be performed at the same time.

Note that the hydrogen concentration in the layer 207 is preferably lower than $5\times10^{18}$ atoms/cm$^3$, further preferably lower than or equal to $1\times10^{18}$ atoms/cm$^3$, still further preferably lower than or equal to $5\times10^{17}$ atoms/cm$^3$, and furthermore preferably lower than or equal to $1\times10^{16}$ atoms/cm$^3$.

Further, before the formation of the layer 207, moisture or an organic substance which is attached to the surfaces is preferably removed by oxygen plasma treatment, dinitrogen monoxide plasma treatment, or the like. The layer 207 is preferably formed successively without exposure to the air after the oxygen plasma treatment, the dinitrogen monoxide plasma treatment, or the like is performed.

After the layer 207 is formed, heat treatment may be performed under a nitrogen atmosphere, a rare gas atmosphere, an oxygen atmosphere, a mixed gas atmosphere of nitrogen and oxygen, a mixed gas atmosphere of rare gas and oxygen, or the like. In this embodiment, heat treatment is performed at 300° C. for one hour under a mixed gas atmosphere of nitrogen and oxygen.

Next, a resist mask is formed by a third photolithography process, and part of the layer 207 over the drain electrode 206b is selectively removed, so that the contact hole 208 is formed. In addition, part of the layer 207 over the wiring 216_j in the cross section K1-K2 is selectively removed, so that the contact hole 220 is formed. Over the wiring 212_i in the cross section J1-J2, part of the layer 207, part of the semiconductor layer 205, and part of the gate insulating layer 204 are selectively removed, so that the contact hole 219 is formed (see FIG. 10B). Although not illustrated, by the third photolithography process, the groove portions 230 are formed in a manner similar to that of the contact hole 219. Therefore, at the side surface of the groove portions 230, side surfaces of the layer 207, the semiconductor layer 205, and the gate insulating layer 204 are exposed.

For the etching of the layer 207, the semiconductor layer 205, and the gate insulating layer 204, either dry etching or wet etching or both of them may be used. For example, a gas containing chlorine (a chlorine-based gas such as chlorine ($Cl_2$), boron trichloride ($BCl_3$), silicon tetrachloride ($SiCl_4$), or carbon tetrachloride ($CCl_4$)) can be employed as an etching gas used for the dry etching.

As the dry etching, a parallel-plate reactive ion etching (RIE) method, an inductively coupled plasma (ICP) etching method, or the like can be used. Since the base layer 201 has a function of preventing diffusion of an impurity element from the substrate 200, for the above etching, etching conditions are preferably adjusted so as to etch the base layer 201 as little as possible.

In general, etching of the semiconductor layer and formation of the contact hole are separately performed through independent photolithography processes; according to the manufacturing process of this embodiment, etching of the semiconductor layer and formation of the contact hole can be performed by one photolithography process. Therefore, not only the number of photomasks but also the number of photolithography processes can be reduced. That is, a liquid crystal display device can be manufactured with a small number of photolithography processes, at low cost with high productivity.

In addition, according to the manufacturing process of this embodiment, a photoresist is not directly formed on the channel formation region of the semiconductor layer 205. In particular, in the case of using an oxide semiconductor for the semiconductor layer 205, since the channel formation region of the semiconductor layer 205 is protected by the layer 207, moisture is not attached to the channel formation region of the semiconductor layer 205 in later separation of the photoresist and cleaning steps; thus, variation in characteristics of the transistor 111 is reduced and the reliability is increased.

Next, a light-transmitting conductive layer (also referred to as a transparent conductive layer) that is to be processed into the pixel electrode 210, the electrode 221, and the electrode 222 is formed with a thickness of more than or equal to 30 nm and less than or equal to 200 nm, preferably more than or equal to 50 nm and less than or equal to 100 nm, over the layer 207 by a sputtering method, a vacuum evaporation method, or the like (see FIG. 10C).

For the light-transmitting conductive layer, a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added can be used. Alternatively, a material formed of one to ten graphene sheets may be used.

In this embodiment, an example of a manufacturing method of a pixel portion of a transmissive liquid crystal display device has been described. However, without limitation thereto, an embodiment of present invention can be applied to a pixel portion of a reflective or semi-transmissive liquid crystal display device as well. In the case of obtaining a pixel portion of a reflective liquid crystal display device, the pixel electrode may be formed using a conductive layer with high light reflectance (also referred to as a reflective conductive layer), for example, using a metal having high visible-light reflectance, such as aluminum, titanium, silver, rhodium, or nickel; an alloy containing at least one of the above metals; or stacked layers of the above materials. In the case of obtaining a pixel portion of a semi-transmissive liquid crystal display device, one pixel electrode is formed using a transparent conductive layer and a reflective conductive layer and provided with a transmissive portion and a reflective portion.

In this embodiment, an ITO layer with a thickness of 80 nm is formed as the light-transmitting conductive layer. By a fourth photolithography process, a resist mask is formed, and the light-transmitting conductive layer is selectively etched; thus, the pixel electrode 210, the electrode 221, and the electrode 222 are formed.

The pixel electrode 210 is electrically connected to the drain electrode 206b through the contact hole 208. The electrode 221 is electrically connected to the wiring 212_i through the contact hole 219. Further, the electrode 222 is electrically connected to the wiring 216_j through the contact hole 220.

In addition, in the contact hole 219 and the contact hole 220 formed in the terminal portion 103 and the terminal portion 104, it is important that the wiring 212_i and the wiring 216_j be not kept in an exposed state and be covered with a conductive oxide material such as ITO. If the wiring 212_i and the wiring 216_j which are metal layers are kept in an exposed state, exposed surfaces are oxidized and contact resistance with an FPC or the like is increased. The increase in contact resistance causes distortion in waveform or delay of a signal that is input from the outside, and a signal from the outside cannot be transmitted correctly, so that the reliability of the semiconductor device is lowered. By covering the exposed surfaces of the wiring 212_i and the wiring 216_j with a conductive oxide material such as ITO, the increase in contact resistance can be prevented, and the reliability of the semiconductor device can be improved.

With this embodiment, a semiconductor device can be manufactured through a smaller number of photolithography processes than the conventional one. Therefore, a liquid crystal display device can be manufactured at low cost with high productivity. Further, with this embodiment, a highly reliable semiconductor device with little deterioration in electrical characteristics can be manufactured. Thus, a highly reliable liquid crystal display device can be manufactured.

Although the description in this embodiment has been given taking a bottom-gate transistor as an example, this embodiment can also be applied to a top-gate transistor.

This embodiment can be implemented in appropriate combination with the structures described in the other embodiments.

(Embodiment 2)

Figure 11A:
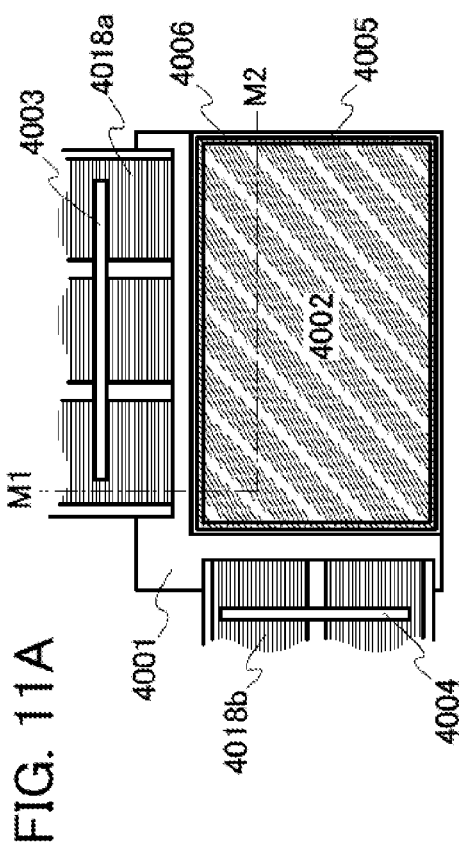
FIGS. 11A and 11B illustrate an embodiment of the present invention.
Figure 11B:
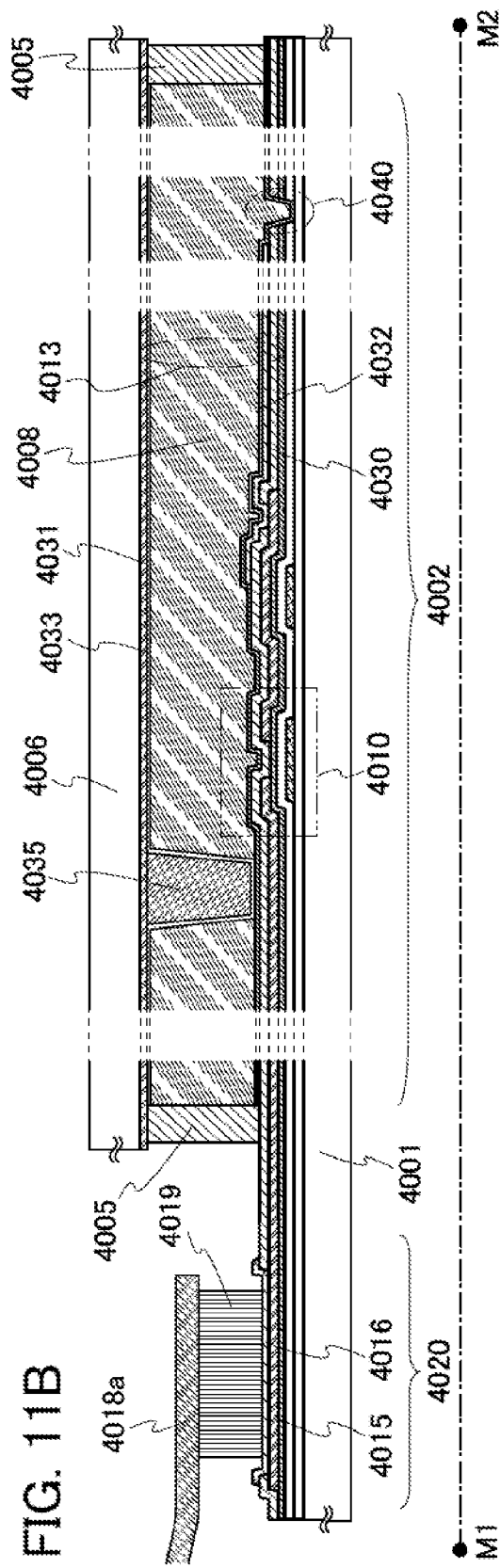

An embodiment of a liquid crystal display device that uses the semiconductor device described in Embodiment 1 is illustrated in FIGS. 11A and 11B.

FIG. 11A is a plan view of a panel in which a transistor 4010 and a liquid crystal element 4013 are sealed between a first substrate 4001 and a second substrate 4006 with a sealant 4005. FIG. 11B is a cross-sectional view taken along line M1-M2 in FIG. 11A. A groove portion 4040 is provided over the first substrate 4001.

The sealant 4005 is provided so as to surround a pixel portion 4002 provided over the first substrate 4001, and the second substrate 4006 is provided over the pixel portion 4002. Accordingly, the pixel portion 4002 is sealed together with a liquid crystal layer 4008 by the first substrate 4001, the sealant 4005, and the second substrate 4006.

Further, an input terminal 4020 is provided in a region over the first substrate 4001 and outside a region surrounded by the sealant 4005, and flexible printed circuits (FPCs) 4018a and 4018b are connected to the input terminal 4020. The FPC 4018a is electrically connected to a signal line driver circuit 4003 formed over a different substrate, and the FPC 4018b is electrically connected to a scan line driver circuit 4004 formed over a different substrate. Signals and potentials to the pixel portion 4002 are supplied from the signal line driver circuit 4003 and the scan line driver circuit 4004 through the FPC 4018a and the FPC 4018b.

Note that a connection method of a driver circuit which is separately formed over a different substrate is not particularly limited, and a chip on glass (COG) method, a wire bonding method, a tape carrier package (TCP) method, or the like can be used.

Although not shown, the signal line driver circuit 4003 or the scan line driver circuit 4004 may be provided over the substrate 4001 with the use of the transistor disclosed in this specification.

As a display element provided in the display device, a liquid crystal element (also referred to as a liquid crystal display element) can be used. Furthermore, a display medium whose contrast is changed by an electric effect, such as electronic ink, can be used.

The display device illustrated in FIGS. 11A and 11B includes an electrode 4016 and a wiring 4015. The electrode 4016 and the wiring 4015 are electrically connected to a terminal included in the FPC 4018a via an anisotropic conductive layer 4019.

The electrode 4016 is formed from the same conductive layer as a first electrode 4030, and the wiring 4015 is formed from the same conductive layer as a source and a drain electrode of the transistor 4010.

In this embodiment, the transistor described in Embodiment 1 can be applied to the transistor 4010. The transistor 4010 provided in the pixel portion 4002 is electrically connected to a display element to form a display panel. A variety of display elements can be used for the display element as long as display can be performed.

FIGS. 11A and 11B illustrate an example of a display device in which a liquid crystal element is used as a display element. In FIGS. 11A and 11B, the liquid crystal element 4013 which is a display element includes the first electrode 4030, a second electrode 4031, and the liquid crystal layer 4008. Note that an insulating layer 4032 and an insulating layer 4033 that serve as alignment films are provided so that the liquid crystal layer 4008 is provided therebetween. The insulating layer 4032 functioning as an alignment film is also provided over the groove portion 4040. The second electrode 4031 is formed on the second substrate 4006 side. The first electrode 4030 and the second electrode 4031 are stacked with the liquid crystal layer 4008 provided therebetween.

A spacer 4035 is a columnar spacer which is formed over the second substrate 4006 using an insulating layer and is provided to control the thickness of the liquid crystal layer 4008 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal exhibiting a blue phase and a chiral agent has a short response time of 1 msec. or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is higher than or equal to $1 \times 10^9$ Ω·cm, preferably higher than or equal to $1 \times 10^{11}$ Ω·cm, more preferably higher than or equal to $1 \times 10^{12}$ Ω·cm. The value of the specific resistivity in this specification is measured at 20° C.

The size of storage capacitor formed in the liquid crystal display device is set considering the leakage current of the transistor provided in the pixel portion or the like so that electric charge can be held for a predetermined period. By using the transistor described in the above embodiment including an i-type (intrinsic) or substantially i-type oxide semiconductor in a semiconductor layer in which a channel is formed, it is enough to provide a storage capacitor having capacitance that is less than or equal to ⅓, preferably less than or equal to ⅕ of liquid crystal capacitance of each pixel.

In the transistor described in the above embodiment, including an oxide semiconductor in a semiconductor layer in which a channel is formed, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption. In addition, in the transistor including an i-type (intrinsic) or substantially i-type oxide semiconductor in a semiconductor layer in which a channel is formed, a potential applied to the liquid crystal element can be held even when a storage capacitor is not provided.

In the case of forming a layer of an oxide semiconductor material having a higher insulating property than the semiconductor layer over or under the semiconductor layer in which a channel is formed, variation in threshold voltage due to charge buildup of the insulating layer can be suppressed without forming a parasitic channel. Accordingly, a liquid crystal display device with excellent display quality can be provided.

Further, in the case where a layer in contact with the semiconductor layer in which a channel is formed is formed of an oxide semiconductor having a higher insulating property than the semiconductor layer, the state of the interface between the semiconductor layer and the layer in contact with the semiconductor layer can be kept favorable. Accordingly, a highly reliable liquid crystal display device with stable electrical characteristics can be provided.

The field-effect mobility of the transistor including an oxide semiconductor in a semiconductor layer in which a channel is formed can be relatively high, which enables high-speed operation of the liquid crystal display device. Therefore, by using the above-described transistor in a pixel portion of a liquid crystal display device, it becomes easier to apply a driving technique so-called double-frame rate driving. In the double-frame rate driving, the vertical synchronizing frequency is 1.5 times or more, preferably 2 times or more as high as a usual vertical synchronizing frequency, whereby afterimages, blurring of moving images, and the like that are problems in displaying moving images can be reduced. Therefore, a liquid crystal display device with high display quality can be provided.

In addition, since the transistors can be separately provided in a driver circuit portion and a pixel portion over one substrate, the number of components of the liquid crystal display device can be reduced. Therefore, productivity of the liquid crystal display device can be increased.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. Here, the vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super view (ASV) mode, and the like can be used. Moreover, it is possible to use a method called domain multiplication or multi-domain design, in which a pixel is divided into some regions (subpixels) and molecules are aligned in different directions in their respective regions.

In the liquid crystal display device, a black matrix (a light-blocking layer); an optical member (an optical substrate) such as a polarizing member, a retardation member, or an anti-reflection member; and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; can be used. Further, the sizes of display regions may be different between respective dots of color elements. However, one embodiment of the present invention is not limited to a liquid crystal display device for color display and can be applied to a liquid crystal display device for monochrome display.

In FIGS. 11A and 11B, a flexible substrate as well as a glass substrate can be used as any of the first substrate 4001 and the second substrate 4006. For example, a light-transmitting plastic substrate or the like can be used. As plastic, a fiber-glass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A transmissive liquid crystal display device displays an image by transmitting light from a light source or a display element. Therefore, the substrate and the thin films such as the insulating layer and the conductive layer provided for the pixel portion where light is transmitted preferably have light-transmitting properties with respect to light in the visible-light wavelength range.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

Any of the first electrode 4030 and the second electrode 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added. Alternatively, a material including one to ten graphene sheets may be used.

One of the first electrode 4030 and the second electrode 4031 can be formed using one or a plurality of kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition including a conductive high molecule (also referred to as a conductive polymer) can be used for the first electrode 4030 and the second electrode 4031. As the conductive high molecule a so-called π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Further, since a transistor is easily broken by static electricity or the like, a protection circuit is preferably provided. The protection circuit is preferably formed using a non-linear element.

As described above, by using the transistor described in the above embodiment, a liquid crystal display device with high reliability can be provided. Note that the transistor described in the above embodiment can be applied to not only semiconductor devices having display functions but also semiconductor devices having a variety of functions, such as a power device which is mounted on a power supply circuit, a semiconductor integrated circuit such as LSI, and a semiconductor device having an image sensor function of reading information of an object.

This embodiment can be implemented in appropriate combination with the structures described in the other embodiments.

(Embodiment 3)

In this embodiment, as an example of a semiconductor device formed through a process in which the number of photomasks and the number of photolithography processes are reduced, an example of a semiconductor device that can be used in an active matrix EL display device and a manufacturing method thereof will be described with reference to FIG. 12 to FIGS. 19A to 19C.

Figure 17A:
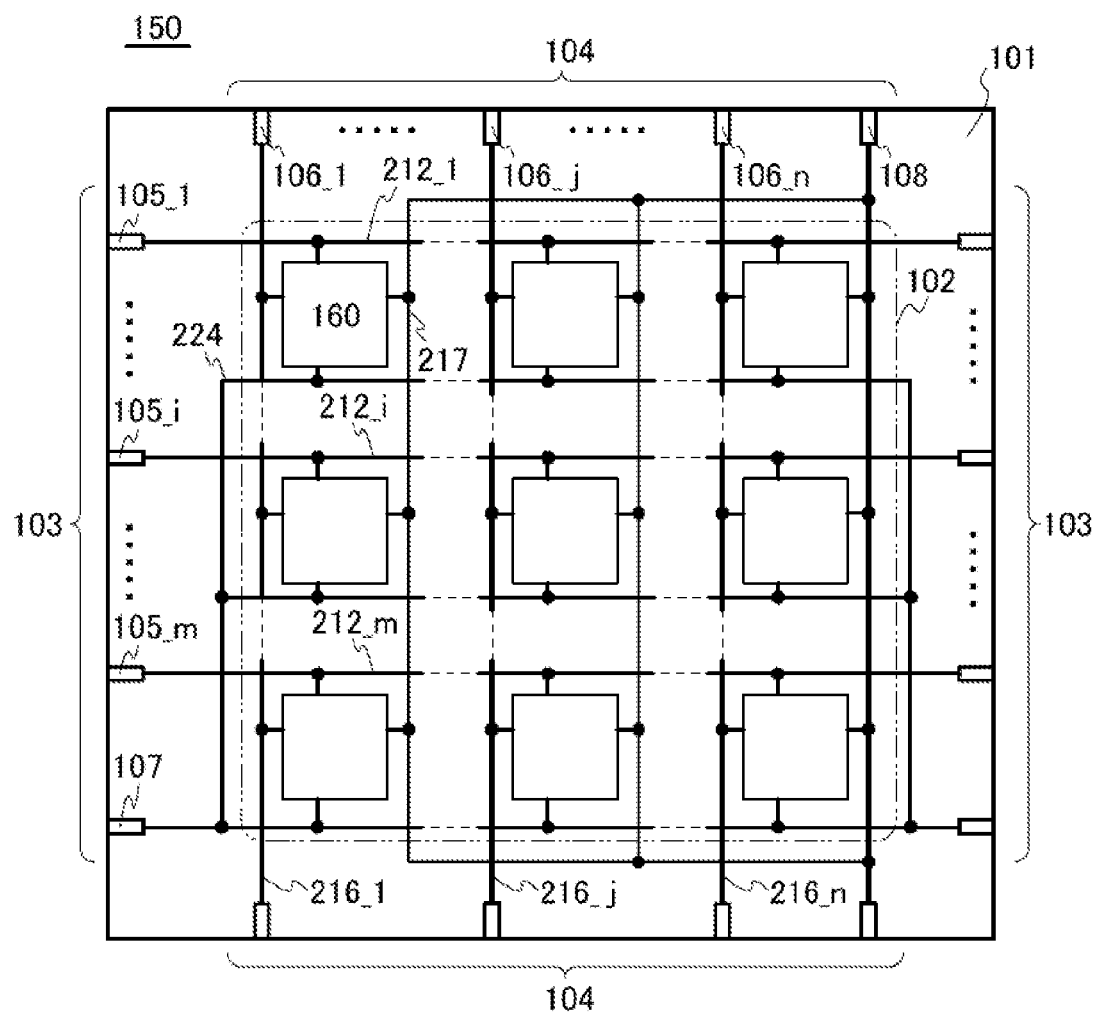
FIGS. 17A and 17B are circuit diagrams illustrating an embodiment of the present invention.

An example of the configuration of a semiconductor device 150 that can be used in an EL display device will be described with reference to FIG. 17A. The semiconductor device 150 includes a pixel region 102, terminal portions 103 each including m terminals 105_1 to 105_$m$ (m is an integer of greater than or equal to 1) and a terminal 107, and terminal portions 104 each including n terminals 106_1 to 106_$n$ (n is an integer of greater than or equal to 1) and a terminal 108, over a substrate 101. Further, the semiconductor device 150 includes m wirings 212_1 to 212_$m$ electrically connected to the terminal portions 103, a wiring 224, n wirings 216_1 to 216_$n$ electrically connected to the terminal portions 104, and a wiring 217. The pixel region 102 includes a plurality of pixels 160 arranged in a matrix of m rows and n columns. A pixel 160$(i,j)$ in the i-th row and the j-th column (i is an integer of greater than or equal to 1 and less than or equal to m, and j is an integer of greater than or equal to 1 and less than or equal to n) is electrically connected to a wiring 212_$i$ and a wiring 216_$j$. In addition, each pixel is electrically connected to the wiring 224 serving as a wiring to which one of a potential of an anode and a potential of a cathode is supplied, and is also electrically connected to the wiring 217 serving as a wiring to which the other of the potential of the anode and the potential of the cathode is supplied. The wiring 224 is electrically connected to the terminal 107, and the wiring 217 is electrically connected to the terminal 108. The wiring 212_i is electrically connected to a terminal 105_i, and the wiring 216_j is electrically connected to a terminal 106_j.

The terminal portions 103 and the terminal portions 104 are external input terminals and are connected to external control circuits with FPCs or the like. Signals supplied from the external control circuits are input to the semiconductor device 150 through the terminal portions 103 and the terminal portions 104. In FIG. 17A, such terminal portions 103 are provided on the right and left of the pixel region 102, so that signals are input from two directions. Further, such terminal portions 104 are provided above and below the pixel region 102, so that signals are input from two directions. By inputting signals from two directions, signal supply capability is increased and high-speed operation of the semiconductor device 150 is facilitated. In addition, influences of signal delay due to an increase in size of the semiconductor device 150 or an increase in wiring resistance that accompanies an increase in definition can be reduced. Moreover, the semiconductor device 150 can have redundancy, so that reliability of the semiconductor device 150 can be improved. Although two terminal portions 103 and two terminal portions 104 are provided in FIG. 17A, a structure in which one terminal portion 103 and one terminal portion 104 are provided may also be employed.

Figure 17B:
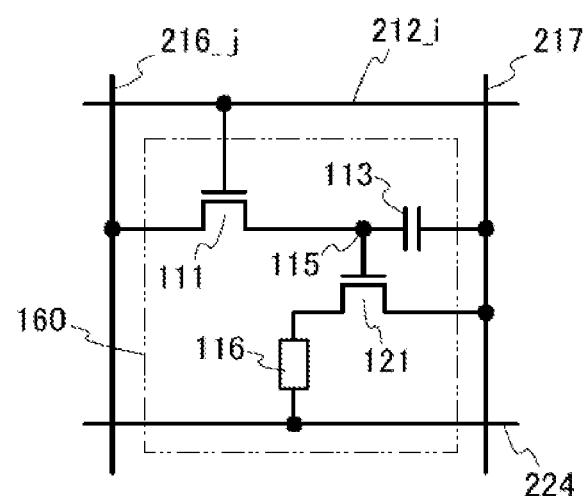

FIG. 17B illustrates a circuit configuration of the pixel 160. The pixel 160 includes a transistor 111, a transistor 121, an EL element 116, and a capacitor 113. A gate electrode of the transistor 111 is electrically connected to the wiring 212_i, and one of a source electrode and a drain electrode of the transistor 111 is electrically connected to the wiring 216_j. The other of the source electrode and the drain electrode of the transistor 111 is electrically connected to a node 115 to which a gate electrode of the transistor 121 and one electrode of the capacitor 113 are electrically connected. In addition, one of a source electrode and a drain electrode of the transistor 121 is electrically connected to one electrode of the EL element 116, and the other of the source electrode and the drain electrode of the transistor 121 is electrically connected to the other electrode of the capacitor 113 and the wiring 217. The other electrode of the EL element 116 is electrically connected to the wiring 224. The difference between the potential of the wiring 217 and the potential of the wiring 224 is set so as to be larger than the total voltage of the threshold voltage of the transistor 121 and the threshold voltage of the EL element 116.

The transistor 111 has a function of selecting whether an image signal supplied from the wiring 216_j is input to the gate electrode of the transistor 121. After a signal that turns on the transistor 111 is supplied to the wiring 212_i, an image signal is supplied to the node 115 from the wiring 216_j through the transistor 111.

The transistor 121 has a function of flowing current that corresponds to the potential (image signal) supplied to the node 115, to the EL element 116. The capacitor 113 has a function of keeping the difference between the potential of the node 115 and the potential of the wiring 217 constant. The transistor 121 has a function as a source of current for flowing current that corresponds to the image signal to the EL element 116.

For a semiconductor layer for forming channels of the transistor 111 and the transistor 121, a single crystal semiconductor, a polycrystalline semiconductor, a microcrystalline semiconductor, an amorphous semiconductor, or the like can be used. Examples of a semiconductor material are silicon, germanium, silicon germanium, silicon carbide, and gallium arsenide. The display device described in this embodiment has a structure in which the semiconductor layer remains in the pixel region; thus, in the case where the display device including the semiconductor is used as a bottom-emission type EL display device, it is preferable to increase transmittance of visible light by, for example, thinning the semiconductor layer as much as possible.

Alternatively, an oxide semiconductor can be favorably used for the semiconductor layer in which channels of the transistor 111 and the transistor 121 are formed. An oxide semiconductor has an energy gap that is as wide as greater than or equal to 3.0 eV, and has high transmittance with respect to visible light. In a transistor obtained by processing an oxide semiconductor under appropriate conditions, the off-state current at ambient temperature (e.g., 25° C.) can be less than or equal to 100 zA ($1 \times 10^{-19}$ A), less than or equal to 10 zA ($1 \times 10^{-20}$ A), and further less than or equal to 1 zA ($1 \times 10^{-21}$ A). Therefore, the potential applied to the gate electrode of the transistor 121 can be held without provision of the capacitor 113.

Description of this embodiment will be given on the assumption that the transistor 111 and the transistor 121 are both n-channel transistors; however, one or both of the transistors 111 and 121 may be a p-channel transistor.

The capacitor 113 has a function of holding an image signal supplied to the gate electrode of the transistor 121. The capacitor 113 is not necessarily provided; however, with the capacitor 113, variation in the potential supplied to the gate electrode of the transistor 121, which is caused by a current flowing between a source and a drain in an off state of the transistor 111 (off-state current), can be suppressed.

The EL element 116 has a structure in which an EL layer is sandwiched between one electrode serving as an anode and the other electrode serving as a cathode, and the luminance of the EL element 116 is controlled in accordance with the amount of current flowing through the EL layer. That is, the luminance of the EL element 116 is controlled in accordance with the amount of current flowing between the source and the drain of the transistor 121.

Figure 12:
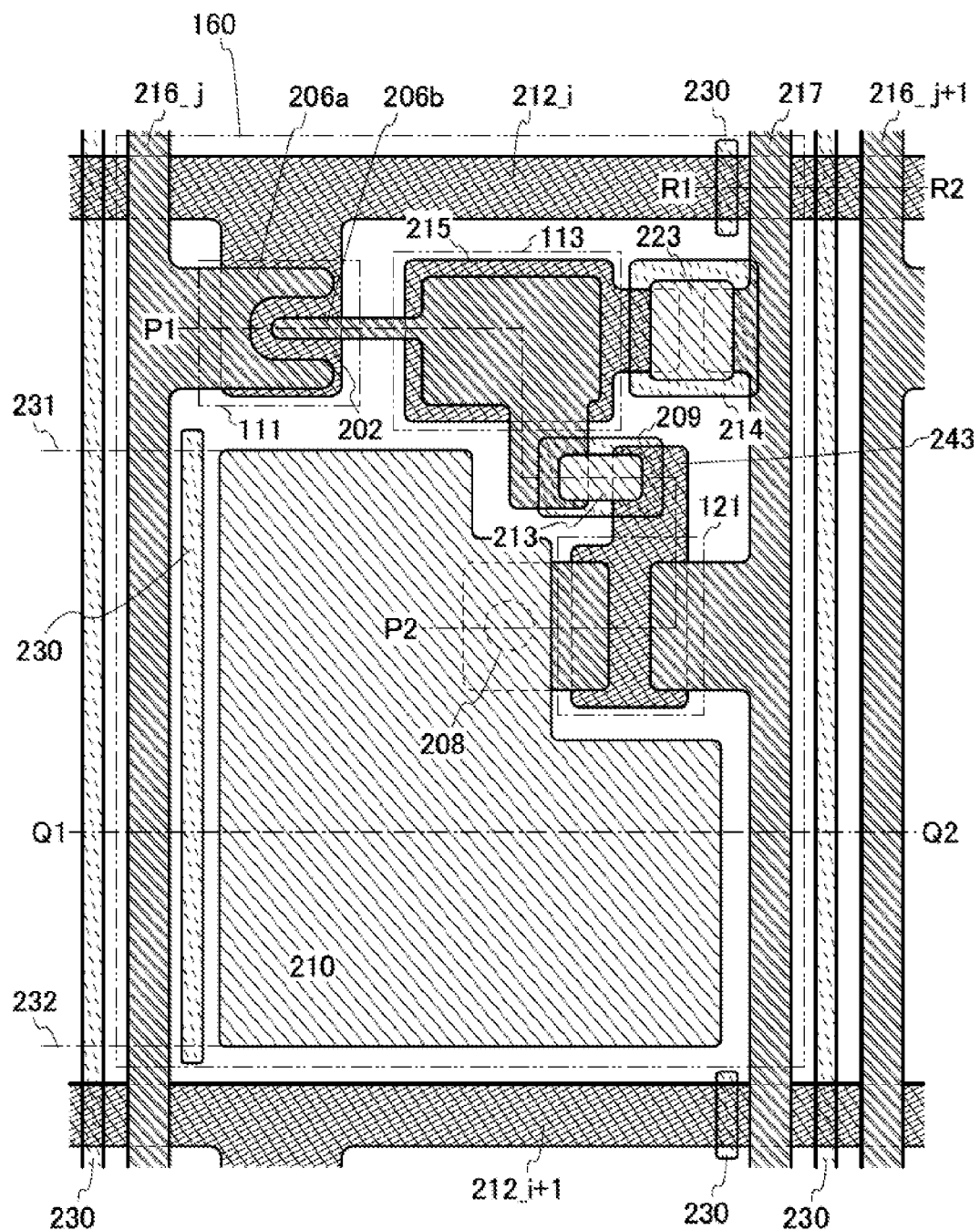
FIG. 12 illustrates an embodiment of the present invention.
Figure 13:
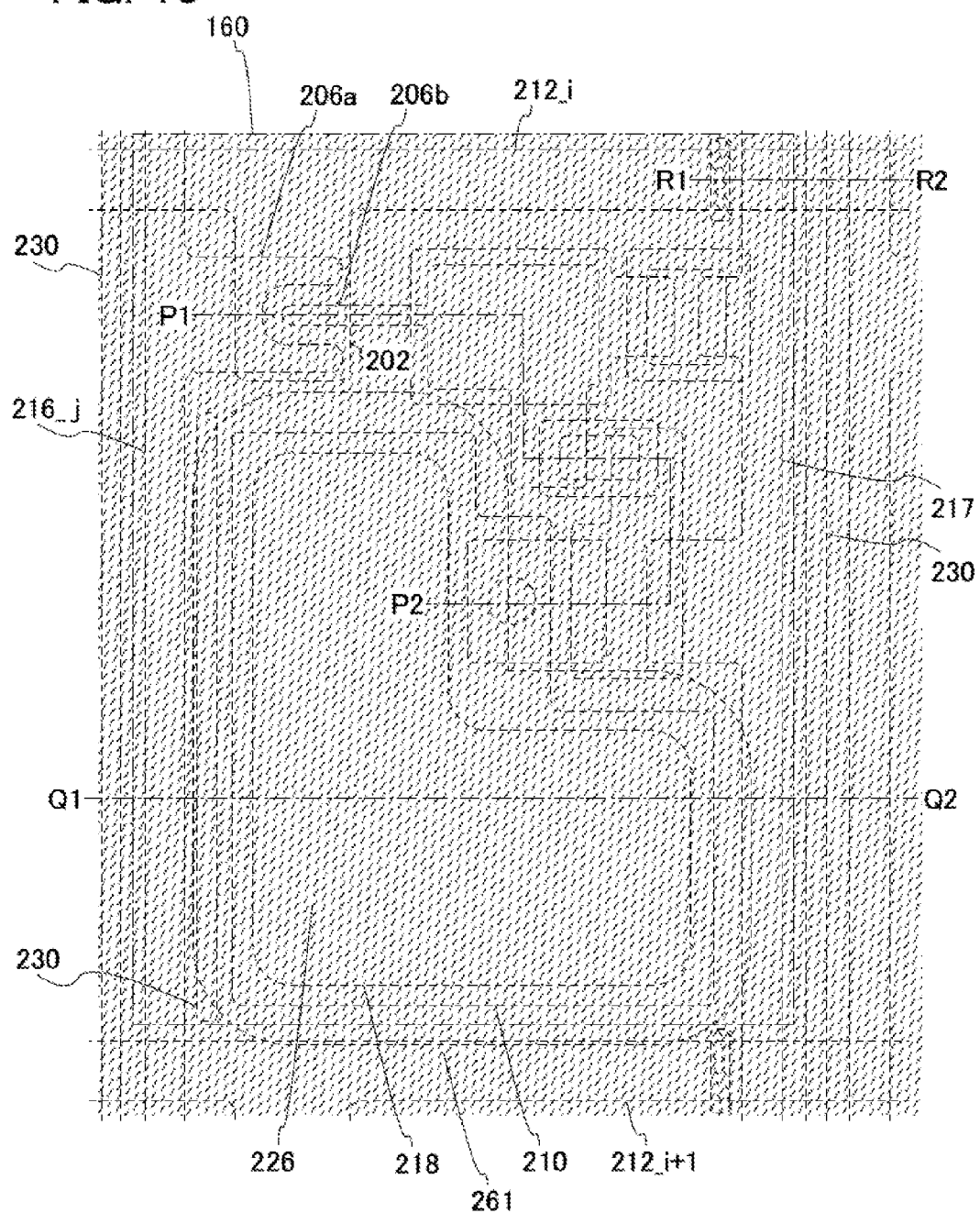
FIG. 13 illustrates the embodiment of the present invention.

Next, an example of the configuration of the pixel 160 illustrated in FIGS. 17A and 17B will be described with reference to FIG. 12, FIG. 13, FIGS. 14A and 14B, and FIG. 15. FIG. 12 and FIG. 13 are plan views illustrating a plan structure of the pixel 160. FIG. 12 is a plan view illustrating the state in which the uppermost layer is the pixel electrode 210. FIG. 13 is a plan view illustrating the state in which a partition layer 218, an EL layer 261, and a counter electrode 226 are further formed over the pixel electrode 210. For easy viewing, some components are omitted in FIG. 12 and FIG. 13.

Figure 14A:
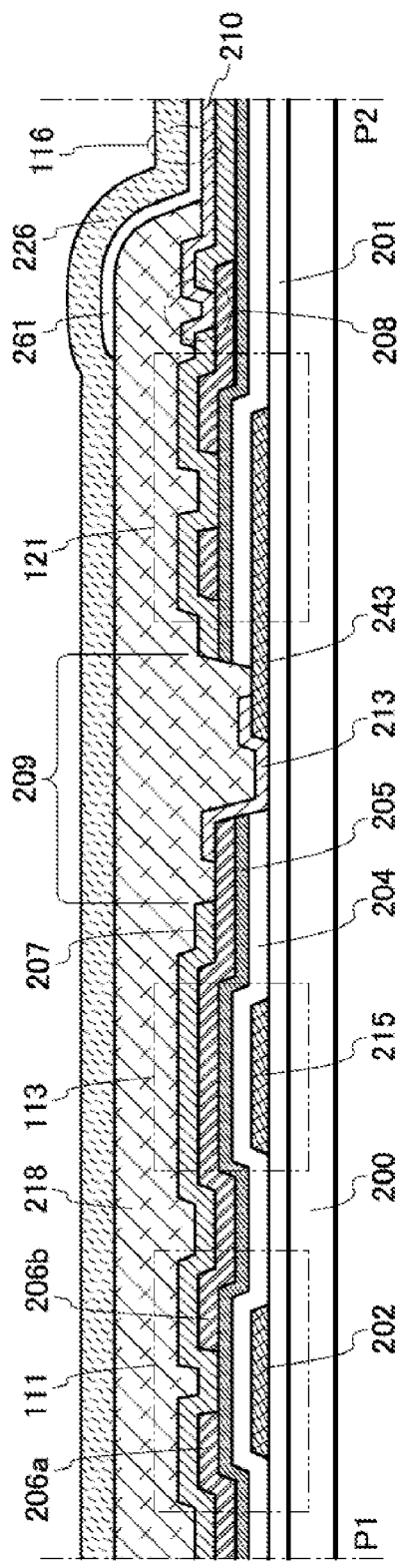
FIGS. 14A and 14B illustrate the embodiment of the present invention.
Figure 14B:
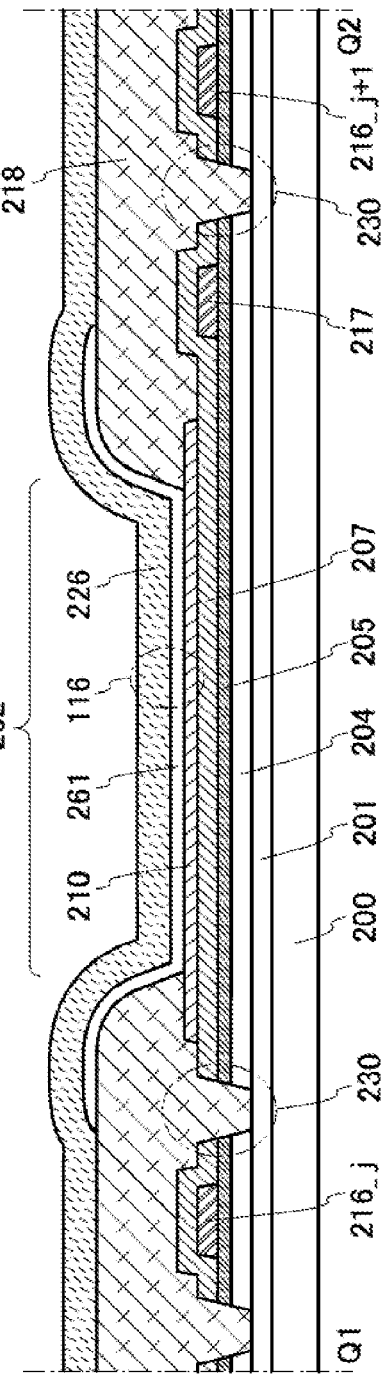
Figure 15:
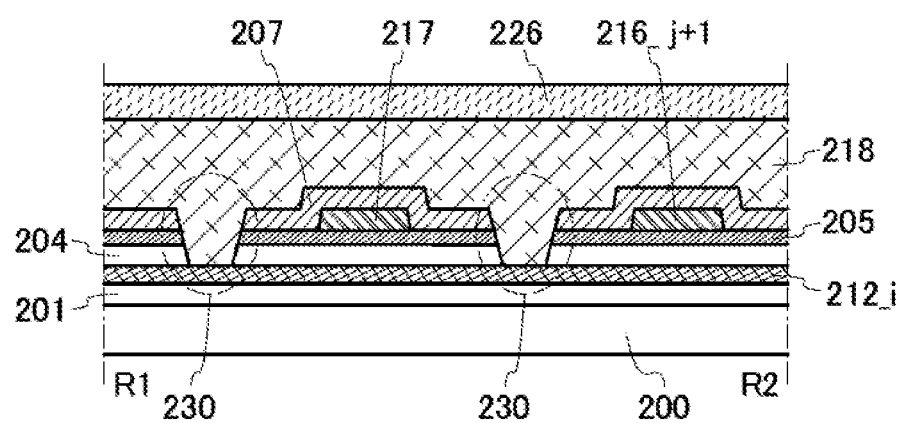
FIG. 15 illustrates the embodiment of the present invention.

FIGS. 14A and 14B and FIG. 15 are cross-sectional views illustrating the stacked structure of the pixel 160. FIG. 14A corresponds to a cross section taken along a dashed-dotted line P1-P2 in FIG. 12 and FIG. 13, and FIG. 14B corresponds to a cross section taken along a dashed-dotted line Q1-Q2 in FIG. 12 and FIG. 13. FIG. 15 corresponds to a cross section taken along a dashed-dotted line R1-R2 in FIG. 12 and FIG. 13.

If parasitic capacitance generated between the gate electrode 202 and the drain electrode 206b electrically connected to the node 115 (see FIG. 17B) is large, the node 115 is easily influenced by a variation in the potential of the wiring 212_i, which may cause degradation in display quality because the potential supplied to the node 115 cannot be held accurately at the time when the transistor 111 changes from on state to off state. As described in Embodiment 1, with the structure in which the source electrode 206a is U-shaped and surrounds the drain electrode 206b, an enough channel width can be ensured and parasitic capacitance generated between the drain electrode 206b and the gate electrode 202 can be reduced. Therefore, the display quality of an EL display device can be improved.

The semiconductor device described in this embodiment also has a structure in which the semiconductor layer 205 remains in the entire pixel region because a photolithography process for forming an island-shaped semiconductor layer is not performed in order to simplify the manufacturing process. Due to this, there is a possibility of forming a parasitic transistor in the semiconductor device of this embodiment as in the above embodiment.

In the semiconductor device described in this embodiment, there is a possibility of forming a first parasitic transistor in which the wiring 212_i functions as a gate electrode, the wiring 216_j functions as one of a source electrode and a drain electrode, and the wiring 217 functions as the other of the source electrode and the drain electrode.

The semiconductor device described in this embodiment does not include the wiring 203 and does not form the second parasitic transistor described in the above embodiment. However, in the semiconductor device described in this embodiment, there is a possibility of forming a third parasitic transistor in which the pixel electrode 210 functions as a gate electrode, the layer 207 functions as a gate insulating layer, the wiring 216_j functions as one of a source electrode and a drain electrode, and the wiring 217 functions as the other of the source electrode and the drain electrode. Particularly when the pixel electrode 210 is formed close to the wiring 216_j or the wiring 217 for the purpose of increasing the pixel aperture ratio or the like, the influence of the third parasitic transistor is increased.

When the difference between the potential of the wiring 217 and the potential of the wiring 216_j+1 of the adjacent pixel is increased, there is a possibility of forming a parasitic channel in the semiconductor layer 205 between the wirings owing to electric field generated between the wirings.

When such a potential as to turn on the transistor 111 is supplied to the wiring 212_i, the first parasitic transistor is also turned on, and the wiring 216_j and the wiring 217 are electrically connected to each other. The electrical connection between the wiring 216_j and the wiring 217 by the first parasitic transistor makes it difficult to supply accurate image signals to the node 115.

In the case where the third parasitic transistor functions as an n-channel transistor, when the potential of the wiring 216_j is lower than the potential supplied to the pixel electrode 210 or the potential held at the pixel electrode 210 and the absolute value of the potential difference is larger than the threshold voltage of the third parasitic transistor, a channel is formed in the semiconductor layer 205 located below the pixel electrode 210 and the third parasitic transistor is on.

When the third parasitic transistor is on, the wiring 216_j and the wiring 217 are electrically connected to each other. The electrical connection between the wiring 216_j and the wiring 217 by the third parasitic transistor makes it difficult to supply accurate image signals to the node 115. When the pixel electrode 210 is formed close to the wiring 216_j or the wiring 217 for the purpose of increasing the pixel aperture ratio or the like, the influence of the third parasitic transistor is increased.

When the parasitic channel is formed between the wiring 217 and the wiring 216_j+1 of the adjacent pixel, the wiring 217 and the wiring 216_j+1 are electrically connected to each other, so that it becomes difficult to supply accurate image signals to the node 115 in each pixel.

In view of this, a structure in which a groove portion 230 in which the semiconductor layer 205 is removed is provided in the pixel 160 so that the above-described parasitic transistors and the parasitic channel are not formed is employed. The groove portion 230 is provided so as to cross the wiring 212_i, which is located between the wiring 216_j and the wiring 217, in the line width direction of the wiring 212_i across both edges thereof; in this way, formation of the first parasitic transistor can be prevented. Note that a plurality of groove portions 230 may be provided over the wiring 212_i.

Furthermore, the groove portion 230 is formed at least between the wiring 216_j and the pixel electrode 210 or between the wiring 217 and the pixel electrode 210, along a direction in which the wiring 216_j or the wiring 217 extends, so as to extend beyond the edge 231 and the edge 232 of the pixel electrode 210. In this way, formation of the third parasitic transistor can be prevented. The groove portion 230 provided along the direction in which the wiring 216_j or the wiring 217 extends is not necessarily provided in parallel to the wiring 216_j or the wiring 217 and may have a flection portion or a bending portion.

The groove portion 230 is formed between the wiring 217 and the wiring 216_j+1 of the adjacent pixel so as to extend beyond edges of the pixel. In this way, formation of the parasitic channel can be prevented.

Although the size of the groove portion 230 in which the semiconductor layer 205 is removed is not particularly limited, for surely preventing formation of a parasitic transistor and a parasitic channel, the distance of the portion where the semiconductor layer is removed in the groove portion 230 in a direction perpendicular to the direction in which the wiring 216_j or the wiring 217 extends is preferably 1 μm or more, further preferably 2 μm or more.

The cross section P1-P2 illustrated in FIG. 14A shows the stacked structures of the transistor 111, the transistor 121, and the capacitor 113. The transistor 111 and the transistor 121 have one kind of bottom-gate structure called a channel-etched type. The cross section Q1-Q2 illustrated in FIG. 14B shows the stacked structure from the wiring 216_j to the wiring 216_j+1, including the pixel electrode 210 and the groove portions 230. Further, the cross section R1-R2 illustrated in FIG. 15 shows the stacked structure of an intersection of the wiring 212_j, the wiring 217, and the wiring 216_j+1.

In the cross section P1-P2 illustrated in FIG. 14A, a base layer 201 is formed over a substrate 200, and the gate electrode 202, a gate electrode 243, and a capacitor electrode 215 are formed over the base layer 201. Over the gate electrode 202, the gate insulating layer 204 and the semiconductor layer 205 are formed. Over the semiconductor layer 205, the source electrode 206a and the drain electrode 206b are formed. Further, the layer 207 is formed over the source electrode 206a and the drain electrode 206b so as to be in contact with part of the semiconductor layer 205. The pixel electrode 210 is formed over the layer 207 and is electrically connected to one of the source electrode and the drain electrode of the transistor 121 through the contact hole 208 formed in the layer 207.

A contact hole 209 in which part of the layer 207, part of the semiconductor layer 205, and part of the gate insulating layer 204 are removed is formed. A wiring 213 overlapping with the contact hole 209 is formed. The wiring 213 electrically connects the drain electrode 206b of the transistor 111 to the gate electrode 243 of the transistor 121. Although not shown in FIG. 14A, a contact hole 214 in which another part of the layer 207, another part of the semiconductor layer 205, and another part of the gate insulating layer 204 are removed is formed. A wiring 223 formed so as to overlap with the contact hole 214 electrically connects the capacitor electrode 215 to the wiring 217. The wiring 213 and the wiring 223 are formed from the same layer as the pixel electrode 210. Note that the contact hole 208, the contact hole 209, the contact hole 214, and the groove portion 230 are formed in the same step.

The partition layer 218 for separating the EL layer 261 for each pixel is formed over the layer 207. The EL layer 261 is formed over the pixel electrode 210 and the partition layer 218. The counter electrode 226 is formed over the partition layer 218 and the EL layer 261. A portion in which the pixel electrode 210, the EL layer 261, and the counter electrode 226 overlap with each other functions as the EL element 116.

A portion in which the capacitor electrode 215 and the drain electrode 206b overlap with each other with the gate insulating layer 204 and the semiconductor layer 205 interposed therebetween functions as the capacitor 113. The gate insulating layer 204 and the semiconductor layer 205 function as a dielectric layer. In the case where a multi-layer dielectric layer is formed between the capacitor electrode 215 and the drain electrode 206b, even when a pinhole is generated in one dielectric layer, the pinhole is covered with another dielectric layer; accordingly, the capacitor 113 can operate normally. The relative permittivity of an oxide semiconductor is as high as 14 to 16. When the oxide semiconductor is used for the semiconductor layer 205, the capacitance value of the capacitor 113 can be increased.

In the cross section Q1-Q2 illustrated in FIG. 14B, the base layer 201 is formed over the substrate 200, the gate insulating layer 204 is formed over the base layer 201, and the semiconductor layer 205 is formed over the gate insulating layer 204. The wiring 216_j, the wiring 216_j+1, and the wiring 217 are formed over the semiconductor layer 205, and the layer 207 is formed over the semiconductor layer 205, the wiring 216_j, the wiring 216_j+1, and the wiring 217. The pixel electrode 210 is formed over the layer 207.

The groove portion 230 is formed between the wiring 216_j and the pixel electrode 210 by removing part of the gate insulating layer 204, part of the semiconductor layer 205, and part of the layer 207. The groove portion 230 is formed between the wiring 217 and the wiring 216_j+1 by removing part of the gate insulating layer 204, part of the semiconductor layer 205, and part of the layer 207. The groove portions 230 do not include a semiconductor layer at least on their bottom surfaces.

In the cross section R1-R2 illustrated in FIG. 15, the base layer 201 is formed over the substrate 200, and the wiring 212_i is formed over the base layer 201. Over the wiring 212_i, the gate insulating layer 204 and the semiconductor layer 205 are formed. The wiring 217 and the wiring 216_j+1 of the adjacent pixel are formed over the semiconductor layer 205, and the layer 207 is formed over the semiconductor layer 205, the wiring 217, and the wiring 216_j+1. Further, the partition layer 218 is formed over the layer 207, and the counter electrode 226 is formed over the partition layer 218. In addition, the groove portions 230 are formed by removing part of the gate insulating layer 204, part of the semiconductor layer 205, and part of the layer 207. The groove portions 230 do not include a semiconductor layer at least on their bottom surfaces.

Figure 16:
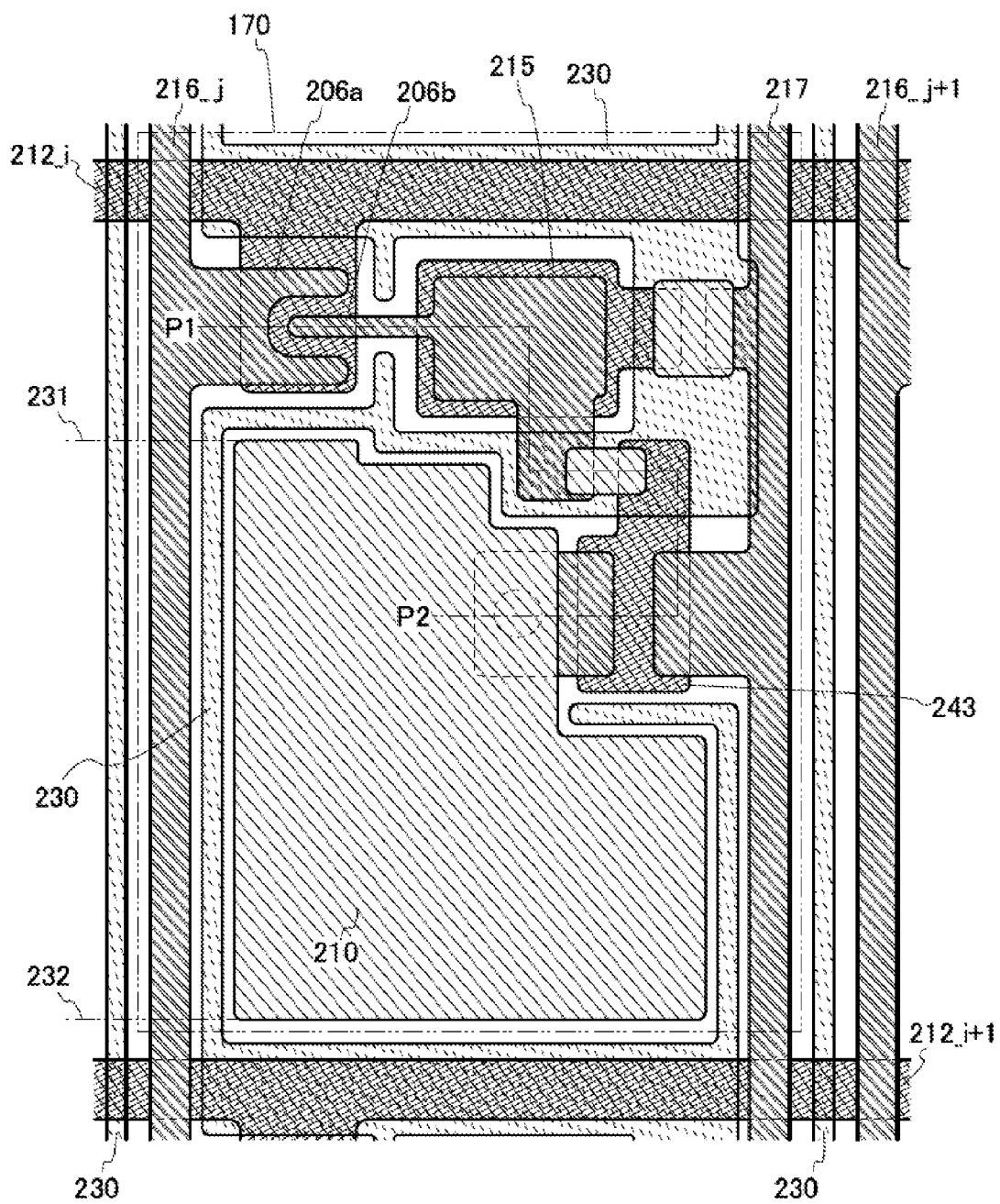
FIG. 16 illustrates an embodiment of the present invention.

Next, an example of a pixel having a plan structure different from that illustrated in FIG. 12 will be described with reference to FIG. 16. FIG. 16 is a plan view illustrating a plan structure of the pixel 170. For easy viewing, the base layer 201, the gate insulating layer 204, the semiconductor layer 205, the layer 207, the partition layer 218, the EL layer 261, and the counter electrode 226 are omitted in FIG. 16. The pixel 170 illustrated in FIG. 16 is different from the pixel 160 illustrated in FIG. 12 and FIG. 13 in the plan structure of the groove portions 230. Note that the stacked structure of the portion indicated by a dashed-dotted line P1-P2 in FIG. 16 is the same as that in FIG. 14A.

The pixel 170 has a structure in which the groove portions 230 are provided between the wiring 217 and the pixel electrode 210 and between the wiring 216_j and the pixel electrode 210. The groove portion 230 is provided to not only cross the wiring 212_i in the line width direction of the wiring 212_i across the both edges thereof but also to have a larger area than the groove portion 230 of the pixel 160. In addition, the contact hole 209 and the contact hole 214 are combined with the groove portion 230 so as to form the groove portion 230 as much as possible in the periphery of the capacitor electrode 215 and the gate electrode 243. By arranging the groove portion 230 in such a large area, formation of a parasitic transistor can be prevented more surely.

Next, a manufacturing method of a semiconductor device that can be used in the EL display device described with reference to FIG. 12, FIG. 13, FIGS. 14A and 14B, and FIG. 15 will be described with reference to FIGS. 18A to 18D and FIGS. 19A to 19C. Note that cross sections P1-P2 in FIGS. 18A to 18D and FIGS. 19A to 19C are cross-sectional views of the portion taken along the dashed-dotted line P1-P2 in FIG. 12 and FIG. 13. Up to and including the step for forming the pixel electrode 210, the semiconductor device described in this embodiment can be manufactured by the same process as the semiconductor device described in Embodiment 1. Further, at least the components denoted by the same reference numerals as those in the above embodiment can be formed using materials and methods similar to those described in Embodiment 1. Detailed description for those components is omitted in this embodiment.

First, the base layer 201 is formed over the substrate 200, and a conductive layer is formed over the base layer 201. Then, by a first photolithography process, a resist mask is formed over the conductive layer, and part of the conductive layer is selectively removed, so that the gate electrode 202, the gate electrode 243, the capacitor electrode 215, and the wiring 212_i (not shown in FIGS. 18A to 18D) are formed (see FIG. 18A). In this embodiment, aluminoborosilicate glass is used as the substrate 200, silicon oxynitride is used for the base layer 201, and tungsten is used for the conductive layer.

Next, the gate insulating layer 204 is formed over the gate electrode 202, the gate electrode 243, the capacitor electrode 215, and the wiring 212_i, and the semiconductor layer 205 is formed over the gate insulating layer 204 (see FIG. 18B). In this embodiment, silicon oxynitride is used for the gate insulating layer 204, and oxide semiconductor is used for the semiconductor layer 205.

Next, a conductive layer to be processed into the source electrode 206a, the drain electrode 206b, and the wiring 216_j (not shown in FIGS. 18 A to 18D) is formed over the semiconductor layer 205. The conductive layer in this embodiment has stacked layers of titanium, aluminum, and titanium. Then, by a second photolithography process, part of the conductive layer is selectively etched; thus, the source electrode 206a, the drain electrode 206b, and the wiring 216_j are formed (see FIG. 18C).

Next, the layer 207 is formed over the source electrode 206a, the drain electrode 206b, and the wiring 216_j (see FIG. 18D). In this embodiment, an InZrGaZnO film is formed as the layer 207.

Next, by a third photolithography process, a resist mask is formed and part of the layer 207 over the drain electrode 206b is selectively removed, so that the contact hole 208 is formed. Further, part of the layer 207 over the drain electrode 206b and part of the layer 207, part of the semiconductor layer 205, and part of the gate insulating layer 204 over the gate electrode 243 are selectively removed, so that the contact hole 209 is formed (see FIG. 19A).

Figure 19A:
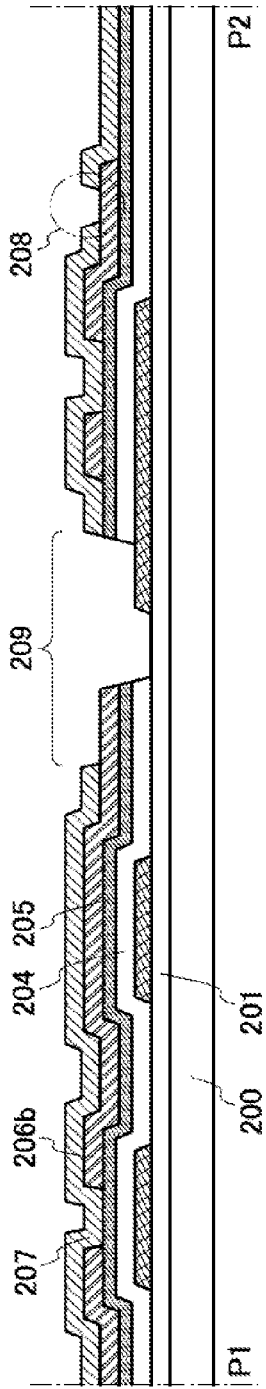
FIGS. 19A to 19C illustrate the manufacturing method.
Figure 19B:
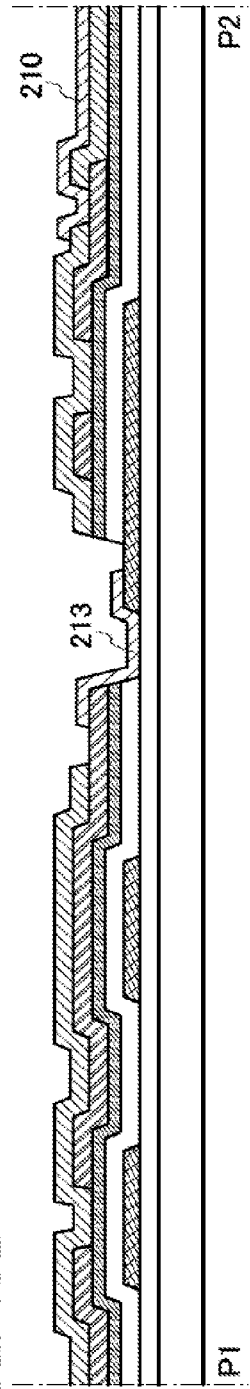
Figure 19C:
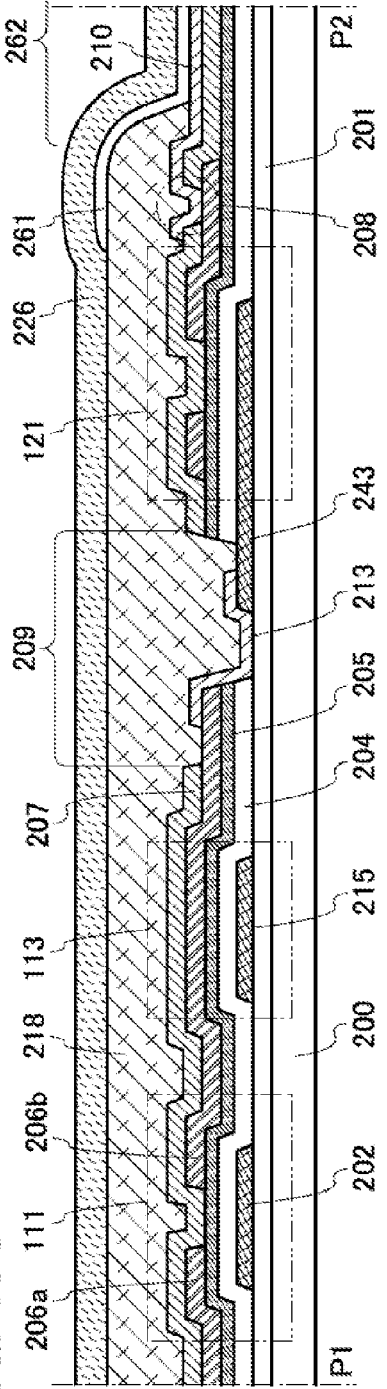

Although not illustrated in FIGS. 19A to 19C, by the third photolithography process, the contact hole 214 and the groove portions 230 are formed in a manner similar to that of the contact hole 209. Therefore, at the side surface of the groove portions 230, side surfaces of the layer 207, the semiconductor layer 205, and the gate insulating layer 204 are exposed. In this manner, by the third photolithography process, the contact holes 208, 209, and 214 and the groove portions 230 can be formed.

Next, a conductive layer to be processed into the pixel electrode 210, the wiring 213, and the wiring 223 is formed. In this embodiment, an ITO layer is formed as the light-transmitting conductive layer. Then, by a fourth photolithography process, the conductive layer is selectively etched, so that the pixel electrode 210, the wiring 213, and the wiring 223 are formed (see FIG. 12, FIG. 19B).

The pixel electrode 210 is electrically connected to one of the source and the drain of the transistor 121 in the contact hole 208. The drain electrode 206b is electrically connected to the gate electrode 243 with the wiring 213 in the contact hole 209. Further, the capacitor electrode 215 is electrically connected to the wiring 217 with the wiring 223 in the contact hole 214.

Next, by a fifth photolithography process, the partition layer 218 is formed over the pixel region 102. As a material for forming the partition layer 218, an organic insulating material or an inorganic insulating material can be used. The partition layer 218 has an opening portion 262 at a position that overlaps with the pixel electrode 210 (see FIG. 13 and FIG. 14B). The sidewalls of the partition layer 218 preferably have a tapered shape or a shape with a curvature. By using a photosensitive material as the material of the partition layer 218, the partition layer 218 can be formed without using a photoresist, in which case, the sidewalls of the partition layer 218 can have a shape with a continuous curvature. As the organic insulating material for forming the partition layer 218, an acrylic resin, a phenol resin, polystyrene, polyimide, or the like can be used. In this embodiment, photosensitive polyimide is used for the partition layer 218.

The partition layer 218 is also formed over the contact hole 208, the contact hole 209, the contact hole 214, and the groove portions 230. By filling the contact hole 208, the contact hole 209, the contact hole 214, and the groove portions 230 with the partition layer 218, end portions of the semiconductor layer and the insulating layer which are exposed at the time of forming the contact holes and the groove portions can be covered. With this structure, the exposed portion can be protected, which leads to improved reliability of the semiconductor device. Note that the partition layer 218 is not formed over the terminal portions 103 and the terminal portions 104.

The terminals 105_1 to 105_m and the terminals 106_1 to 106_n included in the semiconductor device 150 can be formed in a manner similar to those of the terminals 105_1 to 105_m and the terminals 106_1 to 106_n included in the semiconductor device 100 described in Embodiment 1. The terminals 108 included in the semiconductor device 150 can be formed in a manner similar to those of the terminals 105_1 to 105_m or the terminals 106_1 to 106_n included in the semiconductor device 100 described in Embodiment 1.

Next, the EL layer 261 is formed in a region in contact with the pixel electrode 210 in the opening portion 262. Then, the counter electrode 226 is formed over the EL layer 261 and the partition layer 218 (see FIG. 19C).

The pixel electrode 210 functions as one electrode of the EL element 116. The counter electrode 226 functions as the other electrode of the EL element 116. The EL layer 261 may be formed by stacking a hole injection layer, a hole transport layer, a light-emitting layer, an electron transport layer, an electron injection layer, or the like. In the case where the pixel electrode 210 is used as an anode, a material having a high work function is used for the pixel electrode 210. In the case where the pixel electrode 210 has a stacked structure of a plurality of layers, a material having a high work function is used for at least a layer in contact with the EL layer 261. In the case where the counter electrode 226 is used as a cathode, a material having a low work function may be used for the counter electrode 226. Specifically, an alloy of aluminum and lithium can be used for the counter electrode 226.

With this embodiment, a semiconductor device can be manufactured through a smaller number of photolithography processes than the conventional one. Therefore, an EL display device can be manufactured at low cost with high productivity. Further, with this embodiment, a highly reliable semiconductor device with little deterioration in electrical characteristics can be manufactured. Thus, a highly reliable EL display device can be manufactured.

Although the description in this embodiment has been given taking a bottom-gate transistor as an example, this embodiment can also be applied to a top-gate transistor.

This embodiment can be implemented in appropriate combination with the structures described in the other embodiments.

(Embodiment 4)

An embodiment of a display device in which the transistor described in Embodiment 1 is used is illustrated in FIGS. 20A and 20B.

FIG. 20A is a plan view of a panel in which a transistor 4010 and an EL element 4113 are sealed between a first substrate 4001 and a second substrate 4006 with a sealant 4105. FIG. 20B is a cross-sectional view taken along line M-N in FIG. 20A. A groove portion 4040 is provided over the first substrate 4001.

The sealant 4105 is provided so as to surround a pixel portion 4002 provided over the first substrate 4001. The second substrate 4006 is provided over the pixel portion 4002. Accordingly, the pixel portion 4002 is sealed by the first substrate 4001, the sealant 4105, and the second substrate 4006. The sealant 4105 can be formed using a known sealant, glass frit, or the like. Specifically, as the sealant 4105, an organic resin such as a thermosetting resin or a photocurable resin, a low-melting-point glass, or the like can be used. A drying agent may be contained in the sealant.

A space 4007 surrounded by the first substrate 4001, the second substrate 4006, and the sealant 4105 is filled with a gas. It is particularly preferable that the space 4007 be filled with a gas that is inert to the EL element 4113. For example, the gas is preferably a rare gas or nitrogen.

Further, an input terminal 4020 is provided in a region over the first substrate 4001 outside the region surrounded by the sealant 4105, and flexible printed circuits (FPCs) 4018a and 4018b are connected to the input terminal 4020. The FPC 4018a is electrically connected to a signal line driver circuit 4003 which is separately provided over a different substrate, and the FPC 4018b is electrically connected to a scan line driver circuit 4004 which is separately provided over a different substrate. Various signals and potentials supplied to the pixel portion 4002 are supplied from the signal line driver circuit 4003 and the scan line driver circuit 4004 via the FPC 4018a and the FPC 4018b.

Note that a connection method of driver circuits which are separately formed over different substrates is not particularly limited, and COG, wire bonding, TCP, or the like can be used.

Although not shown, the signal line driver circuit 4003 or the scan line driver circuit 4004 may be provided over the first substrate 4001 with the use of the transistor disclosed in this specification.

The display device illustrated in FIG. 20B includes a wiring 4015 and an electrode 4016. The wiring 4015 and the electrode 4016 are electrically connected to a terminal included in the FPC 4018a via an anisotropic conductive layer 4019.

The wiring 4015 is formed from the same conductive layer as a source electrode and a drain electrode of the transistor 4010, and the electrode 4016 is formed from the same conductive layer as a first electrode 4130 that is one electrode of the EL element 4113.

In this embodiment, the transistor described in Embodiment 1 can be applied to the transistor 4010. The transistor 4010 provided in the pixel portion 4002 is electrically connected to an EL element to form a display panel.

The display device illustrated in FIG. 20B is an example in which an EL element is used as a display element. In FIG. 20B, the EL element 4113 includes the first electrode 4130, a second electrode 4131, and an EL layer 4108. A partition layer 4009 provided to electrically disconnect the EL element 4113 from adjacent EL elements 4113 is also provided over the groove portion 4040.

By filling the groove portion 4040 with the partition layer 4009, end portions of the semiconductor layer and the insulating layer, which are exposed at the time of forming the groove portion 4040, can be covered. With this structure, the exposed portion can be protected, which leads to improved reliability of the semiconductor device.

By using an oxide semiconductor layer as the semiconductor layer of the transistor used in this embodiment, higher field-effect mobility than that of a transistor that uses amorphous silicon can be obtained, whereby high-speed operation is possible. Therefore, by using the transistor in a pixel portion of an EL display device, a high-quality image can be provided. In addition, since the transistors can be separately provided in a driver circuit portion and a pixel portion over one substrate, the number of components of the EL display device can be reduced.

By application of the transistor described in Embodiment 1 in this manner, an EL display device with improved transistor reliability can be manufactured without increasing the number of photomasks used in a manufacturing process of a display device including a transistor. Thus, a highly reliable EL display device can be manufactured with high productivity at low cost.

This embodiment can be implemented in appropriate combination with the structures described in the other embodiments.

(Embodiment 5)

The display device described in the above embodiment can be applied to semiconductor devices that display a 3D image. In this embodiment, with the use of a display device which switches between an image for a left eye and an image for a right eye at high speed, an example in which a 3D image which is a moving image or a still image is seen with dedicated glasses with which videos of the display device are synchronized will be described with reference to FIGS. 21A and 21B.

Figure 21A:
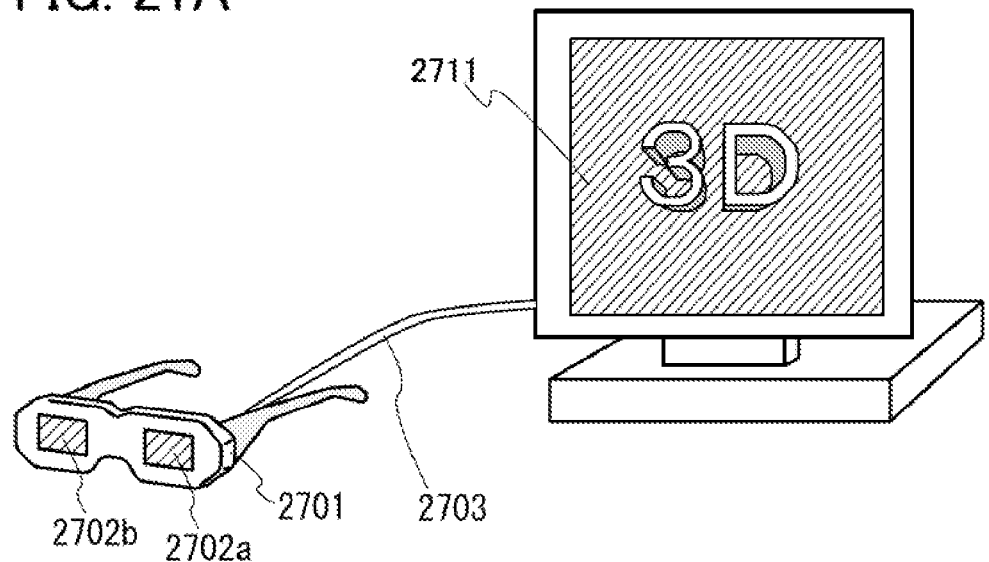
FIGS. 21A and 21B illustrate an embodiment of the present invention.

FIG. 21A illustrates an external view in which a display device 2711 and dedicated glasses 2701 are connected to each other with a cable 2703. The display device disclosed in this specification can be used as the display device 2711. In the dedicated glasses 2701, shutters provided in a panel 2702a for a left eye and a panel 2702b for a right eye are alternately opened and closed, whereby a user can see an image of the display device 2711 as a 3D image.

Figure 21B:
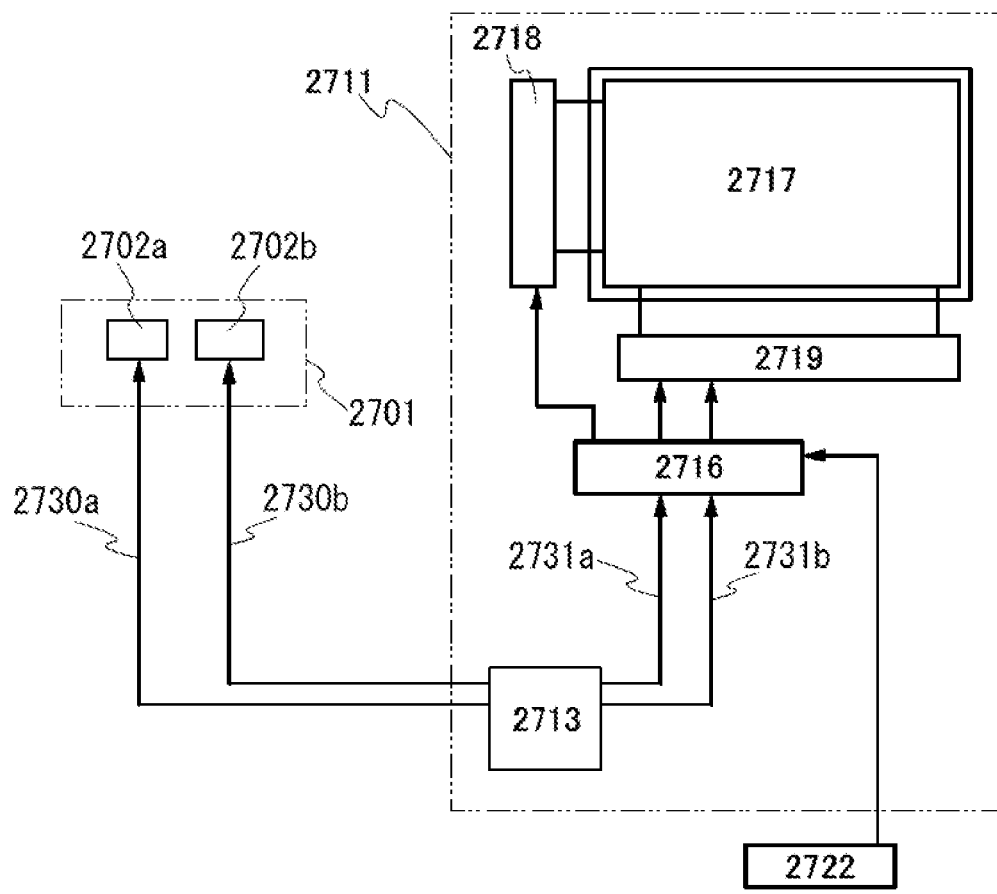

In addition, FIG. 21B is a block diagram illustrating a main structure of the display device 2711 and the dedicated glasses 2701.

The display device 2711 illustrated in FIG. 21B includes a display control circuit 2716, a display portion 2717, a timing generator 2713, a source line driver circuit 2718, an external operation unit 2722, and a gate line driver circuit 2719. Note that an output signal changes in accordance with operation by the external operation unit 2722 such as a keyboard.

In the timing generator 2713, a start pulse signal and the like are formed, and a signal for synchronizing an image for a left eye and the shutter of the panel 2702a for a left eye, a signal for synchronizing an image for a right eye and the shutter of the panel 2702b for a right eye, and the like are formed.

A synchronization signal 2731a of the image for a left eye is input to the display control circuit 2716, so that the image for a left eye is displayed on the display portion 2717. At the same time, a synchronization signal 2730a for opening the shutter of the panel 2702a for a left eye is input to the panel 2702a for a left eye. In addition, a synchronization signal 2731b of the image for a right eye is input to the display control circuit 2716, so that the image for a right eye is displayed on the display portion 2717. At the same time, a synchronization signal 2730b for opening the shutter of the panel 2702b for a right eye is input to the panel 2702b for a right eye.

In the case of using a liquid crystal display device as the display device 2711, it is preferable that the display device 2711 employ a successive color mixing method (a field sequential method) in which color display is performed by time division with use of light-emitting diodes (LEDs) in a backlight portion. The field sequential method enables higher resolution of the display device. Further, in the case of employing the field sequential method, the timing generator 2713 inputs signals that synchronize with the synchronization signals 2730a and 2730b to the backlight portion. Note that the LEDs used in the backlight portion are preferably LEDs of red (R), green (G), and blue (B).

This embodiment can be implemented in appropriate combination with the structures described in the other embodiments.

(Embodiment 6)

In this embodiment, examples of electronic appliances each including the display device described in the above embodiment will be described.

Figure 22A:
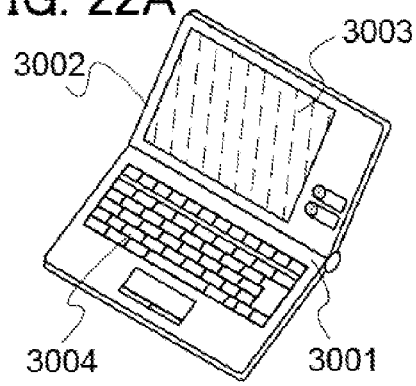
FIGS. 22A to 22F illustrate electronic devices.

FIG. 22A illustrates a laptop personal computer, which includes a main body 3001, a housing 3002, a display portion 3003, a keyboard 3004, and the like. By using the EL display device described in the above embodiment, a highly reliable laptop personal computer can be obtained.

Figure 22B:
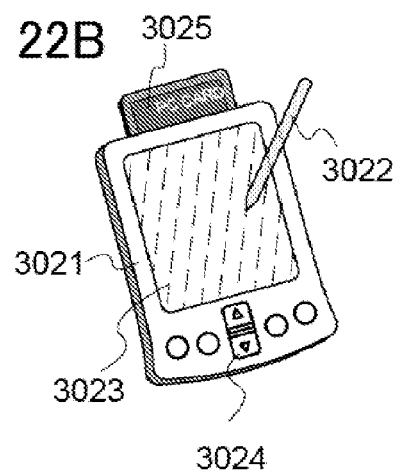

FIG. 22B is a personal digital assistant (PDA) which includes a main body 3021 provided with a display portion 3023, an external interface 3025, operation buttons 3024, and the like. A stylus 3022 is included as an accessory for operation. By using the EL display device described in the above embodiment, a highly reliable personal digital assistant (PDA) can be obtained.

Figure 22C:
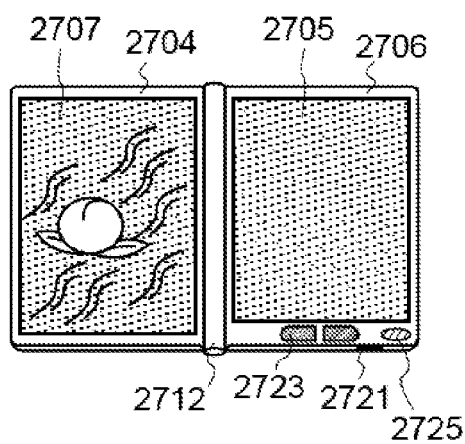

FIG. 22C illustrates an example of an e-book reader. For example, the e-book reader includes two housings, a housing 2706 and a housing 2704. The housing 2706 is combined with the housing 2704 by a hinge 2712, so that the e-book reader can be opened and closed using the hinge 2712 as an axis. With such a structure, the e-book reader can operate like a paper book.

A display portion 2705 and a display portion 2707 are incorporated in the housing 2706 and the housing 2704, respectively. The display portion 2705 and the display portion 2707 may display a continuous image or different images. In the structure where different images are displayed on different display portions, for example, the right display portion (the display portion 2705 in FIG. 22C) displays text and the left display portion (the display portion 2707 in FIG. 22C) displays graphics. By using the display device described in the above embodiment, a highly reliable e-book reader can be obtained.

FIG. 22C illustrates an example in which the housing 2706 is provided with an operation portion and the like. For example, the housing 2706 is provided with a power supply terminal 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may transmit and receive data wirelessly. Through wireless communication, desired book data or the like can be purchased and downloaded from an e-book server.

Figure 22D:
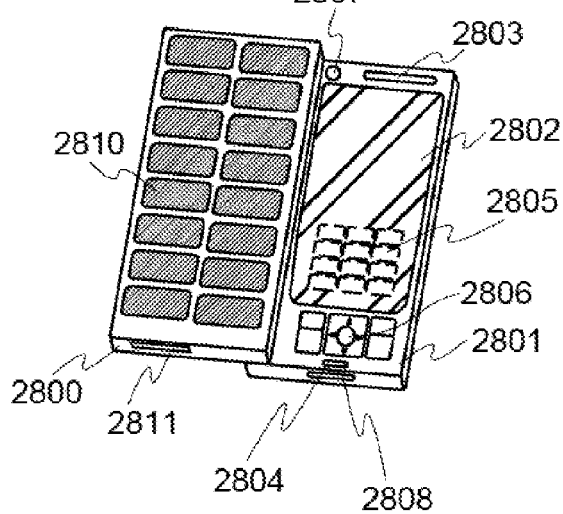

FIG. 22D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801.

The display panel 2802 is provided with a touch screen. A plurality of operation keys 2805 which is displayed as images is illustrated by dashed lines in FIG. 22D. Note that a boosting circuit by which a voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 22D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided. By using the display device described in the above embodiment, a highly reliable mobile phone can be provided.

Figure 22E:
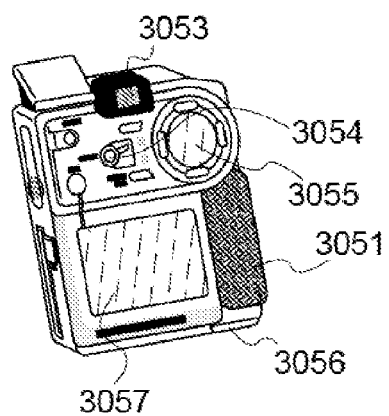

FIG. 22E illustrates a digital video camera which includes a main body 3051, a display portion A 3057, an eyepiece 3053, an operation switch 3054, a display portion B 3055, a battery 3056, and the like. By using the display device described in the above embodiment, a highly reliable digital video camera can be provided.

Figure 22F:
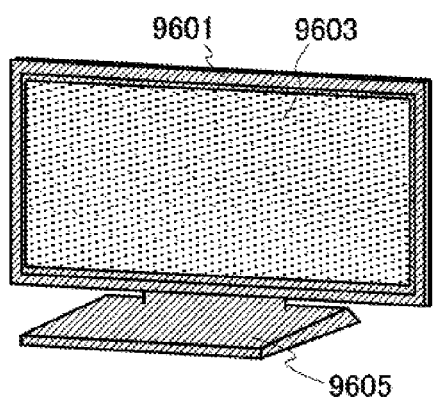

FIG. 22F illustrates an example of a television set. In the television set, a display portion 9603 is incorporated in a housing 9601. The display portion 9603 can display images. Here, the housing 9601 is supported by a stand 9605. By using the display device described in the above embodiment, a highly reliable television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be implemented in appropriate combination with the structures described in the other embodiments.

This application is based on Japanese Patent Application serial no. 2011-258079 filed with the Japan Patent Office on Nov. 25, 2011 and Japanese Patent Application serial no. 2011-258076 filed with the Japan Patent Office on Nov. 25, 2011, the entire contents of which are hereby incorporated by reference.

What is claimed is:

1. A semiconductor device comprising:
   a transistor comprising a gate electrode, a gate insulating layer, a source electrode, a drain electrode, and a semiconductor layer including a first oxide semiconductor;
   a first wiring electrically connected to the gate electrode;
   a capacitor wiring;
   a second wiring electrically connected to the source electrode;
   a layer including a second oxide semiconductor having a higher insulating property than the semiconductor layer over the second wiring and the semiconductor layer;
   a pixel electrode electrically connected to the drain electrode; and
   a groove portion over at least a portion of the first wiring and at least a portion of the capacitor wiring,
   wherein the semiconductor layer overlaps with the first wiring, the second wiring, the pixel electrode, and the capacitor wiring, and
   wherein the groove portion extends beyond edges of the pixel electrode along a direction in which the second wiring extends.

2. The semiconductor device according to claim 1,
   wherein the layer includes an oxide material including In, an element M, and Zn, and
   wherein the element M is a group 3A element, a group 4A element, or a group 4B element.

3. The semiconductor device according to claim 2, wherein the layer is formed of In-M-Zn-based oxide including the element M.

4. The semiconductor device according to claim 3, wherein the element M is Ti, Zr, Hf, Ge, Ce, or Y.

5. The semiconductor device according to claim 1, wherein the gate electrode and the capacitor wiring comprise the same material.

6. The semiconductor device according to claim 1, wherein the semiconductor layer does not exist at least on a bottom surface of the groove portion.

7. The semiconductor device according to claim 1, wherein the groove portion is a portion where neither the layer, the semiconductor layer nor the gate insulating layer exist.

8. A semiconductor device comprising:
- a transistor comprising a semiconductor layer including a first oxide semiconductor;
- a first wiring provided below the semiconductor layer at least partly;
- a capacitor wiring provided below the semiconductor layer at least partly;
- a second wiring electrically connected to the semiconductor layer;
- a layer including a second oxide semiconductor having a higher insulating property than the semiconductor layer over the second wiring and the semiconductor layer;
- a pixel electrode electrically connected to the semiconductor layer; and
- a groove portion over at least a portion of the first wiring and at least a portion of the capacitor wiring, wherein the semiconductor layer overlaps with the first wiring, the second wiring, the pixel electrode, and the capacitor wiring, and wherein the groove portion extends beyond edges of the pixel electrode along a direction in which the second wiring extends.

9. The semiconductor device according to claim 8,
wherein the layer includes an oxide material including In, an element M, and Zn, and
wherein the element M is a group 3A element, a group 4A element, or a group 4B element.

10. The semiconductor device according to claim 9, wherein the layer is formed of In-M-Zn-based oxide including the element M.

11. The semiconductor device according to claim 10, wherein the element M is Ti, Zr, Hf, Ge, Ce, or Y.

12. The semiconductor device according to claim 8, wherein the first wiring and the capacitor wiring comprise the same material.

13. The semiconductor device according to claim 8, wherein the semiconductor layer does not exist at least on a bottom surface of the groove portion.

14. The semiconductor device according to claim 8, wherein the groove portion is a portion where neither the layer, the semiconductor layer nor a gate insulating layer of the transistor exist.

* * * * *